United States Patent
Wada et al.

(10) Patent No.: US 8,033,446 B2
(45) Date of Patent: Oct. 11, 2011

(54) MANUFACTURING METHOD OF SOLID-STATE IMAGE PICKUP DEVICE

(75) Inventors: Eiji Wada, Tokyo (JP); Nobuyuki Kamata, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/650,527

(22) Filed: Dec. 30, 2009

(65) Prior Publication Data

US 2011/0084118 A1    Apr. 14, 2011

(30) Foreign Application Priority Data

Oct. 13, 2009    (JP) .................................. 2009-236335

(51) Int. Cl.
*B23K 31/00*    (2006.01)
*H01L 21/44*    (2006.01)
*H01L 23/48*    (2006.01)

(52) U.S. Cl. ................... 228/180.22; 438/612; 438/613; 257/737; 257/738; 257/778; 257/779; 257/780

(58) Field of Classification Search ............. 228/180.21, 228/180.22; 438/612, 613; 257/737, 738, 257/778–780

See application file for complete search history.

(56) References Cited

U.S. PATENT DOCUMENTS

| | | | |
|---|---|---|---|
| 6,396,116 B1 * | 5/2002 | Kelly et al. | 257/432 |
| 6,528,857 B1 * | 3/2003 | Glenn et al. | 257/433 |
| 6,774,481 B2 * | 8/2004 | Ono | 257/704 |
| 7,168,161 B2 | 1/2007 | Hanada et al. | |
| 7,405,456 B2 * | 7/2008 | Chen et al. | 257/434 |
| 2010/0103296 A1 * | 4/2010 | Nakagiri et al. | 348/294 |

FOREIGN PATENT DOCUMENTS

| | | |
|---|---|---|
| JP | 2005-20532 A | 1/2005 |
| JP | 2005-72258 A | 3/2005 |

* cited by examiner

*Primary Examiner* — Jessica L Ward
*Assistant Examiner* — Devang R Patel
(74) *Attorney, Agent, or Firm* — Miles & Stockbridge P.C.

(57) ABSTRACT

After a wiring substrate having, on its lower surface, an opening and terminals arranged therearound is provided, a sealing material is supplied to the lower surface of the wiring substrate, and a sensor chip is flip-chip mounted on the lower surface of the wiring substrate. The sensor chip has, on its front surface, a sensor surface and bump electrodes, and each bump electrode is thermocompression-bonded onto each terminal of the wiring substrate and the sensor surface is exposed from the opening. The sensor chip has, in its outer peripheral portion of the front surface, a first region where the bump electrodes are arranged and a second region where no bump electrode is arranged. The sealing material is supplied to a region planarly overlapped with the first region when the sensor chip is mounted later, and no sealing material is supplied to a region planarly overlapped with the second region.

13 Claims, 34 Drawing Sheets

MANUFACTURING METHOD OF SOLID-STATE IMAGE PICKUP DEVICE

CROSS-REFERENCE TO RELATED APPLICATION

The present application claims priority from Japanese Patent Application No. JP 2009-236335 filed on Oct. 13, 2009, the content of which is hereby incorporated by reference into this application.

TECHNICAL FIELD OF THE INVENTION

The present invention relates to a manufacturing technique of a solid-state image pickup device, and in particular, it relates to a technique effectively applied to the manufacture of a solid-state image pickup device having an image pickup element mounted on a flexible wiring substrate.

BACKGROUND OF THE INVENTION

A solid-state image pickup device is a photoelectric converter that converts an optical signal from an image to an electrical signal based on an array of pixels. On a main surface of a substrate of a solid-state image pickup device, an image pickup element is mounted with its light-receiving surface facing upward.

Japanese Patent Application Laid-Open Publication No. 2005-72258 (Patent Document 1) discloses a technique regarding a camera module in which a semiconductor chip for an optical sensor is mounted and wire-bonded onto a wiring substrate.

Japanese Patent Application Laid-Open Publication No. 2005-20532 (Patent Document 2) discloses a technique regarding an optical module in which an optical chip is mounted on a flexible substrate.

SUMMARY OF THE INVENTION

According to the studies by the inventors, the following has been found.

In mobile phones, a solid-state image pickup device (camera module) as disclosed in the Patent Document 1 is mounted. In recent years, however, with the advance of downsizing (thickness reduction) of mobile phones, the solid-state image pickup device mounted thereon is also requested to be reduced in thickness.

For the achievement of the thickness reduction, instead of the structure disclosed in the Patent Document 1 in which a solid-state image pickup element (sensor chip) is mounted on a wiring substrate made of glass epoxy resin and a film-shaped substrate (flexible substrate) is connected to a connecting terminal of this wiring substrate, direct flip-chip mounting onto a film-shaped substrate (film carrier tape) as disclosed in the Patent Document 2 is thought to be effective.

Thus, the inventors have studied a solid-state image pickup device in which a solid-state image pickup element (sensor chip) is flip-chip mounted.

As a result, it has been found that the mounting strength of the solid-state image pickup element is insufficient in the structure in which a film-shaped substrate and the solid-state image pickup element are electrically connected to each other via electrodes like that in the Patent Document 2.

Thus, the inventors have improved the mounting strength of the solid-state image pickup element by disposing a sealing material in a space between the solid-state image pickup element and the substrate and curing this sealing material by heat at the time of flip-chip mounting.

Meanwhile, with respect to the layout of electrode pads of the solid-state image pickup element, the electrode pads are disposed at approximately equal pitches (equally) along each side of the solid-state image pickup element in some cases and the electrode pads are not disposed at equal pitches in other cases. In the layout of the electrode pads of the solid-state image pickup element used by the inventors this time, the electrode pads are not equally disposed, in other words, a portion where electrode pads are not formed (arranged) along the side of the solid-state image pickup element is included, and the following problems newly arise in the use of such a solid-state image pickup element.

That is, due to the influence of the heat generated at the time of flip-chip mounting, the phenomenon that a part of the film-shaped substrate is bent occurs in a portion of the solid-state image pickup element where no electrode pad is formed (arranged) (see FIG. 45 described later). Also, since the solid-state image pickup element and the substrate come close in distance (spacing) to each other due to the bending of that part of the film-shaped substrate, a part of the sealing material before curing disposed between the solid-state image pickup element and the substrate flows out from the space between the solid-state image pickup element and the substrate to the surrounding portion. When a part of the sealing material flows out, the sensor surface (light-receiving portion) of the solid-state image pickup element may be covered with the flowing part of the sealing material to degrade the reliability of the solid-state image pickup device, and thus, there is a need for taking some measures.

An object of the present invention is to provide a technique capable of improving the reliability of a solid-state image pickup device.

The above and other objects and novel characteristics of the present invention will be apparent from the description of this specification and the accompanying drawings.

The typical ones of the inventions disclosed in this application will be briefly described as follows.

In a manufacturing method of a solid-state image pickup device according to a typical embodiment, a wiring substrate having, on its lower surface, an opening and a plurality of bonding leads formed around the opening is provided, and a first sealing material is supplied to a part of a planned sensor-chip-mounting region on the lower surface of the wiring substrate. Then, a sensor chip having, on its front surface, a plurality of bump electrodes and a sensor surface is flip-chip mounted on the lower surface of the wiring substrate such that the sensor surface is exposed from the opening. Also, the sensor chip has, in an outer peripheral portion of the front surface, a first region where the plurality of bump electrodes are arranged and a second region where no bump electrode is arranged, and when the first sealing material is supplied to the lower surface of the wiring substrate, the first sealing material is supplied to a region planarly overlapped with the first region when the sensor chip is mounted later but is not supplied to a region planarly overlapped with the second region.

The effects obtained by typical embodiments of the inventions disclosed in this application will be briefly described below.

According to a typical embodiment, the reliability of a solid-state image pickup device can be improved.

BRIEF DESCRIPTIONS OF THE DRAWINGS

DESCRIPTIONS OF THE PREFERRED EMBODIMENTS

Figure 1:
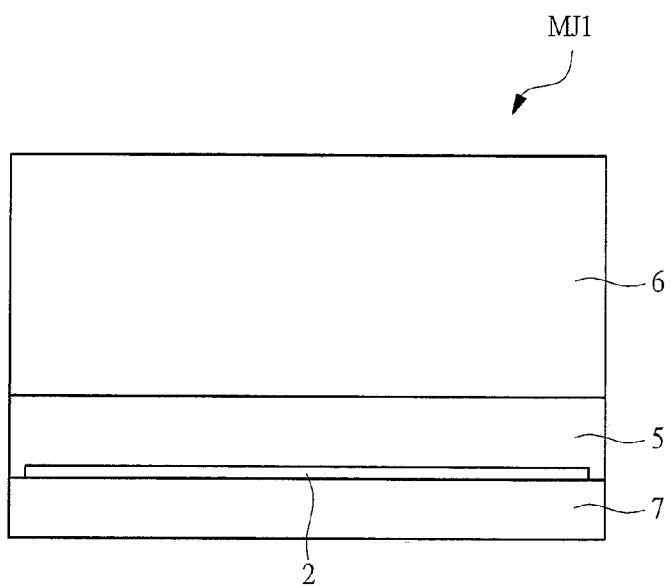
FIG. 1 is a front view of a camera module according to an embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Hereinafter, embodiments of the present invention will be described in detail with reference to the accompanying drawings. Note that components having the same function are denoted by the same reference numbers throughout the drawings for describing the embodiments, and the repetitive description thereof will be omitted. Also, in the following embodiments, the description of the same or similar component is not repeated in principle other than the case where it is particularly required.

Also, in the drawings used in the embodiments, hatching is omitted in some cases even in a cross-sectional view so as to make the drawings easy to see. Also, hatching is used in some cases even in a plan view so as to make the drawings easy to see.

First Embodiment

A solid-state image pickup device and its manufacturing process according to the first embodiment will be described with reference to the drawings. The solid-state image pickup device according to the present embodiment is a camera module for use in an image input unit of, for example, a mobile phone, digital camera, TV phone, PC camera, personal digital assistant (PDA), optical mouse, door-phone, monitoring camera, fingerprint recognition device or toy.

<Structure of Solid-State Image Pickup Device (Camera Module)>

Figure 2:
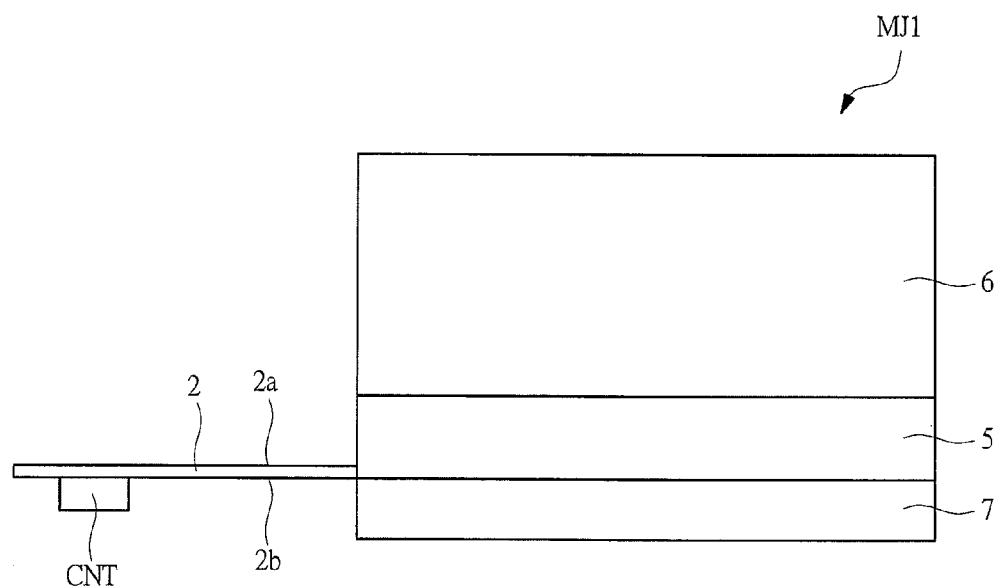
FIG. 2 is a side view of the camera module according to the embodiment of the present invention.
Figure 3:
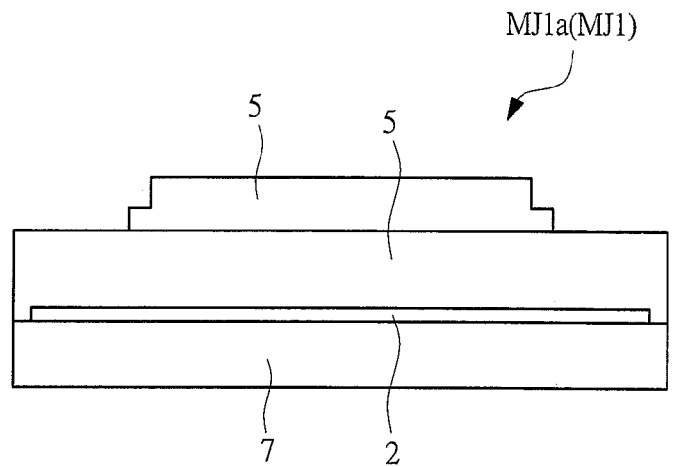
FIG. 3 is a front view of the camera module having no lens unit mounted thereon according to the embodiment of the present invention.
Figure 4:
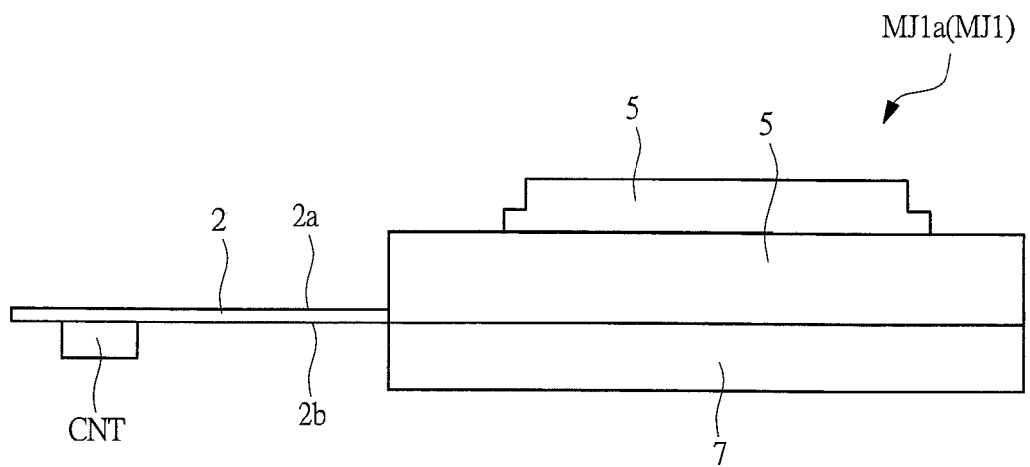
FIG. 4 is a side view of the camera module having no lens unit mounted thereon according to the embodiment of the present invention.
Figure 5:
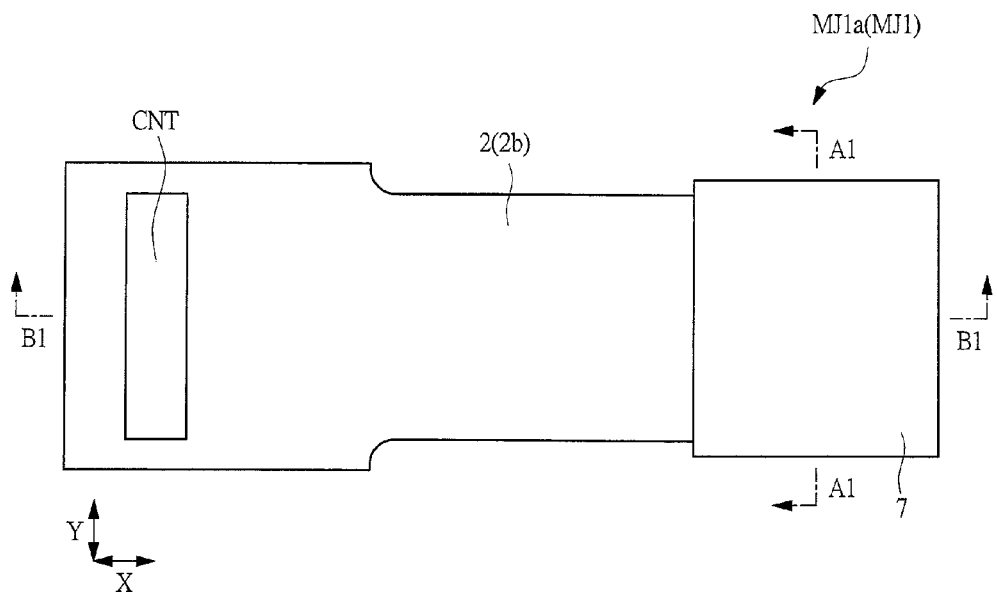
FIG. 5 is a bottom view of the camera module having no lens unit mounted thereon according to the embodiment of the present invention.
Figure 6:
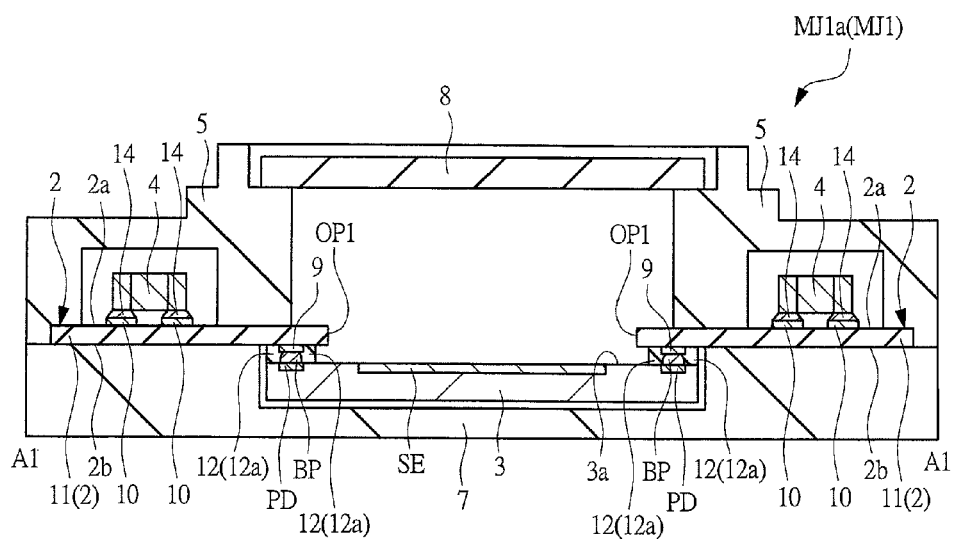
FIG. 6 is a cross-sectional view of the camera module having no lens unit mounted thereon according to the embodiment of the present invention.
Figure 7:
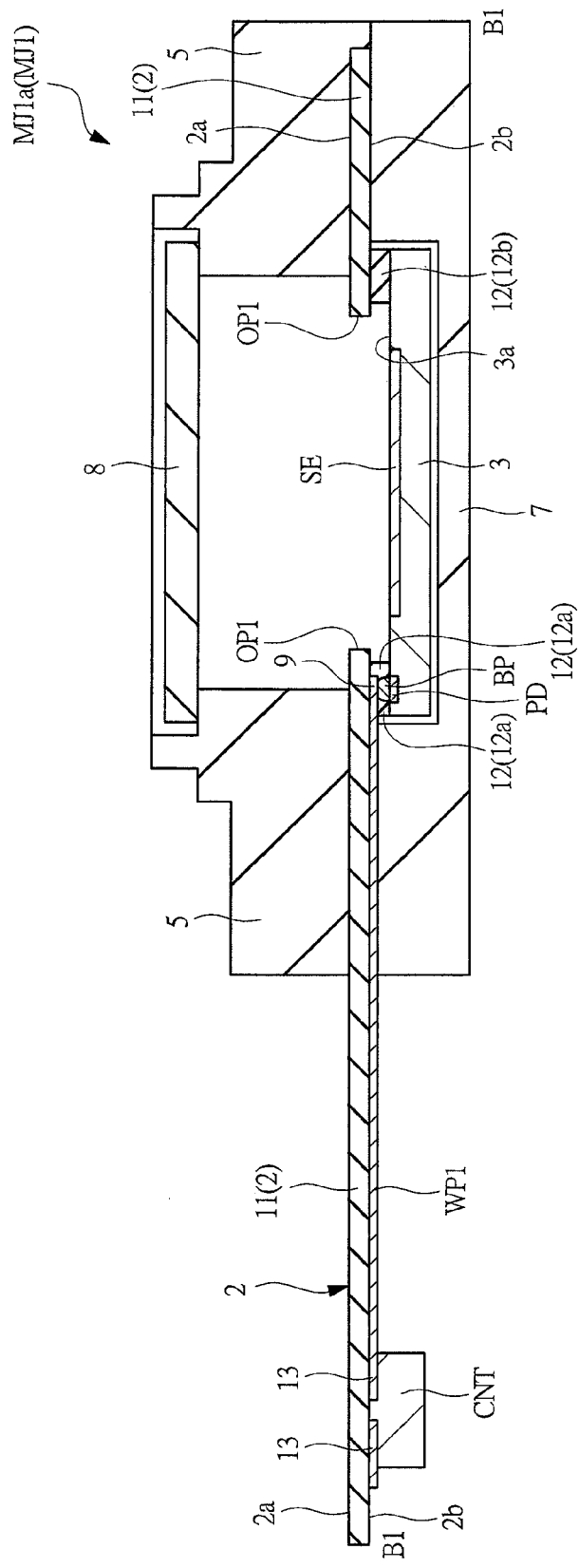
FIG. 7 is a cross-sectional view of the camera module having no lens unit mounted thereon according to the embodiment of the present invention.
Figure 8:
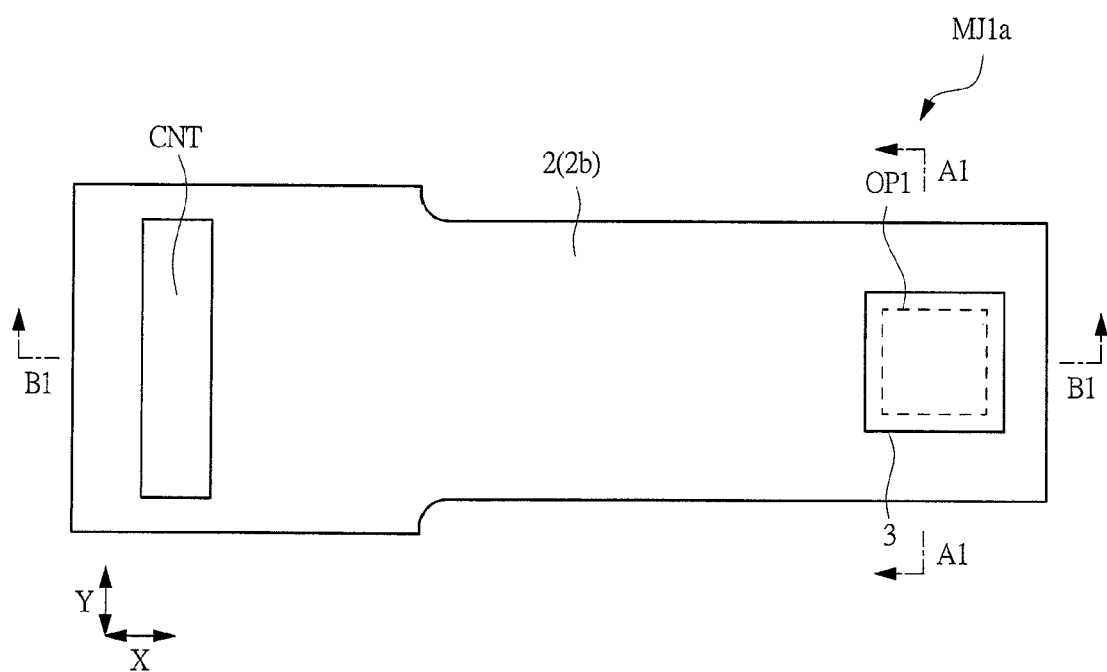
FIG. 8 is a lower-surface perspective view of the camera module having no lens unit mounted thereon according to the embodiment of the present invention.

FIG. 1 is a front view of a solid-state image pickup device, for example, a camera module (solid-state image pickup device) MJ1 according to an embodiment of the present invention, and FIG. 2 is a side view of the camera module MJ1. FIG. 3 is a front view of the camera module MJ1 having no lens unit 6 mounted thereon (hereinafter, the camera module MJ1 having no lens unit 6 mounted thereon is referred to as a camera module MJ1a). Also, FIG. 4 is a side view of the camera module MJ1a, FIG. 5 is a lower-surface (bottom) view of the camera module MJ1a, FIGS. 6 and 7 are cross-sectional views (side cross-sectional views) of the camera module MJ1a, and FIG. 8 is a lower-surface perspective view of the camera module MJ1a. Here, though FIG. 6 corresponds to a cross-sectional view along a line A1-A1 of FIGS. 5 and 8 and FIG. 7 corresponds to a cross-sectional view along a line B1-B1 of FIGS. 5 and 8, FIGS. 5 and 8 each depicts the lower surface, and FIGS. 6 and 7 each depicts the state in which a lower-surface side faces downward and an upper-surface side faces upward. Also, FIG. 8 depicts the state in which a resin cover 7 is seen through in the lower surface view of FIG. 5, in which the position of an opening OP1 of a wiring substrate 2 hidden by a sensor chip 3 is represented by a dotted line.

As depicted in FIGS. 1 to 8, the camera module MJ1 according to the present embodiment includes the wiring substrate 2, the sensor chip 3 mounted on a lower surface 2b of the wiring substrate 2, electronic components 4 mounted on an upper surface 2a of the wiring substrate 2, a resin cover 5 disposed on the upper surface 2a of the wiring substrate 2 to cover a sensor surface SE of the sensor chip 3 and the electronic components 4, the lens unit 6 disposed on the resin cover 5, and the resin cover 7 disposed on the lower surface 2b of the wiring substrate 2 to cover the sensor chip 3.

The wiring substrate (flexible wiring substrate) 2 has two main surfaces positioned on opposite sides, that is, the upper surface (main surface, front surface, or lens-mounting surface) 2a and the lower surface (back surface or sensor-chip-mounting surface) 2b. The upper surface 2a serves as a main surface on which a lens (incorporated in the lens unit 6) is mounted (lens-mounting surface), and the lower surface 2b serves as a main surface on which the sensor chip is mounted (sensor-chip-mounting surface).

The wiring substrate 2 is a film-shaped wiring substrate, which is a so-called flexible wiring substrate (flexible substrate). Specifically, the wiring substrate 2 has wiring patterns (conductor patterns) formed on a flexible base substrate (base film, base-material layer, or insulating film) 11 with excellent bending properties. The base substrate 11 is made of, for example, polyimide or polyester and has insulating properties. The wiring patterns (conductor patterns) that make up the wiring substrate 2 are formed on an upper surface of the base substrate 11 corresponding to the upper surface 2a of the wiring substrate 2 and on a lower surface of the base substrate corresponding to the lower surface 2b of the wiring substrate 2, and are formed of, for example, conductive foils (preferably, copper foils) bonded onto the base substrate 11 with an adhesive or the like. Terminals 9 and 13 formed on the lower surface 2b of the wiring substrate 2 and wirings (wiring patterns) WP1 integrally connected to the terminal 9, which will be described further below, are formed of the wiring patterns (conductor patterns) formed on the lower surface 2b of the wiring substrate 2 (that is, the lower surface of the base substrate 11). Also, terminals 10 formed on the upper surface 2a of the wiring substrate 2 and wiring patterns integrally connected to the terminals 10, which will be described further below, are formed of the wiring patterns (conductor pattern) formed on the upper surface 2a of the wiring substrate 2 (that is, the upper surface of the base substrate 11). In FIG. 7, a part of the wirings WP1 formed on the lower surface 2b of the wiring substrate 2 is depicted among the wiring patterns of the wiring substrate 2, but the illustration of the wirings WP1 is omitted in FIG. 5 for simplification.

The wiring pattern on the upper surface 2a side of the wiring substrate 2 and the wiring pattern on the lower surface 2b side are electrically connected to each other as required through vias (not shown) formed in the base substrate 11. Here, the vias are holes (through holes) formed in the base substrate 11 making up the wiring substrate 2, and a conductor film is formed on a side wall of each hole or each hole is filled with a conductor film. Thus, the hole including this conductor film is hereinafter referred to as a via (or a via hole). Therefore, the vias formed in the base substrate 11 have a function to electrically connect the wiring patterns on both of the upper and lower surfaces of the base substrate 11 through the conductor films on the side wall of the holes or those in the holes making up the vias.

In the wiring substrate 2, at a center portion of the region where the sensor chip 3 is mounted (chip-mounting region), the opening (through hole or hole) OP1 having planar dimensions (area) smaller than planar dimensions (area) of the sensor chip 3 is formed. That is, the opening OP1 of the wiring substrate 2 is formed so as to be planarly included in the sensor chip 3 disposed on the lower surface 2b of the wiring substrate 2. This opening OP1 penetrates from the lower surface 2b to the upper surface 2a of the wiring substrate 2 (from the lower surface 2b toward the upper surface 2a), and the sensor surface (sensor array region or light-receiving element region) SE on the front surface 3a of the sensor chip 3 is exposed from the opening OP1. The planar shape of the sensor chip 3 is a quadrangle, and more particularly, a rectangle (oblong figure). Therefore, in accordance with the shape of the sensor chip 3, the planar shape of the opening OP1 is preferably a rectangle (oblong figure).

The sensor chip (image pickup element, solid-state image pickup element, or semiconductor image pickup element) 3 is a semiconductor chip for an optical sensor and has a sensor circuit (light-receiving element circuit) such as a CMOS image sensor circuit formed thereon. Also, it has a front surface (light-receiving surface or light-receiving-element-forming surface) 3a serving as a main surface where the sensor circuit is formed and a back surface serving as a main surface on the opposite side of the front surface 3a. Further, the sensor chip 3 is flip-chip mounted on the lower surface 2b of the wiring substrate 2 such that the front surface 3a of the sensor chip 3 faces the wiring substrate 2.

The CMOS image sensor circuit formed in the sensor chip 3 is formed through a CMOS process normally used in the manufacturing process of a semiconductor device and has a sensor array (light-receiving element region). In a center region of the front surface 3a of the sensor chip 3, the sensor surface (light-receiving portion or sensor array region) SE serving as a region where the sensor array is formed is disposed as a light-receiving portion, and this sensor surface SE is exposed from the opening OP1 of the wiring substrate 2. More specifically, the opening OP1 of the wiring substrate 2 is planarly included in the sensor chip 3 disposed on the lower surface 2b of the wiring substrate 2, and the sensor surface SE on the front surface 3a of the sensor chip 3 is planarly included in the opening OP1 of the wiring substrate 2.

In this configuration, light collected by the lens (not shown) in the lens unit 6 is incident through an IR filter (IR glass filter) 8 into the sensor surface SE of the front surface 3a of the sensor chip 3 exposed from the opening OP1 of the wiring substrate 2. On the sensor surface SE of the sensor chip 3, a plurality of light-receiving elements are orderly disposed in a matrix along the main surface of the sensor chip 3, and each light-receiving element is a portion that forms a pixel of the CMOS image sensor circuit and has a photoelectric converting function of converting an incident optical signal to an electrical signal. As the light-receiving element, for example, a photodiode or phototransistor is used. Further, the sensor chip 3 also has an analog circuit, a digital signal processor (DSP) circuit, and others for processing an electrical signal obtained on the sensor surface SE.

Around the sensor surface SE on the front surface 3a of the sensor chip 3, that is, around the outer periphery (outer-peripheral region, surrounding portion, or outer-edge portion) of the front surface 3a of the sensor chip 3, a plurality of electrode pads (bonding pads or pad electrodes) PD are formed along that outer periphery. These electrode pads PD are lead-out electrodes of the CMOS image sensor circuit of the sensor chip 3. On the front surface 3a of the sensor chip 3, a plurality of bump electrodes BP are respectively formed on the plurality of electrode pads PD, and these bump electrodes BP are mechanically and electrically connected to a plurality of terminals (bonding leads, electrodes, or conductive lands) 9 on the lower surface 2b of the wiring substrate 2, respectively.

Each of the terminals 9 on the lower surface 2b of the wiring substrate 2 is formed of a part of the wiring pattern (conductor pattern) formed on the lower surface 2b of the wiring substrate 2 (that is, the lower surface of the base substrate 11). On the lower surface 2b of the wiring substrate 2, these terminals 9 are disposed (formed) around the opening OP1. These terminals 9 correspond to the terminals for connecting the bump electrodes BP and can be regarded as bonding leads.

On the upper surface 2a of the wiring substrate 2, the single or plurality of electronic components 4 are mounted, and the electronic component 4 is a memory chip (semiconductor chip for memory) in which a non-volatile memory circuit such as an electrically erasable programmable read-only memory (EEPROM) is formed or is a passive component (chip component) such as a chip resistor or a chip capacitor. Among the electronic components 4, the memory chip is flip-chip mounted on the upper surface 2a of the wiring substrate 2 through a solder bump (bump electrode) or the like, and the passive components including a chip resistor and a chip capacitor are mounted by solder on the upper surface 2a of the wiring substrate 2. More specifically, each electrode of the electronic components 4 is mechanically and electrically connected to each terminal (electrode, conductive land, or bonding lead) 10 on the upper surface 2a of the wiring substrate 2. FIG. 6 depicts the state in which a passive component such as a chip resistor or a chip capacitor is connected as the electronic component 4 to the terminal 10 on the upper surface 2a of the wiring substrate 2 through solder portions 14. On the upper surface 2a of the wiring substrate 2, a plurality of terminals 10 for connecting the electronic component 4 are formed, and each terminal 10 is formed of a part of the wiring pattern (conductor pattern) formed on the upper surface 2a of the wiring substrate 2 (that is, on the upper surface of the base substrate 11).

The resin cover (first cover member, protective member, barrel, or frame body) 5 is mounted on the upper surface 2a of the wiring substrate 2 so as to cover the electronic components 4 mounted on the upper surface 2a of the wiring substrate 2 and (the sensor surface SE of) the front surface 3a of the sensor chip 3 exposed from the opening OP1 of the wiring substrate 2. Also, a bottom surface of the resin cover 5 is bonded and fixed (fastened) to the upper surface 2a of the wiring substrate 2 through an adhesive or the like. The electronic components 4 and the sensor surface SE of the sensor chip 3 are covered with the resin cover 5, but are not in contact with the resin cover 5 and are separated from an inner wall of the resin cover 5. Since the resin cover 5 functions so as to cover and protect the sensor surface SE of the sensor chip 3 (and the electronic components 4), the resin cover 5 can be regarded as a cover member or a protective member. The resin cover 5 is made of, for example, a resin material such as polybutylene terephthalate (PBT) or a plastic material (insulating material) and can contain glass fibers. On an upper portion (top portion) of the resin cover 5, the IR filter (IR glass filter) 8 is mounted so as to fill an upper opening of the resin cover 5. The IR filter 8 can function so as to pass visible light and block unwanted infrared radiation with a wavelength equal to or longer than a predetermined wavelength.

The lens unit (lens block, lens holder, lens holding unit, or lens assembly) 6 has a lens (optical lens, not shown) held or accommodated therein and is disposed on (coupled to or attached) on the resin cover 5. By this means, light outside the camera module MJ1 is collected by the lens in the lens unit 6 and enters (is irradiated to) the sensor surface SE of the front surface 3a of the sensor chip 3 through the IR filter 8. Also, a movable mechanism for the lens may be provided in the lens unit 6 to provide a zoom function.

Furthermore, the sensor surface SE of the front surface 3a of the sensor chip 3 is shielded from outside by a sealing material 12 between the front surface 3a of the sensor chip 3 and the lower surface 2b of the wiring substrate 2 and by the resin cover 5 (and the IR filter 8 on the upper portion thereof) mounted on the upper surface 2a of the wiring substrate 2. Therefore, the sensor surface SE of the front surface 3a of the sensor chip 3 can be protected, and the sensor surface SE of the sensor chip 3 can be prevented from dust.

On the lower surface 2b of the wiring substrate 2, near an end on a side opposed to the side where the sensor chip 3 and the resin cover 7 are mounted, a connector (connector unit) CNT functioning as an external terminal (external connection terminal) of the camera module MJ1 is provided. The connector CNT functions as an external terminal for electrically connecting (a circuit incorporated in) the camera module MJ1 to an external device. Specifically, on the lower surface 2b of the wiring substrate 2, near the end on a side opposed to the side where the sensor chip 3 and the resin cover 7 are mounted, a plurality of terminals (external terminals or external connection terminals) 13 are disposed, and the connector CNT is electrically connected to these terminals 13. Each terminal 13 on the lower surface 2b of the wiring substrate 2 is formed of a part of the wiring patterns (conductor patterns) formed on the lower surface 2b of the wiring substrate 2 (that is, the lower surface of the base substrate 11). The connector CNT has a plurality of terminals, and each terminal of the connector CNT is electrically connected to each of the terminals 13 of the wiring substrate 2 and is further electrically connected to a circuit in the camera module MJ1 (each electrode of the sensor chip 3 and the electronic components 4) through the wiring patterns of the wiring substrate 2 (including the wirings WP1, the terminals 9 and 10, and the vias of the wiring substrate 2). More specifically, the plurality of terminals 9 provided on the lower surface 2b of the wiring substrate 2, the plurality of terminals 10 provided on the upper surface 2a of the wiring substrate 2, and the connector CNT are electrically connected to each other through the wirings (wirings formed on the lower surface 2b and the wirings formed on the upper surface 2a) and vias of the wiring substrate 2. In another embodiment, the connector CNT can be provided on the upper surface 2a of the wiring substrate 2 near an end on a side opposed to a side where the resin cover 5 is mounted.

On the lower surface 2b of the wiring substrate 2, the resin cover (second cover member or protective member) 7 is mounted so as to cover the sensor chip 3. This resin cover 7 is made of, for example, a resin material such as polybutylene terephthalate (PBT) or a plastic material (insulating material) and is bonded (adhered) onto the lower surface 2b of the wiring substrate 2 with an adhesive or the like so as to cover the sensor chip 3. The resin cover 7 can protect the sensor chip 3. While the inner wall of the resin cover 5 on the upper surface 2a side of the wiring substrate 2 is separated from the sensor chip 3, an inner wall of the resin cover 7 on the lower surface 2b side of the wiring substrate 2 can be made to be close to the sensor chip 3 (the inner wall may be in contact with the sensor chip 3). Since the resin cover 7 functions so as to cover and protect the sensor chip 3, the resin cover 7 can be regarded as a cover member or a protective member.

The sensor chip 3 is flip-chip mounted (flip-chip connected) on the lower surface 2b of the wiring substrate 2. More specifically, the plurality of bump electrodes BP provided on the front surface 3a of the sensor chip 3 are respectively connected to the plurality of terminals 9 on the lower surface 2b of the wiring substrate 2. Further, a space between the outer peripheral portion (outer-peripheral region, surrounding portion, or outer-edge portion) of the front surface 3a of the sensor chip 3 and the lower surface 2b of the wiring substrate facing the outer peripheral portion is filled with the sealing material 12. The sealing material 12 has insulating properties. The sealing material 12 is made of a resin material, and more particularly is formed by curing thermosetting resin. By filling the space between the outer peripheral portion of the front surface 3a of the sensor chip 3 and the lower surface 2b of the wiring substrate 2 with this sealing material 12, the sensor surface SE on the front surface 3a of the sensor chip 3 can be prevented from dust because the sensor surface SE on the front surface 3a of the sensor chip 3 is shielded from an outer space of the sensor chip 3 on the lower surface 2b side of the wiring substrate 2. The sealing material 12 is formed of a sealing material 12a and a sealing material 12b, which will be described further below. More specifically, the sealing material 12 has a portion formed of the sealing material 12a described further below and a portion formed of the sealing material 12b described further below.

When a foreign substance such as dust is attached onto the sensor surface SE of the sensor chip 3, a failure occurs in an image that is shot and displayed. Therefore, it is quite important to prevent a foreign substance such as dust from being attached onto the sensor surface SE of the sensor chip 3. In the camera module MJ1 of the present embodiment, the sensor surface SE on the front surface 3a of the sensor chip 3 is disposed in a shielded space surrounded by the front surface 3a of the sensor chip 3, the sealing material 12, the wiring substrate 2, the resin cover 5 and the IR filter 8. Accordingly, a foreign substance such as dust can be appropriately prevented from entering from outside of the shielded space and being attached onto the sensor surface SE of the sensor chip 3.

<Manufacturing Process of Solid-State Image Pickup Device (Camera Module)>

Next, the manufacturing process of the solid-state image pickup device (here, the camera module MJ1) according to the present embodiment will be described.

Figure 9:
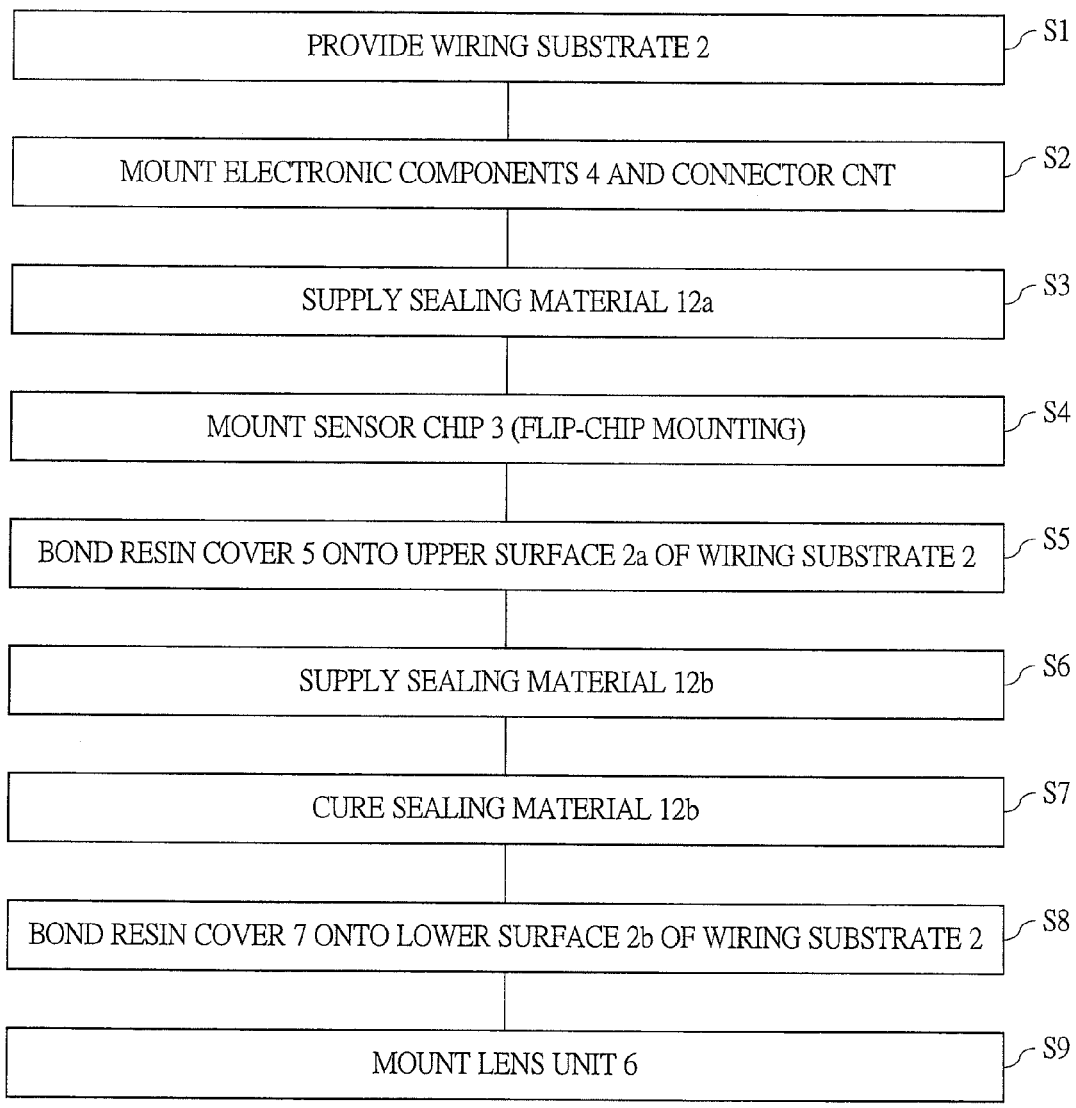
FIG. 9 is a manufacturing process flow diagram showing the manufacturing process of the camera module according to the embodiment of the present invention.
Figure 10:
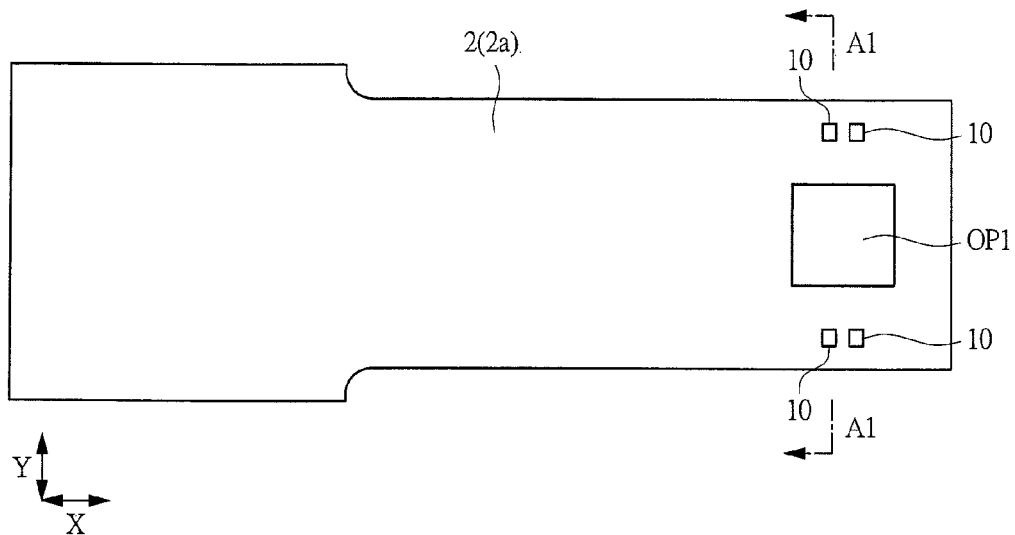
FIG. 10 is a top view of a wiring substrate for use in the manufacture of the camera module according to the embodiment of the present invention.
Figure 11:
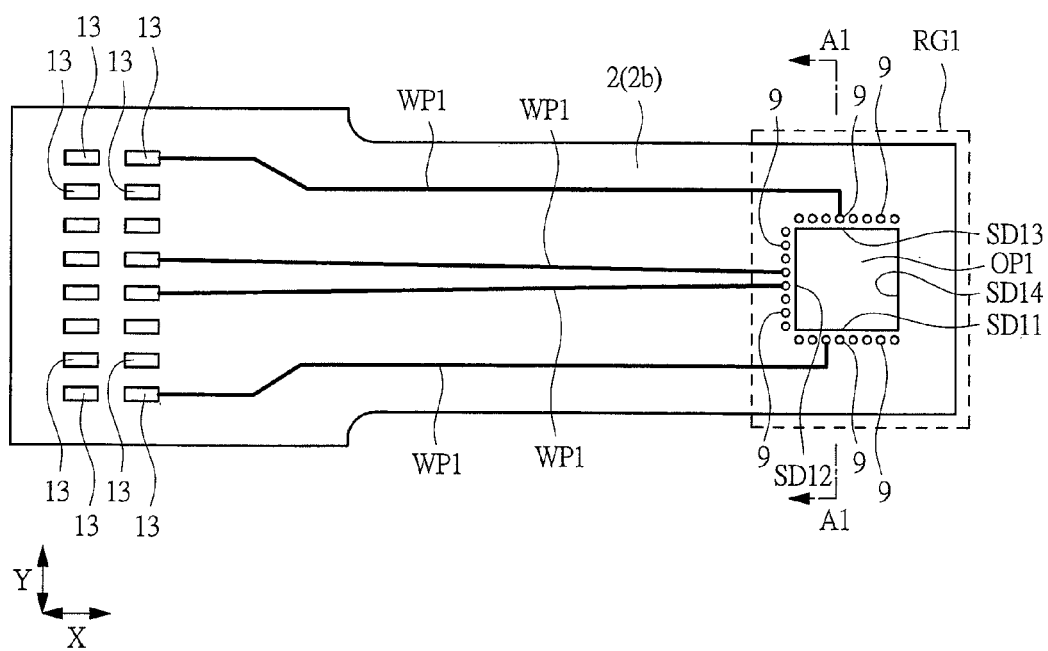
FIG. 11 is a bottom view of the wiring substrate for use in the manufacture of the camera module according to the embodiment of the present invention.
Figure 12:
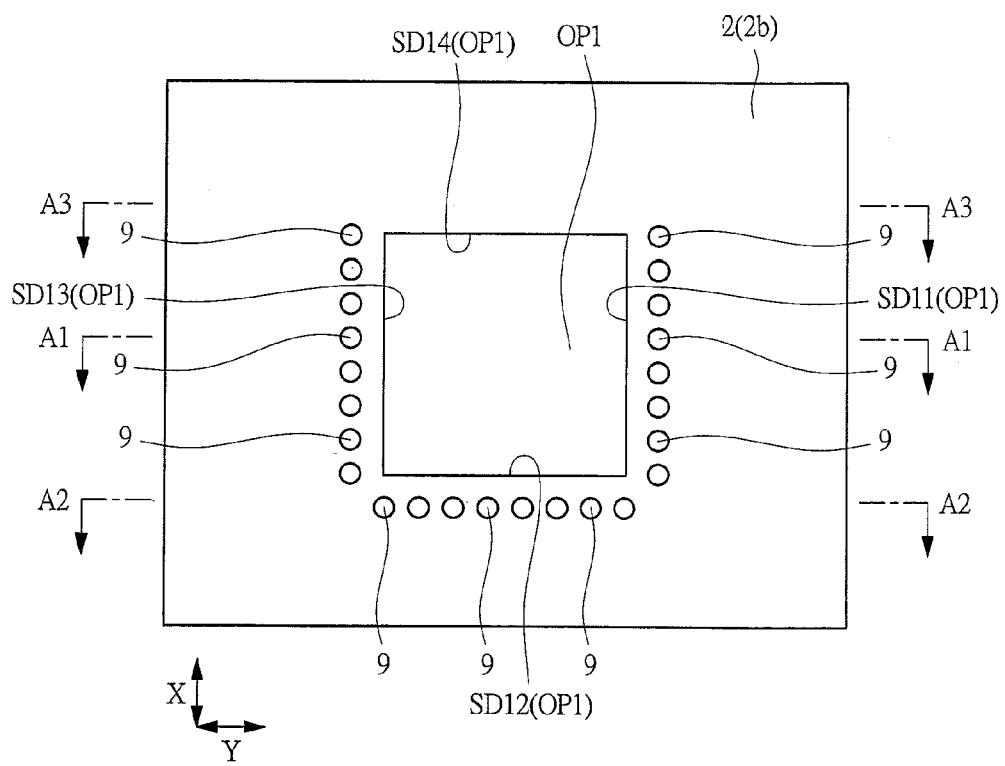
FIG. 12 is a plan view of principal parts of the wiring substrate for use in the manufacture of the camera module according to the embodiment of the present invention.
Figure 13:
FIG. 13 is a cross-sectional view of the wiring substrate for use in the manufacture of the camera module according to the embodiment of the present invention.
Figure 14:
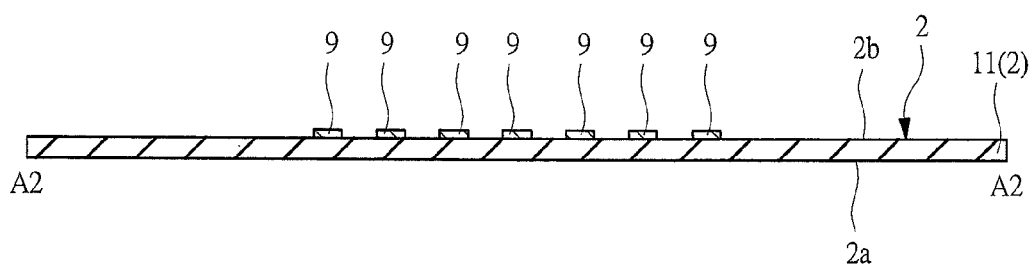
FIG. 14 is a cross-sectional view of the wiring substrate for use in the manufacture of the camera module according to the embodiment of the present invention.
Figure 15:
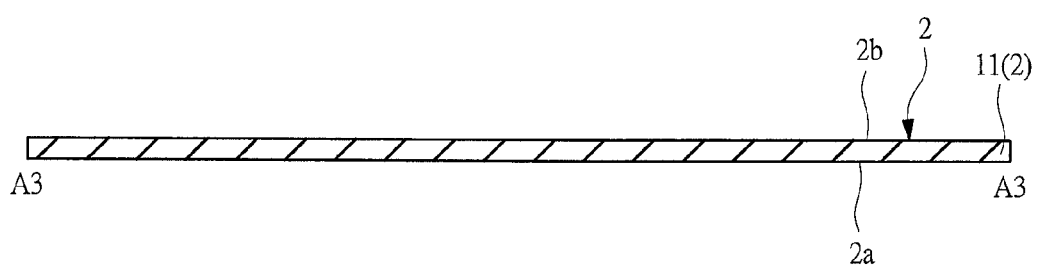
FIG. 15 is a cross-sectional view of the wiring substrate for use in the manufacture of the camera module according to the embodiment of the present invention.

FIG. 9 is a manufacturing process flow diagram showing the manufacturing process of the solid-state image pickup device, here, the camera module MJ1 according to the present embodiment. FIG. 10 is a top view of the wiring substrate 2 for use in the manufacture of the camera module MJ1, FIG. 11 is a bottom view thereof, FIG. 12 is a plan view of the principal parts (partially-enlarged bottom view) thereof, and FIGS. 13 to 15 are cross-sectional views thereof. Sections along a line A1-A1 in FIGS. 10 to 12 approximately correspond to a section in FIG. 13 (A1-A1 cross-sectional view), a section along a line A2-A2 in FIG. 12 approximately corresponds to a section in FIG. 14 (A2-A2 cross-sectional view), and a section along a line A3-A3 in FIG. 12 approximately corresponds to a section in FIG. 15 (A3-A3 cross-sectional view). Note that FIG. 10 depicts the upper surface 2a side of the wiring substrate 2, FIGS. 11 and 12 depict the lower surface 2b side of the wiring substrate 2, and FIGS. 13 to 15 depict the state in which the lower surface 2b side of the wiring substrate 2 faces upward and the upper surface 2a side thereof faces downward. Also, while an enlarged view of a region RG1 surrounded by a dotted line in FIG. 11 corresponds to FIG. 12, attention should be paid for that FIG. 12 depicts the region RG1 of FIG. 11 rotated by 90 degrees counterclockwise. Furthermore, in FIGS. 10 to 12, an X direction and a Y direction are orthogonal to each other, and the X direction is a long-side direction (longitudinal direction) of the wiring substrate 2 and the Y direction is a short-side direction (widthwise direction) of the wiring substrate 2. The same goes for the other plan views.

In the manufacture of the camera module MJ1, the wiring substrate 2 as depicted in FIGS. 10 to 15 is first provided (step S1 in FIG. 9). The wiring substrate 2 is a flexible wiring substrate as described above. Since the basic structure of the wiring substrate 2 has been described above, redundant description is not made here.

As depicted in FIGS. 11 and 12, on the lower surface 2b of the wiring substrate 2, the terminals 9 where the bump electrodes BP of the sensor chip 3 are to be connected later are arranged around the opening OP1. Also, as depicted in FIG. 10, on the upper surface 2a of the wiring substrate 2, in the planned region for mounting the electronic components 4, the plurality of terminals 10 to which the electrodes of the electronic components 4 are to be connected later are provided. Note that, on the lower surface 2b of the wiring substrate 2, the wirings WP1 are integrally connected to the terminals 9, respectively. However, only the wirings WP1 connected to some of the terminals 9 are depicted for the simplification in the bottom view of FIG. 11, and the illustration of the wirings WP1 is omitted in FIGS. 12 to 15.

Figure 16:
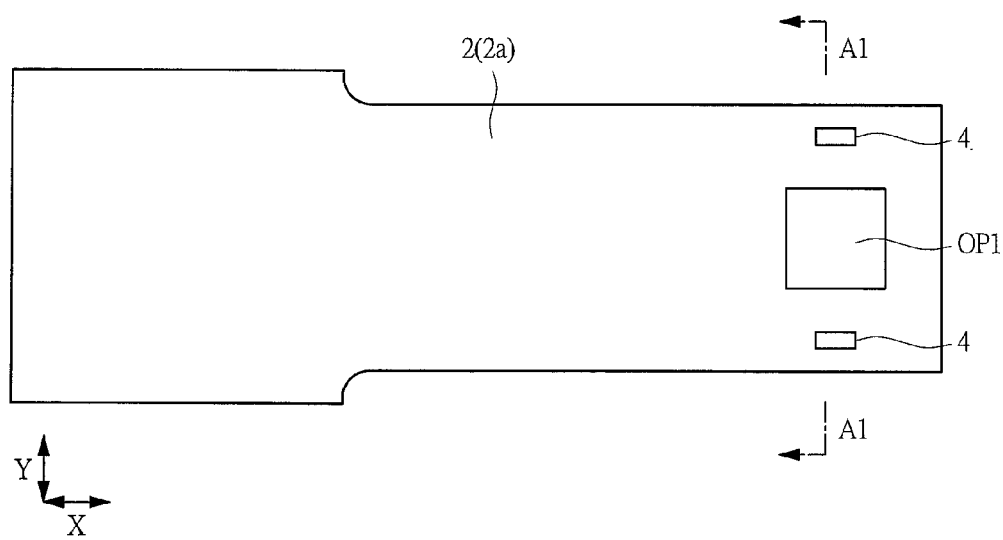
FIG. 16 is a top view in the manufacturing process of the camera module according to the embodiment of the present invention.
Figure 17:
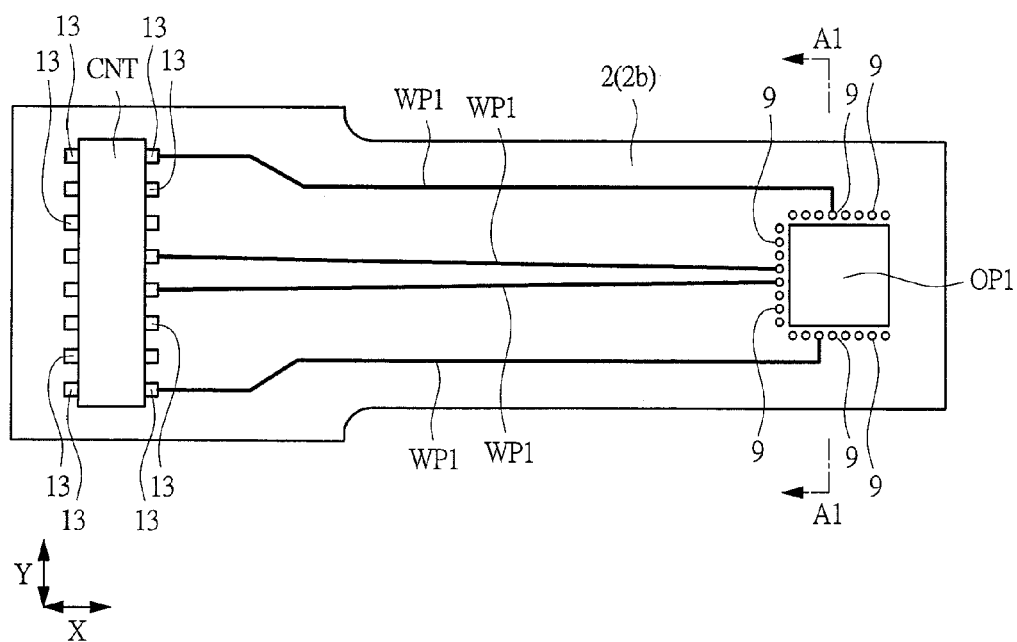
FIG. 17 is a bottom view in the same manufacturing process of the camera module as that in FIG. 16.
Figure 18:
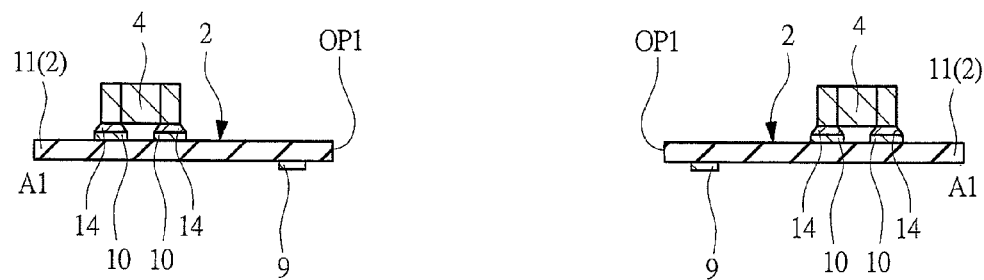
FIG. 18 is a cross-sectional view in the same manufacturing process of the camera module as that in FIG. 16.

After the wiring substrate 2 as depicted in FIGS. 10 to 15 is prepared (provided), as depicted in FIGS. 16 to 18, the electronic components 4 and the connector CNT are mounted on the wiring substrate 2 (step S2 in FIG. 9).

FIG. 16 (top view), FIG. 17 (bottom view) and FIG. 18 (A1-A1 cross-sectional view) are top, bottom and cross-sectional views corresponding to FIG. 10, FIG. 11 and FIG. 13, respectively, and they depict the stage (state) after step S2 is performed.

A process of mounting the electronic components 4 in step S2 will be specifically described. With the upper surface 2a of the wiring substrate 2 facing upward, the solder portions 14 (solder paste or the like) are supplied through solder printing onto the terminals 10 to which passive components (such as chip resistors and chip capacitors) among the electronic components 4 are connected, and then the passive components are mounted thereon. Also, a semiconductor chip such as a memory chip among the electronic components 4 is disposed on the upper surface 2a of the wiring substrate 2 such that solder bumps (bump electrodes) of the semiconductor chip face the terminals 10. Then, by performing the solder reflow process (heat treatment), the electrodes of the passive components are joined and electrically connected to the terminals 10 on the upper surface 2a of the wiring substrate 2 through the solder portions, and also the solder bumps of the semiconductor chip such as a memory chip are joined and electrically connected to the terminals 10 on the upper surface 2a of the wiring substrate 2.

The connector CNT is mounted on the lower surface 2b of the wiring substrate 2, and (the terminals of) the connector CNT is electrically connected to the terminals 13 on the upper surface 2a of the wiring substrate 2 to which the connector CNT is to be connected.

In step S2, the electronic components 4 are mounted on the upper surface 2a of the wiring substrate 2, and the connector CNT is mounted on the lower surface 2b of the wiring substrate 2. The order of the mounting of the electronic components 4 and the mounting of the connector CNT is arbitrary.

In this manner, the electronic components 4 are mounted on the upper surface 2a of the wiring substrate 2, each electrode of the electronic components 4 is electrically connected to each of the terminals 10 on the upper surface 2a of the wiring substrate 2, and the connector CNT is mounted on the lower surface 2b of the wiring substrate 2. Thus, each of the terminals of the connector CNT is electrically connected to each of the terminals 13 of the wiring substrate 2 to which that terminal is supposed to be connected.

Next, the sealing material (first sealing material) 12a is supplied (applied, or disposed) onto the lower surface 2b of the wiring substrate 2 (step S3 in FIG. 9).

Figure 19:
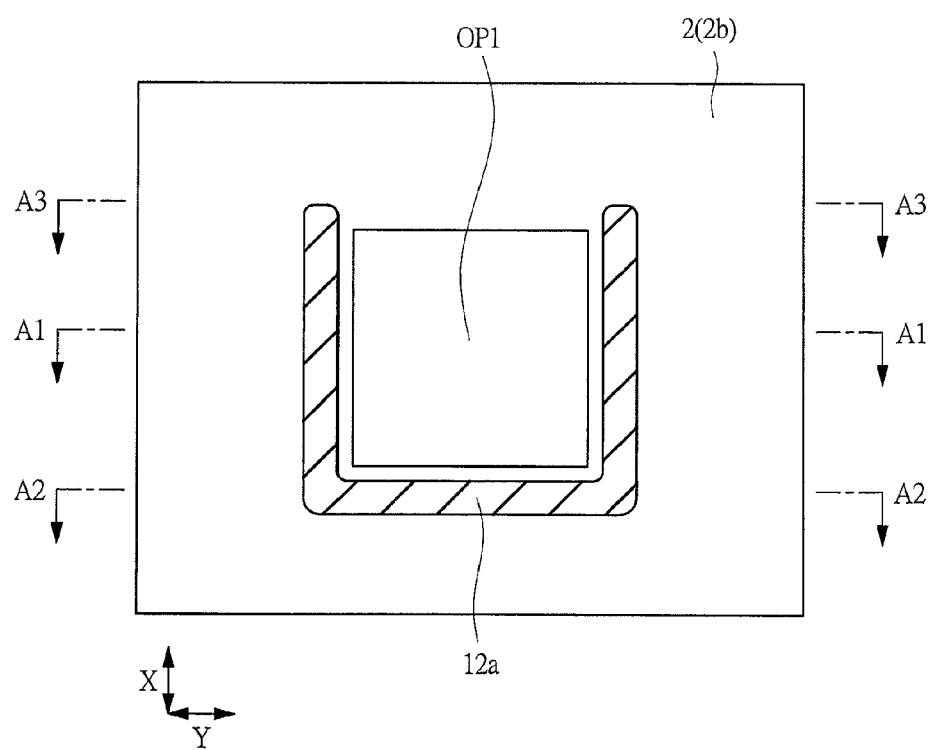
FIG. 19 is a plan view of principal parts in the manufacturing process of the camera module subsequent to FIG. 16.
Figure 20:
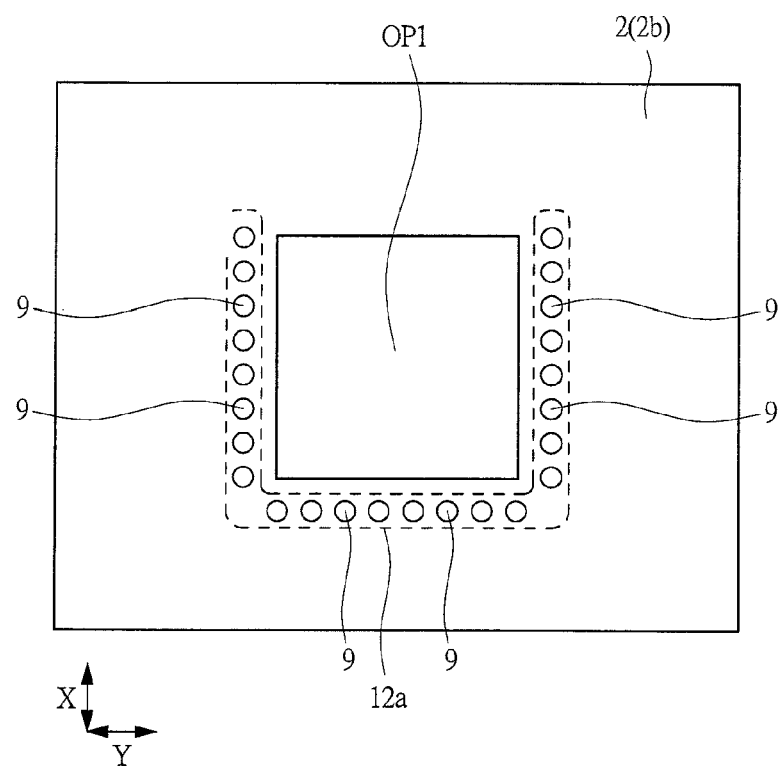
FIG. 20 is a plan view of principal parts in which a sealing material of FIG. 19 is seen through and the position of the sealing material is represented by a dotted line.
Figure 21:
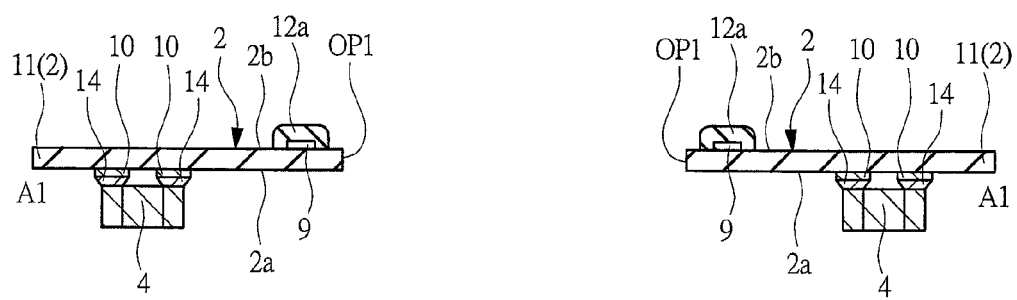
FIG. 21 is a cross-sectional view in the same manufacturing process of the camera module as that in FIG. 19.
Figure 22:
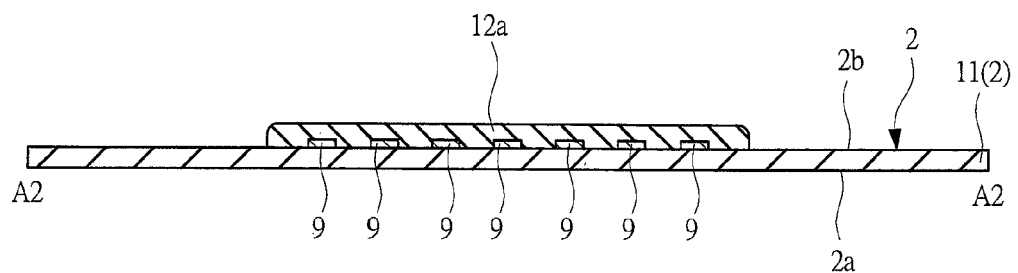
FIG. 22 is a cross-sectional view in the same manufacturing process of the camera module as that in FIG. 19.
Figure 23:
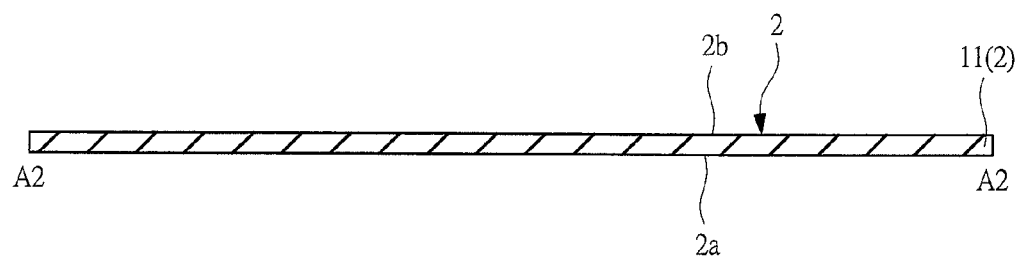
FIG. 23 is a cross-sectional view in the same manufacturing process of the camera module as that in FIG. 19.

FIGS. 19 and 20 are plan views of the principal parts (partially-enlarged bottom view) corresponding to FIG. 12. FIG. 19 depicts the stage (state) in which the sealing material 12a is supplied in step S3, and the sealing material 12a of FIG. 19 is seen through and the position (contour position) of the sealing material 12a is represented by a dotted line in FIG. 20. Although FIG. 19 is a plan view, the sealing material 12a is hatched for make the plan view ease to see. Also, FIG. 21 (A1-A1 cross-sectional view), FIG. 22 (A2-A2 cross-sectional view) and FIG. 23 (A3-A3 cross-sectional view) are cross-sectional views corresponding to FIG. 13, FIG. 14 and FIG. 15, respectively, and they depict the stage (state) in which the sealing material 12a is supplied in step S3.

In the process of supplying the sealing material 12a in step S3, with the lower surface 2b of the wiring substrate 2 facing upward, the sealing material 12a is supplied to a region around the opening OP1 on the lower surface 2b of the wiring substrate 2, that is, to the region facing the front surface 3a of the sensor chip 3 when the sensor chip 3 is mounted later. More specifically, on the lower surface 2b of the wiring substrate 2, the sealing material 12a is supplied to a region where the terminals 9 to be connected to the bump electrodes BP of the sensor chip 3 to be mounted later are arranged or its adjacent region.

The sealing material 12a supplied in step S3 is made of an insulating resin material, preferably, a thermosetting resin material, and for example, thermosetting epoxy resin can be used. At the stage of step S3, the sealing material 12a is not cured yet and is in a paste state. Thus, as the sealing material 12a supplied in step S3, non-conductive paste (NCP) can be suitably used. In step S3, the sealing material 12a can be supplied onto the lower surface 2b of the wiring substrate 2 by using, for example, a dispense method.

Next, the sensor chip 3 is mounted on the lower surface 2b of the wiring substrate 2 (step S4 in FIG. 9).

Figure 24:
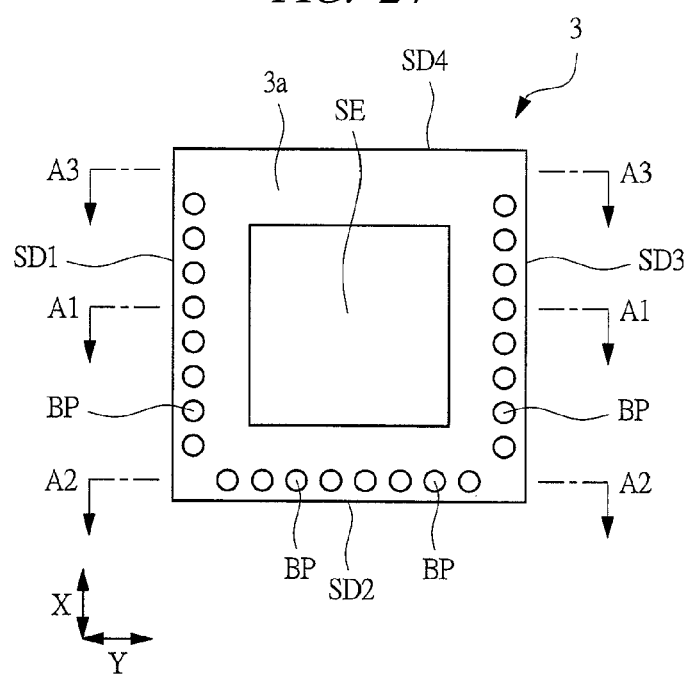
FIG. 24 is a plan view of a sensor chip for use in the manufacture of the camera module according to the embodiment of the present invention.
Figure 25:
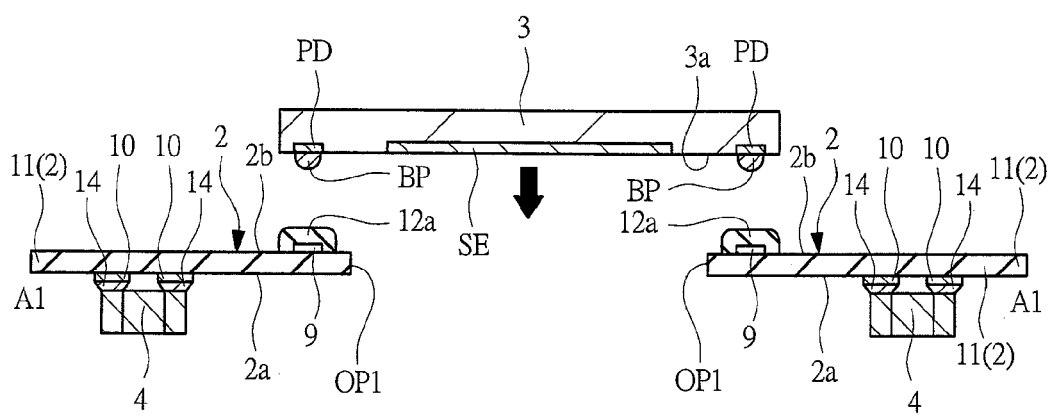
FIG. 25 is a cross-sectional view in the manufacturing process of the camera module subsequent to FIG. 19.
Figure 26:
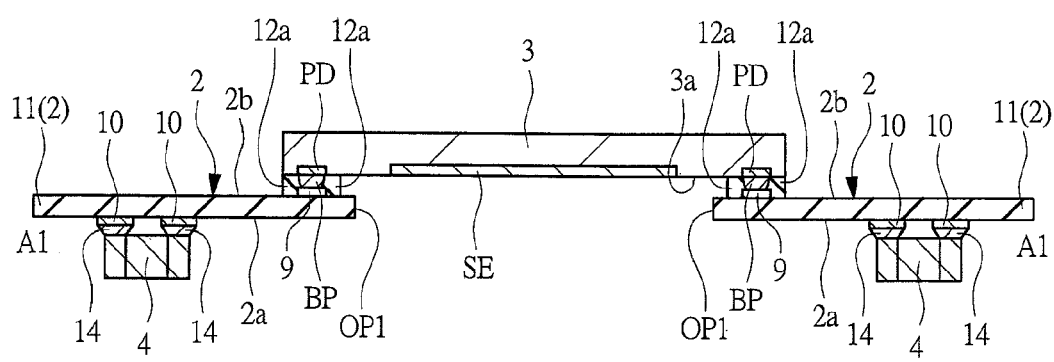
FIG. 26 is a cross-sectional view in the manufacturing process of the camera module subsequent to FIG. 25.
Figure 27:
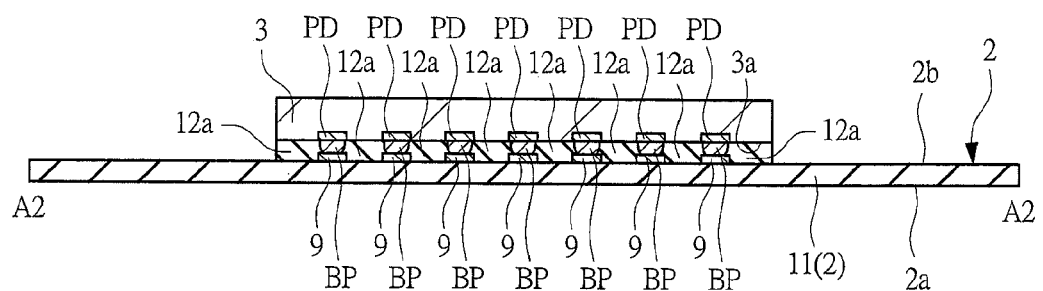
FIG. 27 is a cross-sectional view in the same manufacturing process of the camera module as that in FIG. 26.
Figure 28:
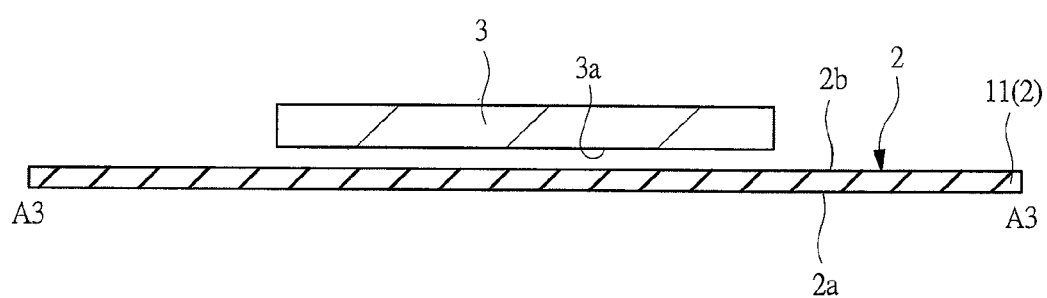
FIG. 28 is a cross-sectional view in the same manufacturing process of the camera module as that in FIG. 26.
Figure 29:
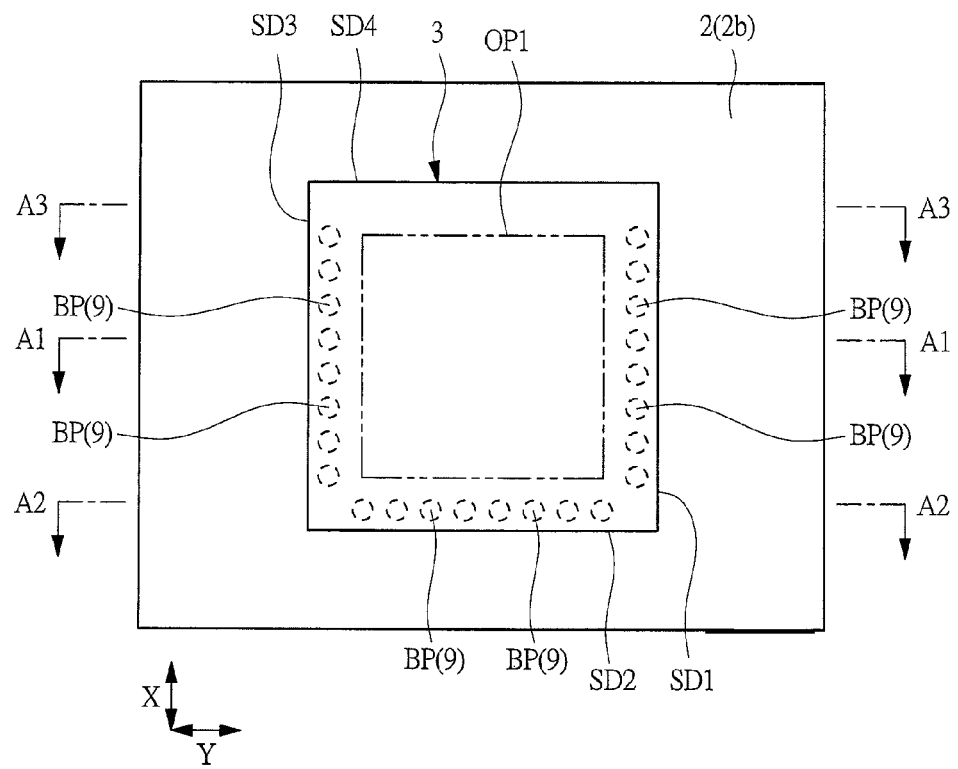
FIG. 29 is a plan view of principal parts in the same manufacturing process of the camera module as that in FIG. 26.

FIG. 24 is a plan view of the sensor chip 3 before it is mounted on the wiring substrate 2 in step S4, and it depicts the front surface 3a of the sensor chip 3. FIG. 25 (A1-A1 cross-sectional view) and FIG. 26 (A1-A1 cross-sectional view) are cross-sectional views corresponding to FIG. 13, and FIG. 27 (A2-A2 cross-sectional view) and FIG. 28 (A3-A3 cross-sectional view) are cross-sectional views corresponding to FIG. 14 and FIG. 15, respectively. FIG. 25 depicts the stage (state) in the course of mounting the sensor chip 3 on the lower surface 2b of the wiring substrate 2 in step S4, and FIGS. 26 to 28 depict the stage (state) in which the sensor chip 3 is mounted (flip-chip mounted) on the lower surface 2b of the wiring substrate 2 in step S4. FIG. 29 (plan view of principal parts) is a plan view of the principal parts (partially-enlarged bottom view) corresponding to FIG. 12, and it depicts the stage (state) in which the sensor chip 3 is mounted (flip-chip mounted) on the lower surface 2b of the wiring substrate 2 in step S4. Here, for easy understanding, one-dot chain lines representing the positions of the line A1-A1, the line A2-A2 and the line A3-A3 are shown also in FIG. 24 at the positions where the sensor chip 3 overlays these lines when it is flip-chip mounted on the lower surface 2b of the wiring substrate 2 in step S4. Furthermore, in FIG. 29, for easy understanding, the position of the opening OP1 of the wiring substrate 2 positioned (hidden) below the sensor chip 3 is represented by a two-dot chain line, and the bump electrodes BP positioned (hidden) below the sensor chip 3 are represented by dotted lines.

As depicted in FIG. 24, on the front surface 3a of the sensor chip 3 to be mounted on the lower surface 2b of the wiring substrate 2, the sensor surface SE serving as a light-receiving portion is formed. Around the sensor surface SE, that is, around the outer peripheral portion (outer-peripheral region, surrounding portion, or outer-edge portion) of the front surface 3a of the sensor chip 3, the plurality of electrode pads PD are formed, and the bump electrodes BP are respectively formed on these electrode pads PD. Note that, in FIG. 24, each electrode pad PD is disposed immediately below each bump electrode BP, and therefore, the reference characters of the electrode pads PD are omitted. Each bump electrode BP is preferably a gold bump (bump electrode made of gold). Since the bump electrode BP is preferably a stud bump (more preferably, a stud bump made of gold), when the sensor chip 3 is provided (manufactured), the bump electrodes BP are preferably formed on the electrode pads PD through a stud bump technique. The bump electrodes BP on the sensor chip 3 are formed before the sensor chip 3 is mounted (flip-chip mounted) on the lower surface 2b of the wiring substrate 2 in step S4. In the stud bump technique, a metal ball (preferably, made of gold) is formed by melting a bonding wire and is joined to the electrode pad PD of the sensor chip 3, thereby forming a stud bump (bump electrode BP).

The sensor chip 3 can be prepared (provided) anytime before the process of mounting the sensor chip 3 in step S4. This providing process can be made anytime as long as it is before step S4, that is, anytime before step S1, at the same time as step S1, after step S1, before step S2, at the same time as step S2, after step S2, before step S3, at the same time as step S3, and after step S3.

In the process of mounting the sensor chip 3 in step S4, the sensor chip 3 is flip-chip mounted on the lower surface 2b of the wiring substrate 2. Specifically, in the process of mounting the sensor chip 3 in step S4, as depicted in FIG. 25, with the lower surface 2b of the wiring substrate 2 facing upward, the sensor chip 3 is disposed (mounted) face down on the lower surface 2b of the wiring substrate 2 such that the back surface of the sensor chip 3 (the main surface opposed to the front surface 3a) faces upward and the front surface 3a of the sensor chip 3 faces downward, that is, toward the lower surface 2b side of the wiring substrate 2 to face the lower surface 2b of the wiring substrate 2. At this time, while heating the sensor chip 3 by a bonding tool (corresponding to a bonding tool 42 to be described further below) or the like, the sensor chip 3 is disposed (mounted) on the lower surface 2b of the wiring substrate 2 such that the bump electrodes BP of the sensor chip 3 face the plurality of terminals 9 on the lower surface 2b of the wiring substrate 2 and the sensor surface SE of the sensor chip 3 is exposed from the opening OP1 of the wiring substrate 2, and the sensor chip 3 is further pressed (pressured or loaded) onto the wiring substrate 2 side. In this manner, each bump electrode BP heated together with the sensor chip 3 is pressed onto each terminal 9 on the wiring substrate 2, and the bump electrodes BP on the sensor chip 3 are thermocompression-bonded onto the terminals 9 on the lower surface 2b of the wiring substrate 2, so that each bump electrode BP on the sensor chip 3 is mechanically and electrically connected to each of the terminals 9 on the lower surface 2b of the wiring substrate 2 as depicted in FIGS. 26 to 28.

Also, since the sealing material 12a is supplied in step S3 before the process of mounting the sensor chip 3 in step S4, the process of mounting the sensor chip 3 in step S4 is performed in the state in which the sealing material 12a is present on and around the terminals 9 on the lower surface 2b of the wiring substrate 2. However, in the process of mounting the sensor chip 3 in step S4, since each bump electrode BP on the sensor chip 3 is pressed onto the terminal 9 on the lower surface 2b of the wiring substrate 2 by applying a load to the sensor chip 3, the bump electrode BP is pressure-bonded (thermocompression-bonded) by pushing away the sealing material 12a to make contact with the terminal 9 on the lower surface 2b of the wiring substrate 2. Therefore, the bump electrode BP and the terminal 9 are electrically connected to each other without the sealing material 12a interposed between the bump electrode BP and the terminal 9, and a connecting portion between the bump electrode BP and the terminal 9 (that is, around the bump electrode BP) is surrounded by the sealing material 12a. Furthermore, since the sensor chip 3 is heated for the thermocompression-bonding of the bump electrode BP onto the terminal 9 in the process of mounting the sensor chip 3 in step S4, the sealing material 12a made of thermosetting resin can be cured by this heating. The heating temperature of the sensor chip 3 at this time can be approximately 200° C. to 250° C., for example, approximately 230° C.

In this manner, through the process of mounting the sensor chip 3 in step S4, the sensor chip 3 is flip-chip mounted on the lower surface 2b of the wiring substrate 2, and each bump electrode BP on the sensor chip 3 is mechanically and electrically connected to each of the terminals 9 on the lower surface 2b of the wiring substrate 2. Also, each bump electrode BP (connecting portion between the bump electrode BP and the terminal 9) is surrounded and protected by the cured sealing material 12a.

A planar shape of a general semiconductor chip is a rectangle, and bonding pads or bump electrodes are arranged at approximately equal pitches (equally) along the entire four sides of the rectangle (except four corners of the rectangle). However, in the sensor chip 3 for use in the present embodiment, on the front surface 3a of the sensor chip 3, the bump electrodes BP are not arranged at approximately equal pitches (equally) along the entire four sides (all sides) of the outer periphery. More specifically, in the sensor chip 3 for use in the present embodiment, the outer peripheral portion of the front surface 3a of the sensor chip 3 (except four corners of the rectangle) has a portion where the bump electrodes BP are arranged along the sides of the outer periphery (this portion corresponds to a first region 31) and a portion where no bump electrode BP is arranged along the sides of the outer periphery (this portion corresponds to a second region 32). In the case of FIG. 24, among four sides of the front surface 3a of the sensor chip 3 (that is, sides SD1, SD2, SD3 and SD4), the bump electrodes BP are arranged at approximately equal pitches (equally) along the sides SD1, SD2 and SD3, but no bump electrode BP is arranged along the side SD4.

When the sensor chip 3 is flip-chip mounted in step S4, each bump electrode BP on the sensor chip 3 is connected to each of the terminals 9 on the lower surface 2b of the wiring substrate 2. Therefore, the terminals 9 (terminals 9 to which the bump electrodes BP on the sensor chip 3 are to be connected) at the planned position on the lower surface 2b of the wiring substrate 2 where the sensor chip 3 is to be mounted are arranged in the same manner as the bump electrodes BP arranged on the sensor chip 3. Thus, when the bump electrodes BP are arranged along the sides SD1, SD2 and SD3 of the sensor chip 3 but not arranged along the side SD4 of the sensor chip 3 as depicted in FIG. 24, among four sides of the opening on the wiring substrate 2 (that is, SD11, SD12, SD13 and SD14), the terminals 9 are arranged along the sides SD11, SD12 and SD13, but no terminal 9 is arranged along the side SD14 as depicted in FIG. 12.

Here, among the four sides of the sensor chip 3, the side SD1 and the side SD3 are sides facing each other (parallel to each other), the side SD2 and the side SD4 are sides facing each other (parallel to each other), and the sides SD1 and SD3 and the sides SD2 and SD4 intersect each other (are orthogonal to each other). Also, among the four sides of the opening OP1 of the wiring substrate 2, the side SD11 and the side SD13 are sides facing each other (parallel to each other), the side SD12 and the side SD14 are sides facing each other (parallel to each other), and the sides SD11 and SD13 and the sides SD12 and SD14 intersect each other (are orthogonal to each other). Furthermore, among the four sides of the opening OP1 of the wiring substrate 2 (that is, SD11, SD12, SD13 and SD14), the side SD14 is a side positioned farthest from the position (region) where the connector CNT is disposed on the lower surface 2b of the wiring substrate 2, and the side SD12 is a side positioned closest to the position (region) where the connector CNT is disposed.

When the sensor chip 3 is flip-chip mounted on the lower surface 2b of the wiring substrate 2 in step S4, among the four sides of the opening OP1, the side SD11 of the opening OP1 is a side approximately parallel to and close to the side SD1 of the sensor chip 3, and the side SD12 of the opening OP1 is a side approximately parallel to and close to the side SD2 of the sensor chip 3. Also, the side SD13 of the opening OP1 is a side approximately parallel to and close to the side SD3 of the sensor chip 3, and the side SD14 of the opening OP1 is a side approximately parallel to and close to the side SD4 of the sensor chip 3.

In the sensor chip 3, the bump electrodes BP are arranged along the sides SD1, SD2 and SD3, but no bump electrode BP is arranged along the side SD4. This is because the terminals 9 for connecting the bump electrodes BP are arranged along the sides SD11, SD12 and SD13 of the opening OP1 on the lower surface 2b of the wiring substrate 2, but no terminal 9 is arranged along the side SD14 of the opening OP1. Also, as depicted in FIGS. 11 and 12, the terminals 9 for connecting the bump electrodes BP are arranged along the sides SD11, SD12 and SD13 of the opening OP1, but no terminal 9 is arranged along the side SD14 of the opening OP1. This is to shorten the length of the respective wirings WP1 connecting the terminals 9 disposed around the opening OP1 and the connector CNT (the terminals 13 connected to the connector CNT). On the lower surface 2b of the wiring substrate 2, among the four sides of the opening OP1, no terminal 9 is arranged along the side SD14 positioned farthest from the connector CNT (the terminal 13) and the terminals 9 are arranged along the sides SD11, SD12 and SD13 close to the connector CNT (the terminal 13). By this means, the length of a wiring (corresponding to the wiring WP1) connecting the terminals 9 arranged around the opening OP1 and the connector CNT (the terminal 13) can be shortened. Also, since the region for leading this wiring can be reduced, the planar dimensions (area) of the wiring substrate 2 can be decreased.

After the process of mounting the sensor chip 3 in step S4, the resin cover 5 is bonded (mounted, adhered) and fixed onto the upper surface 2a of the wiring substrate 2 (step S5 in FIG. 9).

Figure 30:
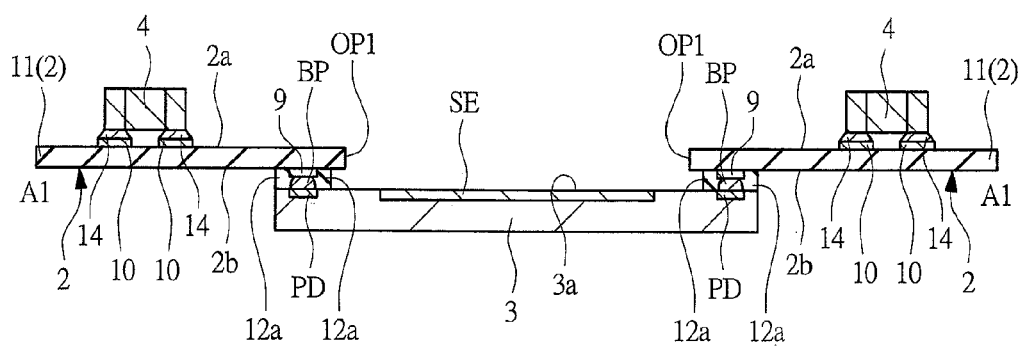
FIG. 30 is a cross-sectional view in the manufacturing process of the camera module subsequent to FIG. 26.
Figure 31:
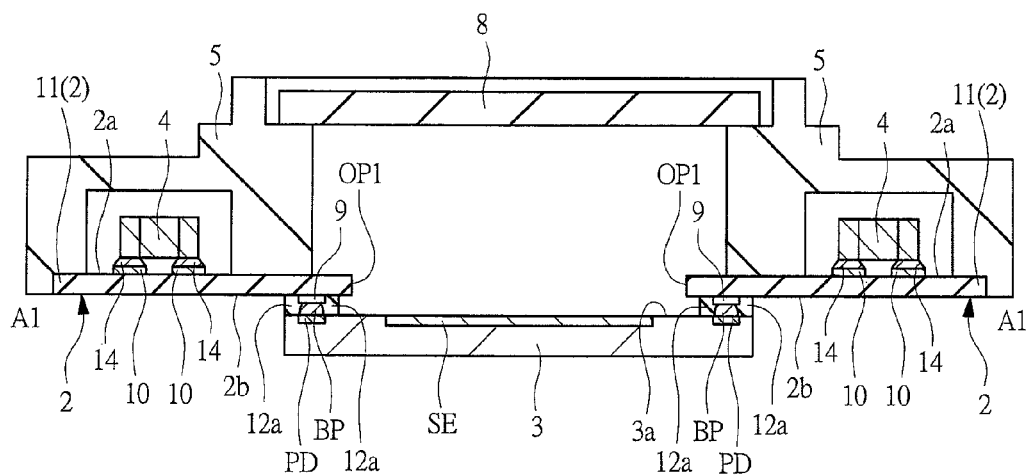
FIG. 31 is a cross-sectional view in the manufacturing process of the camera module subsequent to FIG. 30.
Figure 32:
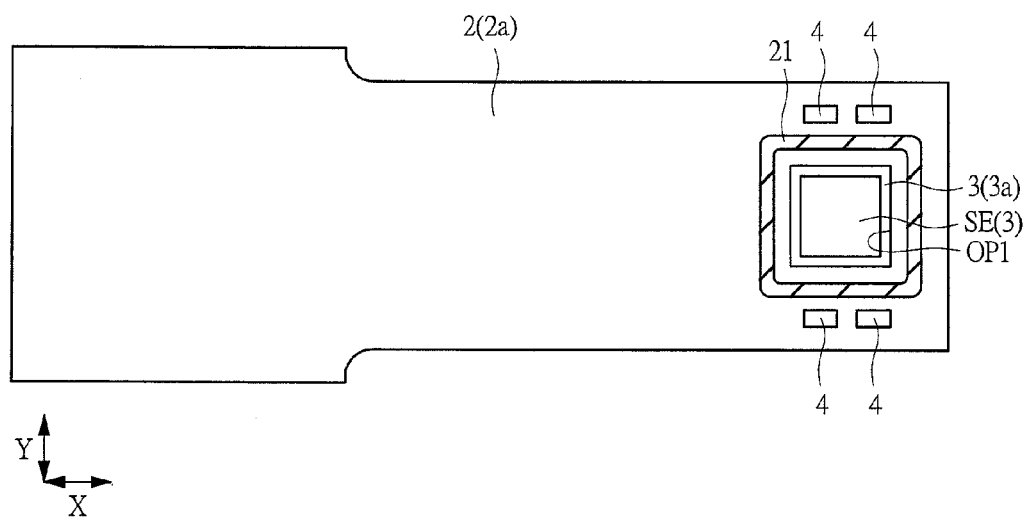
FIG. 32 is a top view depicting an application region of an adhesive for bonding a resin cover on an upper surface of the wiring substrate.

FIG. 30 (A1-A1 cross-sectional view) and FIG. 31 (A1-A1 cross-sectional view) are cross-sectional views corresponding to FIG. 13, and FIG. 32 (top view) is a bottom view (plan view) corresponding to FIG. 10. FIG. 30 depicts a stage (state) before the resin cover 5 is bonded onto the upper surface 2a of the wiring substrate 2 in step S5, and FIG. 31 depicts a stage (state) after the resin cover 5 is bonded onto the upper surface 2a of the wiring substrate 2 in step S5. Also, in FIG. 32, a region of the upper surface 2a of the wiring substrate 2 to which an adhesive 21 for bonding the resin cover 5 in step S5 is applied is hatched.

In the process of bonding the resin cover 5 in step S5, after the upper surface 2a of the wiring substrate 2 is directed upward as depicted in FIG. 30, the resin cover 5 having the IR filter 8 already mounted thereon is mounted on the upper surface 2a of the wiring substrate 2 with an adhesive (corresponding to the adhesive 21 depicted in FIG. 32) as depicted in FIG. 31, and then the adhesive is cured through a heat treatment for curing or the like, thereby bonding and fixing the resin cover 5 onto the upper surface 2a of the wiring substrate 2. As the adhesive 21 for use in bonding the resin cover 5, a thermosetting resin adhesive (thermosetting resin) can be used, and for example, a thermosetting epoxy resin adhesive can be used. This adhesive 21 is depicted in FIG. 32 and its illustration is omitted in FIG. 31 for simplification. In practice, however, the adhesive 21 is thinly interposed between the bottom surface of the resin cover 5 and the upper surface 2a of the wiring substrate 2 in FIG. 31. Also, in the process of bonding the resin cover 5 in step S5, the adhesive 21 is applied onto the bonding surface of the resin cover 5 (the bottom surface of the resin cover 5 to be bonded onto the wiring substrate 2) or the adhesive 21 is applied onto a planned region on the upper surface 2a of the wiring substrate 2 where the resin cover 5 is to be bonded (more specifically, around the opening OP1) as depicted in FIG. 32. Thereafter, the resin cover 5 is mounted on the upper surface 2a of the wiring substrate 2, and then the adhesive 21 is cured. When the adhesive 21 is applied, it is required to prevent the adhesive 21 from being attached onto the front surface 3a (in particular, the sensor surface SE) of the sensor chip 3 exposed from the opening OP1 of the wiring substrate 2.

Also, in the process of bonding the resin cover 5 in step S5, the resin cover 5 is mounted and fixed (bonded) onto the upper surface 2a of the wiring substrate 2 so as to cover the electronic components 4 mounted on the upper surface 2a of the wiring substrate 2 and (the sensor surface SE of) the front surface 3a of the sensor chip 3 exposed from the opening OP1 of the wiring substrate 2. The electronic components 4 and the sensor surface SE of the sensor chip 3 are covered with the resin cover 5 fixed onto the upper surface 2a of the wiring substrate 2, but are not in contact with the resin cover 5 and are separated from the inner wall of the resin cover 5.

After the process of bonding the resin cover 5 in step S5, the sealing material (second sealing material) 12b is supplied (injected) to a space between the lower surface 2b of the wiring substrate 2 and (the front surface 3a of) the sensor chip 3 (step S6 in FIG. 9).

Figure 33:
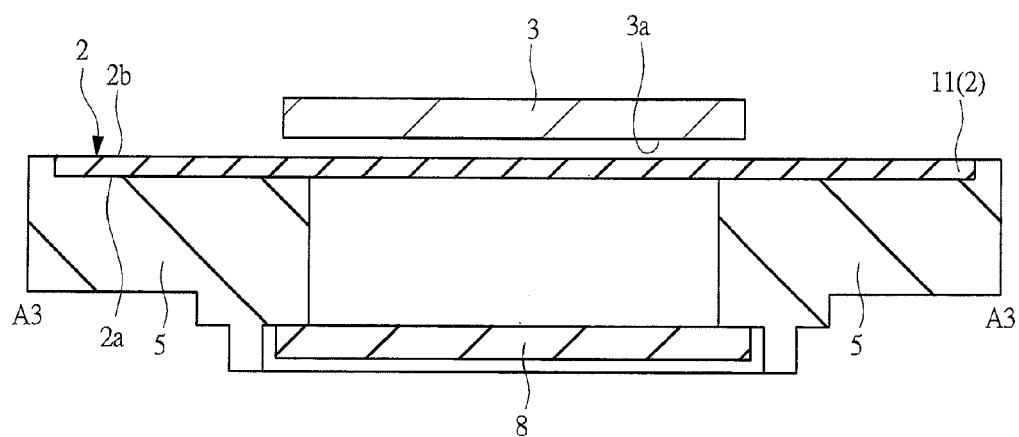
FIG. 33 is a cross-sectional view in the manufacturing process of the camera module subsequent to FIG. 31.
Figure 34:
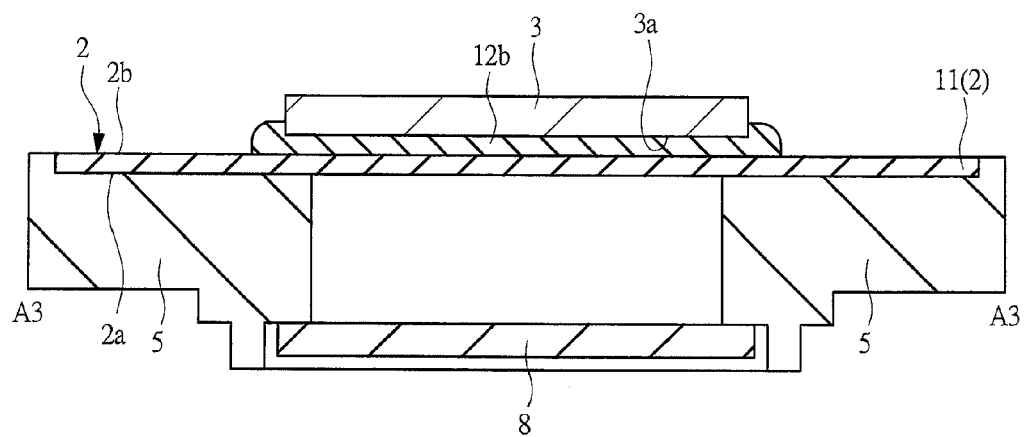
FIG. 34 is a cross-sectional view in the manufacturing process of the camera module subsequent to FIG. 33.
Figure 35:
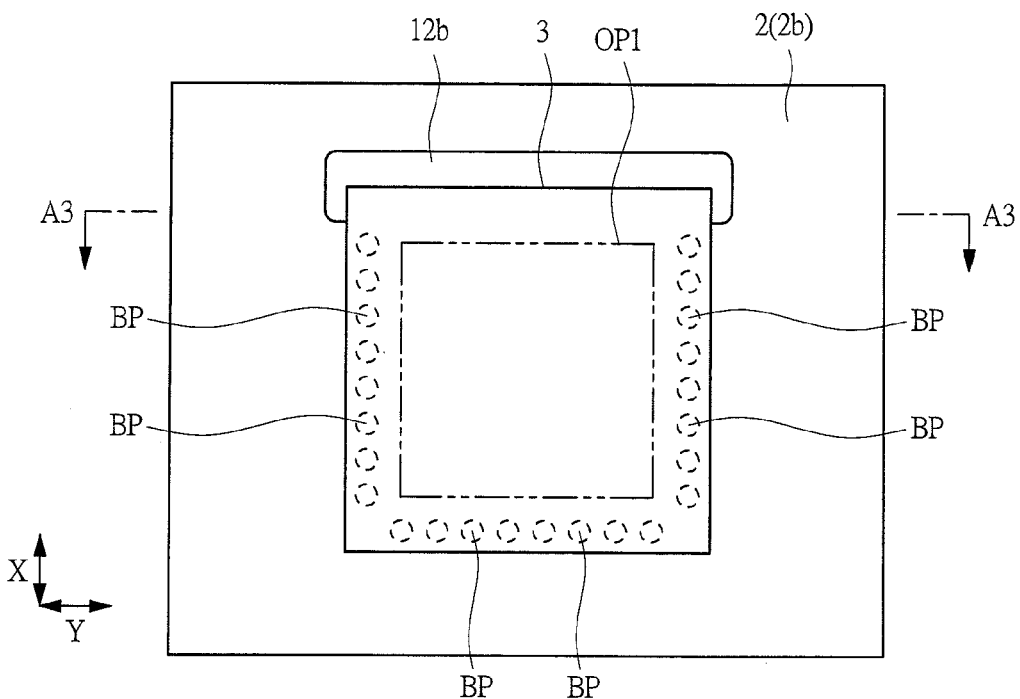
FIG. 35 is a plan view of principal parts in the same manufacturing process of the camera module as that in FIG. 34.
Figure 36:
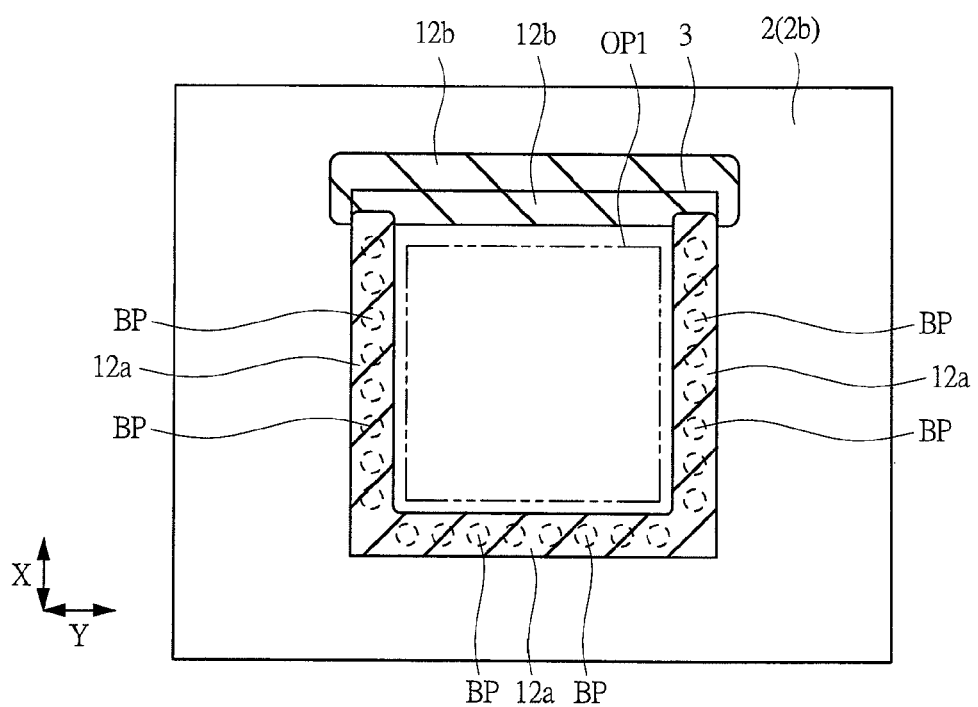
FIG. 36 is a plan view of the principal parts depicting a planar region to which the sealing material is supplied in FIG. 35.

FIG. 33 (A3-A3 section) and FIG. 34 (A3-A3 section) are cross-sectional views corresponding to FIG. 15, and FIG. 35 (plan view of principal parts) and FIG. 36 (plan view of principal parts) are plan views of principal parts (partially-enlarged bottom views) corresponding to FIG. 12. FIG. 33 depicts a stage (state) before the sealing material 12b is supplied in step S6, and FIG. 34 depicts a stage (state) after the sealing material 12b is supplied in step S6. Also, FIG. 35 depicts a stage (state) after the sealing material 12b is supplied in step S6. In FIG. 36, a planar region where the sealing material 12a is supplied and a planar region where the sealing material 12b is supplied in FIG. 35 are hatched. Here, in FIGS. 35 and 36, the position of the opening OP1 of the wiring substrate 2 is represented by a two-dot chain line and the bump electrodes BP are represented by dotted lines for easy understanding. Also, a section along a line A3-A3 in FIG. 35 approximately corresponds to FIG. 34.

In the process of supplying the sealing material 12b in step S6, after the lower surface 2b of the wiring substrate 2 is directed upward as depicted in FIG. 33, the sealing material 12b is injected into the space between the lower surface 2b of the wiring substrate 2 and the front surface 3a of the sensor chip 3 as depicted in FIG. 34. In step S6, for example, the sealing material 12b is applied near the sensor chip 3 (in this case, a region along the side SD4 where no bump electrode BP of the sensor chip 3 is arranged), whereby the sealing material 12b can be injected into the space between the lower surface 2b of the wiring substrate 2 and the front surface 3a of the sensor chip 3 by using the capillarity action.

The sealing material 12b supplied in step S6 is made of an insulating resin material and preferably a thermosetting resin material, and for example, thermosetting epoxy resin can be used. At the stage of step S6, the sealing material 12b is not cured yet and is in a paste state. Therefore, as the sealing material 12b to be supplied in step S6, non-conductive paste (NCP) can be suitably used.

In the present embodiment, a thermosetting resin having a curing temperature lower than that of the thermosetting resin for use as the sealing material 12a supplied in step S3 is more preferably used as the sealing material 12b to be supplied in step S6.

In the present embodiment, the sealing material 12a supplied in step S3 protects or keeps the bonding between the bump electrodes BP of the sensor chip 3 and the terminals 9 on the lower surface 2b of the wiring substrate 2 to increase the bonding strength between the bump electrodes BP and the terminals 9. For this reason, between the front surface 3a of the sensor chip 3 and the lower surface 2b of the wiring substrate 2 facing the front surface 3a, the region where the bump electrodes BP are arranged is required to be filled with the sealing material 12a to achieve a state in which the bump electrodes BP are surrounded by the sealing material 12a. However, since the region where no bump electrode BP is arranged is not filled with the sealing material 12a, in the process of supplying the sealing material 12b in step S6, the sealing material 12b is injected into (to fill) a region in which no bump electrode BP is arranged and the sealing material 12a is not injected between the front surface 3a of the sensor chip 3 and the lower surface 2b of the wiring substrate 2 facing the front surface 3a. This will be described in more detail further below.

After the process of supplying the sealing material 12b in step S6, the sealing material 12b is cured through a heat treatment (step S7 in FIG. 9).

In the process of curing the sealing material 12b in step S7, the wiring substrate 2 and the sealing material 12b are heated, thereby curing the sealing material 12b made of a thermosetting resin material. The sealing material 12a cured in the process of mounting the sensor chip 3 in step S4 (flip-chip mounting process) and the sealing material 12b cured in the process of curing the sealing material 12b in step S7 are combined to be the sealing material 12 described above.

Also, in the process of supplying the sealing material 12b in step S6, the sealing material 12b is externally injected into (to fill) the space between the front surface 3a of the sensor chip 3 and the lower surface 2b of the wiring substrate 2. Therefore, the amount (width) of a portion of the sealing material 12b protruding to the outside of the sensor chip 3 becomes larger compared with that of the sealing material 12a. In the present embodiment, among the sides SD11 to SD14 of the sensor chip 3, the sealing material 12b is supplied in step S6 to only the side SD14 where no bump electrode BP is arranged. Therefore, in the manufactured camera module MJ1 (MJ1a), as is evident from FIGS. 35 and 36, the amount (width) of a portion of the sealing material 12 (12a and 12b) protruding from the side SD14 of the sensor chip 3 where no bump electrode BP is arranged is larger (more) than the amount (width) of a portion of the sealing material 12 (12a and 12b) protruding from each of the other sides SD11, SD12 and SD13 where the bump electrodes BP are arranged.

After the process of curing the sealing material 12b in step S7, the resin cover 7 is bonded (mounted, adhered) and fixed onto the lower surface 2b of the wiring substrate 2 so as to cover the sensor chip 3 (step S8 in FIG. 9).

Figure 37:
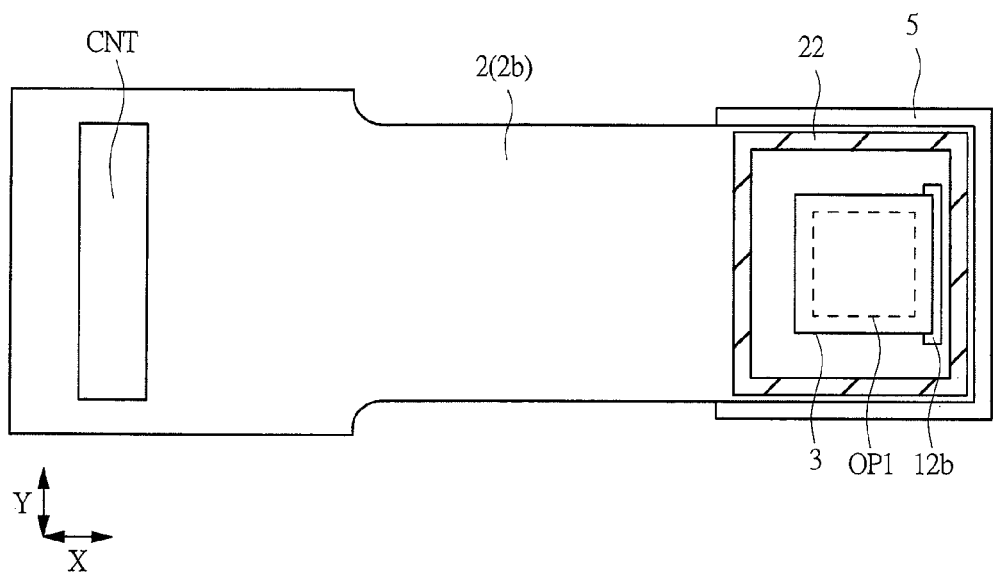
FIG. 37 is a bottom view in the manufacturing process of the camera module subsequent to FIG. 34.
Figure 38:
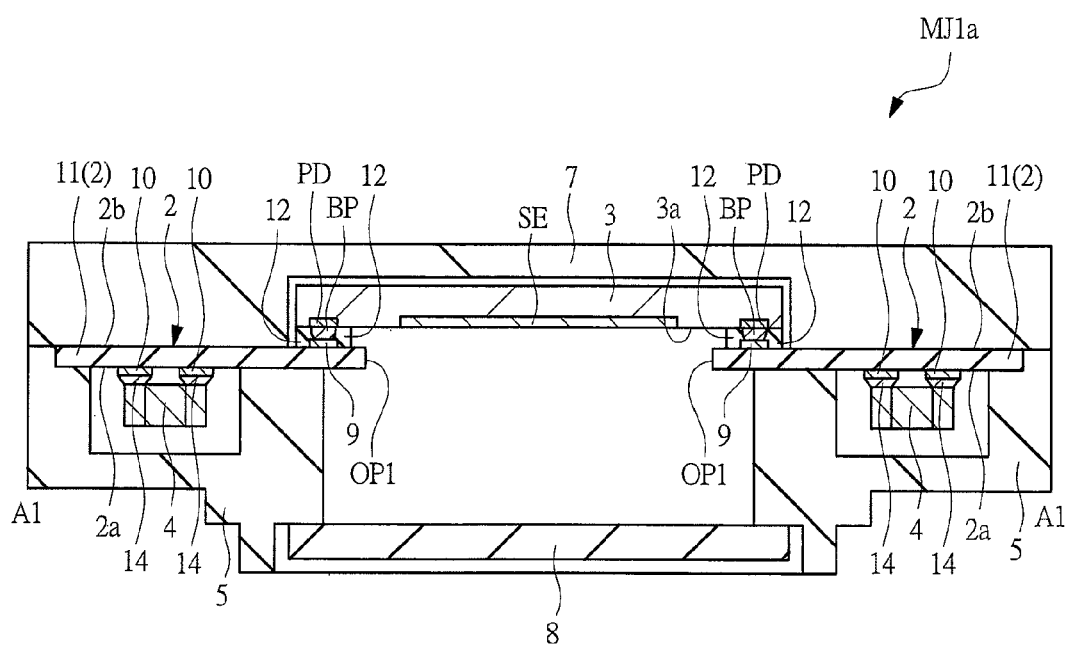
FIG. 38 is a cross-sectional view in the manufacturing process of the camera module subsequent to FIG. 37.

FIG. 37 (bottom view) is a bottom view (plan view) corresponding to FIG. 11, and FIG. 38 (A1-A1 cross-sectional view) is a cross-sectional view corresponding to FIG. 13. In FIG. 37, a region of the lower surface 2b of the wiring substrate 2 to which an adhesive 22 for bonding the resin cover 7 is applied in step S8 is hatched. Also, FIG. 38 depicts a stage (state) after the resin cover 7 is bonded onto the lower surface 2b of the wiring substrate 2 in step S8. Note that, in FIG. 37, the wirings WP1 and the terminals 13 depicted in FIG. 11 are omitted for the simplification of the drawing.

In the process of bonding the resin cover 7 in step S8, as depicted in FIG. 37, after the lower surface 2b of the wiring substrate 2 is directed upward and an adhesive is applied (supplied) around the sensor chip 3 on the lower surface 2b of the wiring substrate 2, the resin cover 7 is mounted (disposed) thereon, and then the adhesive is cured through a heat treatment for curing, whereby the resin cover 7 is bonded onto the lower surface 2b of the wiring substrate 2 as depicted in FIG. 38. As an adhesive for use for bonding the resin cover 7, a thermosetting resin adhesive (thermosetting resin) or the like can be used, and for example, a thermosetting epoxy resin adhesive can be used. This adhesive 22 is depicted in FIG. 37 and its illustration is omitted in FIG. 38 for simplification. In practice, however, the adhesive 22 is thinly interposed between the bottom surface of the resin cover 7 and the lower surface 2b of the wiring substrate 2 in FIG. 38. By covering the sensor chip 3 with the resin cover 7, the sensor chip 3 can be protected.

It is more preferable that the same material (the same thermosetting resin material) as that of the sealing material 12b used in step S6 is used as the adhesive 22 for use in bonding the resin cover 7 onto the wiring substrate 2 in step S8. In this case, in step S6, the sealing material 12b is injected into the space between (the front surface 3a of) the sensor chip 3 and the lower surface 2b of the wiring substrate 2 as described above, and at the same time, the same material as the sealing material 12b is further supplied (applied) around the sensor chip 3 on the lower surface 2b of the wiring substrate 2 as the adhesive 22 for bonding the resin cover 7. Then, without performing a heat treatment for curing the sealing material 12b in step S7, the resin cover 7 is mounted (disposed) on the lower surface 2b of the wiring substrate 2 so as to cover the sensor chip 3, and then a heat treatment for curing is performed in step S8 to cure both of the sealing material 12b injected into the space between the sensor chip 3 and the lower surface 2b of the wiring substrate 2 and the adhesive 22 (made of the same material as the sealing material 12b) for bonding the resin cover 7. In this manner, the manufacturing process of the camera module MJ1 can be simplified. The same goes for a second embodiment to be described further below.

Through the processes up to the process of bonding the resin cover 7 in step S8, the camera module MJ1a having no lens unit 6 mounted thereon is completed.

After the process of bonding the resin cover 7 in step S8, the lens unit 6 is mounted on an upper portion of the resin cover 5 (step S9 in FIG. 9). FIGS. 1 and 2 correspond to the state after the lens unit 6 is mounted in step S9.

In the process of mounting the lens unit 6 in step S9, for example, after an adhesive is applied (supplied) to a planned region on the upper portion of the resin cover 5 where the lens unit 6 is to be mounted, the lens unit 6 is disposed thereon, and the adhesive is cured through a heat treatment for curing, thereby fixing the lens unit 6 onto the upper portion of the resin cover 5. When the adhesive for mounting the lens unit 6 is applied to the resin cover 5, it is required to prevent the adhesive from being attached onto the IR filter 8 mounted on the resin cover 5. As the adhesive for use in mounting the lens unit 6, a thermosetting resin adhesive (thermosetting resin) or the like can be used, and for example, a thermosetting epoxy resin adhesive can be used.

In this manner, the camera module MJ1 according to the present embodiment as described above with reference to FIGS. 1 to 8 is manufactured (assembled). Alternatively, the camera module MJ1 can also be completed by shipping the camera module MJ1a having no lens unit 6 mounted thereon to a customer side and mounting the lens unit 6 on the camera module MJ1a on the customer side (that is, the process of mounting the lens unit 6 in step S9 is performed on the customer side). Therefore, the camera module MJ1 having the lens unit 6 mounted thereon and the camera module MJ1a having no lens unit 6 mounted thereon can both be regarded as solid-state image pickup devices.

<Features of Present Embodiment>

Next, features of the present embodiment will be described in more detail.

In the camera module MJ1 according to the present embodiment, a thin and flexible wiring substrate (flexible substrate) excellent in bending properties is used as the wiring substrate 2 on which the sensor chip 3 is to be mounted, in place of a rigid substrate as hard as a glass epoxy resin substrate. On this flexible wiring substrate, that is, the wiring substrate 2, a sensor chip is flip-chip connected in place of wire bonding connection. By this means, the camera module MJ1 can be reduced in thickness and in size, and as a result, the electronic device in which the camera module MJ1 is mounted can be reduced in thickness and in size.

As described above, while the sensor chip 3 is flip-chip mounted on the wiring substrate 2, in order to allow light to enter the sensor surface SE of the sensor chip 3, the opening OP1 that can expose the sensor surface SE of the sensor chip 3 is provided in advance in a planned region on the lower surface 2b of the wiring substrate 2 where a chip is to be mounted (the region where the sensor chip 3 is to be mounted (disposed) in step S4). Therefore, when the sensor chip 3 is mounted (flip-chip mounted) on the planned chip-mounting region on the lower surface 2b of the wiring substrate 2 in step S4, the sensor surface SE of the sensor chip 3 is exposed from the opening OP1 of the wiring substrate 2, so that light can enter this sensor surface SE from above the sensor surface SE of the sensor chip 3. In this manner, functions of the camera module MJ1 as the solid-state image pickup device can be achieved.

However, according to the studies by the inventors, it has been found that the mounting strength of the sensor chip 3 is insufficient when the sensor chip 3 is flip-chip mounted on the wiring substrate 2 and each bump electrode BP of the sensor chip 3 and each terminal 9 of the wiring substrate 2 to be connected thereto are simply connected. One reason therefor is that the wiring substrate 2 tends to be deformed (bent) because it is a flexible wiring substrate, and when the wiring substrate 2 is deformed (bent) after flip-chip mounting of the sensor chip 3, a load is applied to a connecting portion between each bump electrode BP of the sensor chip 3 and each terminal 9 of the wiring substrate 2. If the mounting strength of the sensor chip 3 is insufficient, there is a possibility of decreasing the manufacturing yield of the camera modules (solid-state image pickup devices) and also decreasing the reliability of the manufactured camera module (solid-state image pickup device).

To get around such problems, in the present embodiment, the sealing material 12a is disposed between the sensor chip 3 and the wiring substrate 2, and the sealing material 12a is cured with heat when the sensor chip 3 is flip-chip mounted, so that the mounting strength of the sensor chip 3 is improved.

More specifically, in the present embodiment, after the sealing material 12a is supplied (applied, disposed) to a part of the planned chip-mounting region on the lower surface 2b of the wiring substrate 2 in step S3, the sensor chip 3 is mounted on the planned chip-mounting region on the lower surface 2b of the wiring substrate 2 in step S4. Also, the region to which the sealing material 12a is supplied on the lower surface 2b of the wiring substrate 2 in step S3 is a region planarly overlapped with a region where the bump electrodes BP are arranged on the front surface 3a of the sensor chip 3 when the sensor chip 3 is mounted in step S4.

Therefore, when the sensor chip 3 is mounted on the lower surface 2b of the wiring substrate 2 in step S4 to respectively connect (thermocompression-bond) the plurality of bump electrodes BP of the sensor chip 3 to the terminals 9 on the lower surface 2b of the wiring substrate 2, each of the bump electrodes BP connected to each of the terminals 9 on the lower surface 2b of the wiring substrate 2 is surrounded by the sealing material 12a. Then, when this sealing material 12a is cured, each of the bump electrodes BP connected to each of the terminals 9 on the lower surface 2b of the wiring substrate 2 is surrounded by the cured sealing material 12a. In this manner, the connecting portion between each bump electrode BP of the sensor chip 3 and each terminal 9 of the wiring substrate 2 can be protected or reinforced with the cured sealing material 12a, so that the mounting strength of the sensor chip 3 can be improved.

Also, in step S4, the sensor chip 3 is mounted on the planned chip-mounting region on the lower surface 2b of the wiring substrate 2 while being heated, and the plurality of bump electrodes BP of the sensor chip 3 are respectively thermocompression-bonded onto the plurality of terminals 9 on the lower surface 2b of the wiring substrate 2. Further, since the sealing material 12a is made of thermosetting resin, the sealing material 12a can be heated and cured by the heating for thermocompression-bonding the bump electrodes BP onto the terminals 9 in step S4 (heating of the sensor chip 3). More specifically, heating in step S4 (heating of the sensor chip 3) includes the heating for connecting (thermocompression-bonding) the bump electrodes BP to the terminals 9 (heat treatment, heating process) and the heating for curing the sealing material 12a (heat treatment, heating process). Thus, the manufacturing process of the camera module MJ1 can be simplified. Also, if the bump electrodes BP are connected (thermocompression-bonded) onto the terminals 9 and the sealing material 12a is cured by the heating in step S4, the bump electrodes BP can be first connected (thermocompression-bonded) onto the terminals 9 on the lower surface 2b of the wiring substrate 2 in step S4, and then the sealing material 12a around each bump electrode BP can be quickly cured. Therefore, the connecting portion between the terminal 9 and the bump electrode BP can be immediately protected or reinforced with the cured sealing material 12a.

Also, in step S4, the time required for curing the sealing material 12a is longer than the time required for connecting (thermocompression-bonding) the bump electrodes BP of the sensor chip 3 onto the terminals 9 of the wiring substrate 2. Therefore, in step S4, the sealing material 12a is not cured first and does not inhibit the connection (thermocompression-bonding) of the bump electrodes BP onto the terminals 9. More specifically, in step S4, each of the bump electrodes BP of the sensor chip 3 pushes away the sealing material 12a in a soft state to be pressed and thermocompression-bonded onto the terminal 9 on the lower surface 2b of the wiring substrate 2, and after several seconds or so (for example, about five seconds) pass from the completion of this thermocompression-bonding, curing of the sealing material 12a is completed. Therefore, in step S4, even after the bump electrodes BP are thermocompression-bonded onto the terminals 9, the heating (heating of the sensor chip 3 and resultant heating of the sealing material 12a) is preferably continued until curing of the sealing material 12a is completed (for example, for several seconds).

According to the studies by the inventors, however, new problems may arise depending on the layout (arrangement) of the bump electrodes BP on the sensor chip 3.

In an arrangement of the bump electrodes on the front surface of the sensor chip, the bump electrodes are equally arranged at equal pitches along the four sides of the outer periphery. However, depending on the layout of the wiring substrate on which the sensor chip is to be mounted (shape of the wiring substrate itself or a layout of wiring patterns formed thereon) and the arrangement of the electronic components other than the sensor chip mounted on the wiring substrate, the layout in which the bump electrodes are not arranged at equal pitches along the four sides of the outer periphery of the front surface of the sensor chip is advantageous in some cases.

Figure 39:
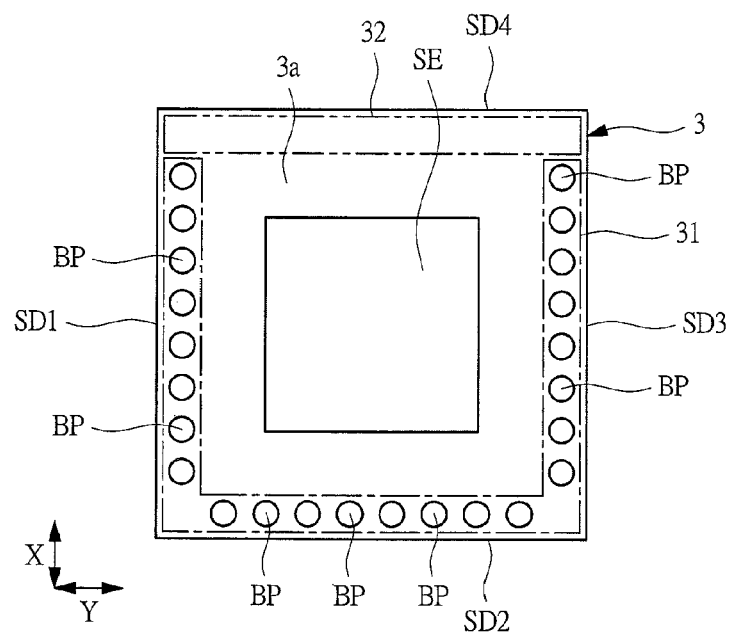
FIG. 39 is a plan view of a sensor chip.

As described above, in the sensor chip 3 for use in the present embodiment, the bump electrodes BP are not arranged at equal pitches (equally) along the entire four sides of the outer periphery of the front surface 3a of the sensor chip 3. More specifically, on the outer peripheral portion (surrounding portion) of the front surface 3a, the sensor chip 3 has the first region 31 where the bump electrodes BP are arranged and the second region 32 where no bump electrode BP is arranged. FIG. 39 is a plan view (top view) of the sensor chip 3 for use in the present embodiment and it depicts the front surface 3a of the sensor chip 3, in which the first region 31 is represented by a one-dot chain line and the second region 32 is represented by a two-dot chain line.

In the case of FIG. 39, among the sides SD1, SD2, SD3 and SD4 of the front surface 3a of the sensor chip 3, the bump electrodes BP are arranged along the sides SD1, SD2 and SD3, but no bump electrode BP is arranged along the side SD4. Therefore, on the outer peripheral portion of the front surface 3a of the sensor chip 3, a region along the sides SD1, SD2 and SD3 corresponds to the first region 31, and a region along the side SD4 corresponds to the second region 32.

Figure 40:
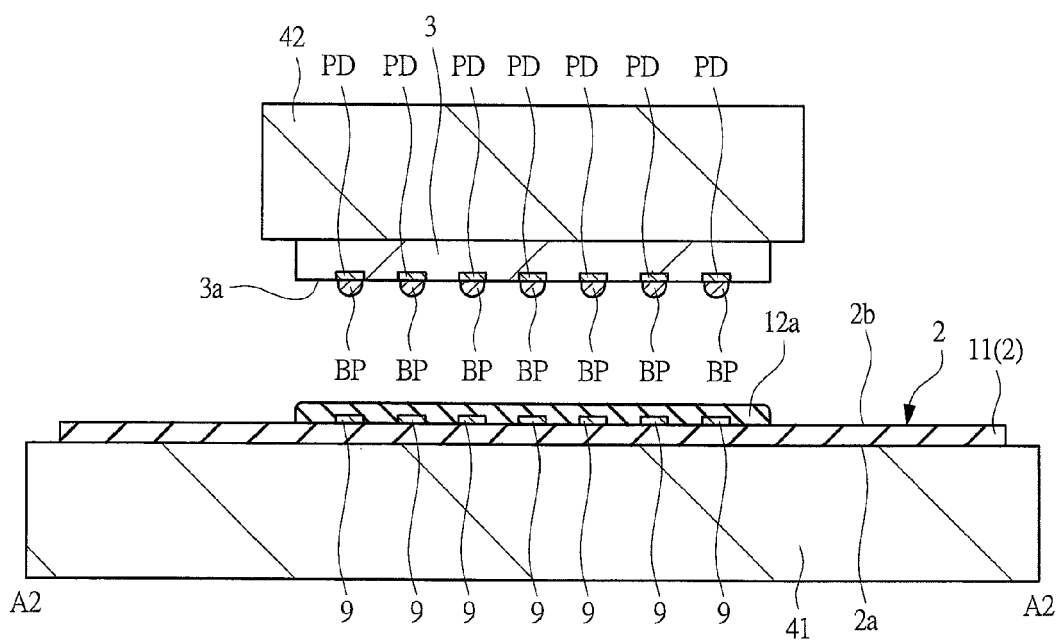
FIG. 40 is an explanatory diagram of a flip-chip mounting process of the sensor chip.
Figure 41:
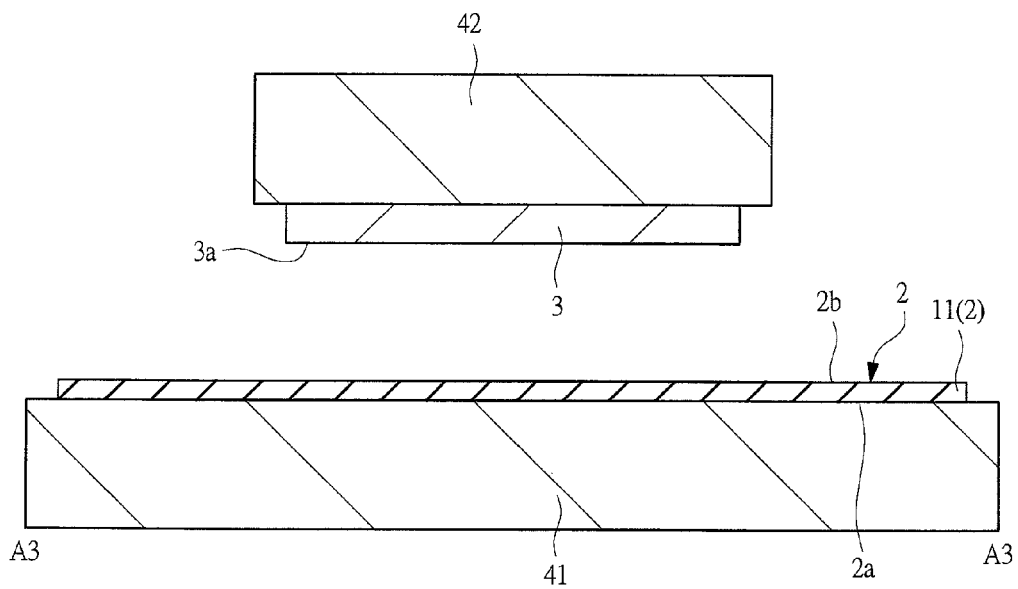
FIG. 41 is an explanatory diagram of the flip-chip mounting process of the sensor chip.
Figure 42:
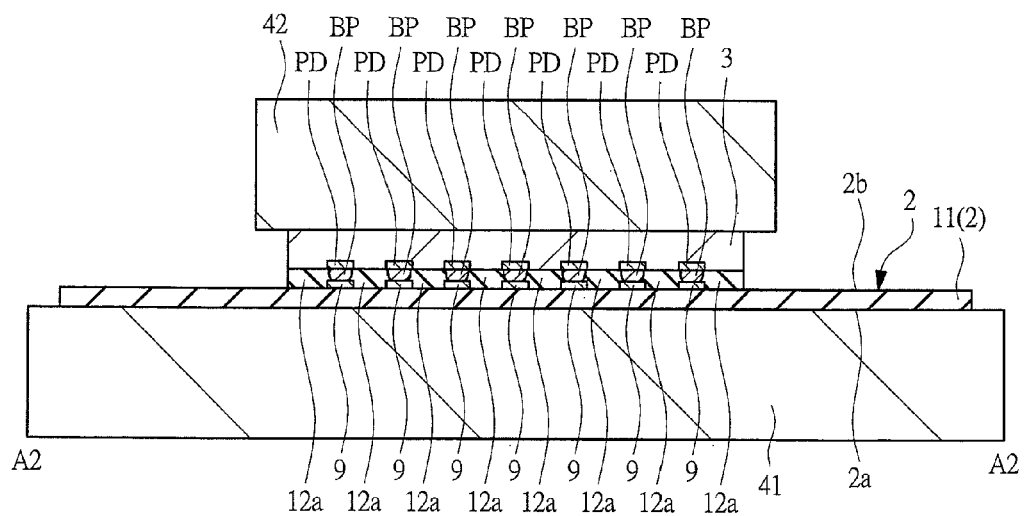
FIG. 42 is an explanatory diagram of the flip-chip mounting process of the sensor chip.
Figure 43:
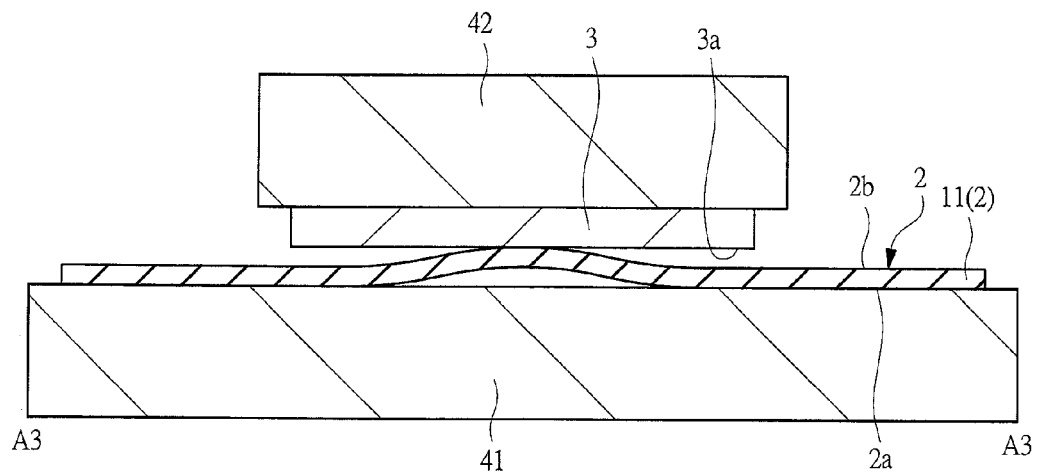
FIG. 43 is an explanatory diagram of the flip-chip mounting process of the sensor chip.

When the sensor chip 3 with the above-described arrangement of the bump electrodes BP is flip-chip mounted on the flexible wiring substrate (corresponding to the wiring substrate 2), a phenomenon as depicted in FIGS. 40 to 43 occurs. FIGS. 40 to 43 are explanatory diagrams (cross-sectional views) for describing the state in which the sensor chip 3 is pressed onto the wiring substrate 2 while being heated for flip-chip mounting. FIGS. 40 and 42 correspond to a cross-sectional view at a position along a line A2-A2 in FIG. 29, and FIGS. 41 and 43 correspond to a cross-sectional view at a position along a line A3-A3 in FIG. 29. FIGS. 40 and 41 depict the state at the same time point (timing), and FIGS. 42 and 43 depict the state at the same time point (timing).

When the sensor chip 3 is flip-chip connected in step S4, the wiring substrate 2 is disposed on a stage (bonding stage) 41 such that the upper surface 2a of the wiring substrate 2 faces the stage 41 and the lower surface 2b of the wiring substrate 2 faces upward as depicted in FIGS. 40 and 41. Although not shown, when the wiring substrate 2 is disposed on the stage 41, the electronic components 4 mounted on the upper surface 2a of the wiring substrate 2 are disposed in indentations (concave portions) of the stage 41, so that it is possible to prevent the electronic components 4 from obstructing the wiring substrate 2 to be disposed on the stage 41.

Then, while heating the sensor chip 3 by the bonding tool 42 or the like, the sensor chip 3 is pressed onto the wiring substrate 2 side as depicted in FIGS. 41 and 42. By this means, each bump electrode BP heated together with the sensor chip 3 is pressed onto each of the terminals 9 of the wiring substrate 2, and the bump electrodes BP of the sensor chip 3 are thermocompression-bonded onto the terminals 9 on the lower surface 2b of the wiring substrate 2.

As described above, the sensor chip 3 is heated in order to connect (thermocompression-bond) each bump electrode BP of the sensor chip 3 to each of the terminals 9 of the wiring substrate 2, but the wiring substrate 2 is also heated by this heating. The reason why the wiring substrate 2 is also heated is that heat conduction occurs from the sensor chip 3 through the bump electrodes BP to the wiring substrate 2. Since the wiring substrate 2 is a flexible wiring substrate, the wiring substrate 2 may be possibly bent due to this heating. However, since the bump electrodes BP act so as to keep a constant space between the sensor chip 3 and the wiring substrate 2, bending of the wiring substrate 2 is suppressed or prevented by the bump electrodes BP in and near a region of the wiring substrate where the bump electrodes BP of the sensor chip 3 are connected. Therefore, in the region of the sensor chip 3 along the sides SD1, SD2 and SD3, bending of the wiring substrate 2 is suppressed or prevented because the bump electrodes BP are arranged as depicted in FIG. 39. On the other hand, in the region of the sensor chip 3 along the side SD4 where no bump electrode BP is arranged (that is, the region along the line A3-A3), no bump electrode BP is present between the sensor chip 3 and the wiring substrate 2 as depicted in FIG. 43. Therefore, there is a possibility that the effect of suppressing the bending of the wiring substrate 2 by the bump electrodes BP cannot be obtained and the wiring substrate 2 is bent.

Figure 44:
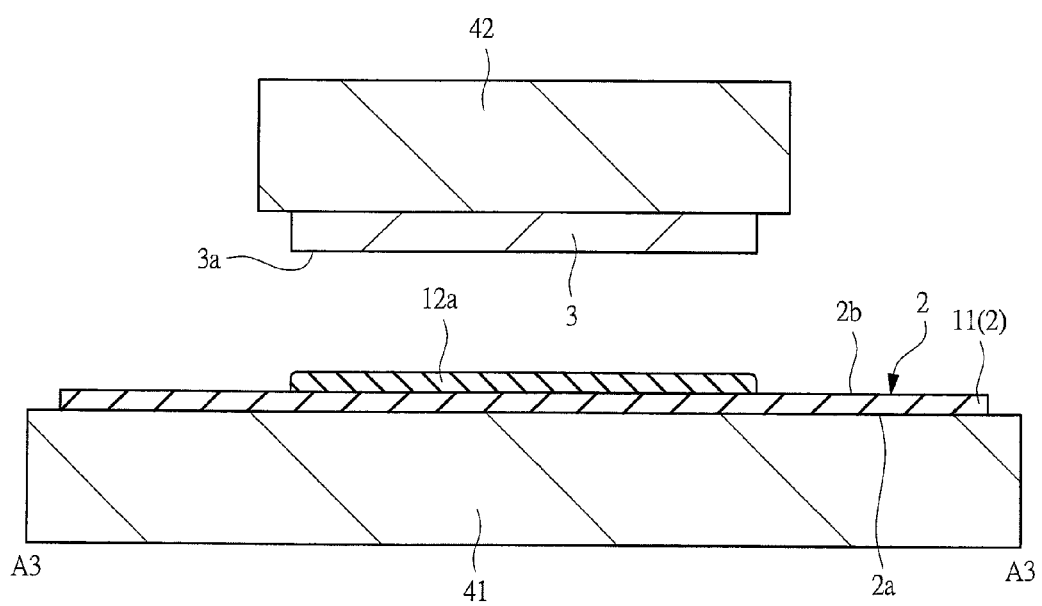
FIG. 44 is an explanatory diagram of the flip-chip mounting process of the sensor chip in a modification example.
Figure 45:
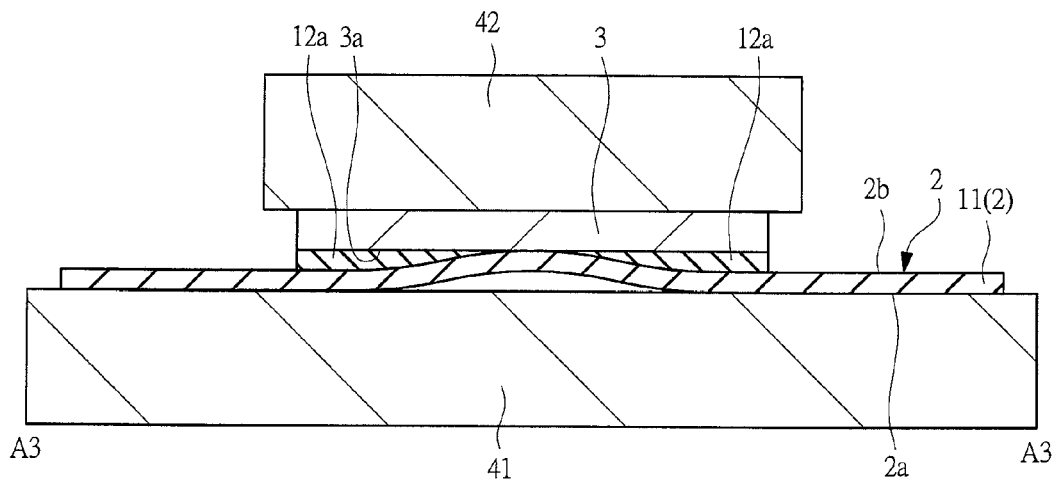
FIG. 45 is an explanatory diagram of the flip-chip mounting process of the sensor chip in the modification example.

FIGS. 44 and 45 are cross-sectional views depicting a manufacturing process of a comparison example and correspond to FIGS. 41 and 43, respectively, but a region where the sealing material 12a is supplied is different from that of the present embodiment. More specifically, in the case of FIGS. 41 and 43, the sealing material 12a is not supplied to the region of the sensor chip 3 along the side SD4 where no bump electrode BP is arranged (that is, the region along the line A3-A3) like the present embodiment. On the other hand, in the case of FIGS. 44 and 45, the sealing material 12a is supplied also to the region of the sensor chip 3 along the side SD4 where no bump electrode BP is arranged (that is, the region along the line A3-A3) unlike the present embodiment.

Even when the sealing material 12a is supplied also to the region of the sensor chip 3 along the side SD4 where no bump electrode BP is arranged as depicted in FIG. 44, there is a possibility that the wiring substrate 2 is heated by the heat when the sensor chip 3 is flip-chip connected and the wiring substrate 2 is bent in the region of the sensor chip 3 along the side SD4 where no bump electrode BP is arranged as depicted in FIG. 45. When the sealing material 12a is supplied also to the region of the sensor chip 3 along the side SD4 where no bump electrode BP is arranged, if the wiring substrate 2 is bent, the wiring substrate 2 and the sensor chip 3 come close to each other in distance (space), so that a part of the uncured sealing material 12a disposed between the wiring substrate 2 and the sensor chip 3 is pushed to flow out from the space between the wiring substrate 2 and the sensor chip 3 to the surrounding portion. When the part of the sealing material 12a flows out from the space between the wiring substrate 2 and the sensor chip 3 to the surrounding portion, the sensor surface SE of the sensor chip 3 may possibly be covered with the part of the flowing sealing material 12a. This decreases the manufacturing yield of the camera modules (solid-state image pickup devices) and also decreases the reliability of the manufactured camera module (solid-state image pickup device). Since the sensor surface SE of the sensor chip 3 is a light-receiving portion, it is important to prevent a foreign substance such as the sealing material 12a from being attached to the sensor surface SE.

On the other hand, in the present embodiment, when the sealing material 12a is supplied to the planned chip-mounting region on the lower surface 2b of the wiring substrate 2 in step S3, the sealing material 12a is supplied to a region planarly overlapped with the first region 31 (the region where the bump electrodes BP are arranged) when the sensor chip 3 is mounted later in step S4, and the sealing material 12a is not supplied to a region planarly overlapped with the second region 32 (the region where no bump electrode BP is arranged). In the case of FIGS. 24 and 39, the bump electrodes BP are arranged along the sides SD1, SD2 and SD3, but no bump electrode BP is arranged along the side SD4. Therefore, a region of the outer peripheral portion of the front surface 3a of the sensor chip 3 along the sides SD1, SD2 and SD3 corresponds to the first region 31, and a region thereof along the side SD4 corresponds to the second region 32.

Therefore, when the sensor chip 3 is mounted on the wiring substrate 2 in step S4, the sealing material 12a is disposed in a space between the first region 31 on the front surface 3a of the sensor chip 3 (the region where the bump electrodes BP are arranged) and the lower surface 2b of the wiring substrate 2. However, since the bump electrodes BP act so as to keep the constant space between the sensor chip 3 and the wiring substrate 2, the wiring substrate 2 is hardly bent in this region (the region planarly overlapped with the first region 31). Therefore, even when the sealing material 12a is present in the space between the first region 31 of the front surface 3a of the sensor chip 3 (the region where the bump electrodes BP are arranged) and the lower surface 2b of the wiring substrate 2, the bump electrodes BP prevent the wiring substrate 2 from being bent, so that it is possible to prevent the sealing material 12a from flowing out to be attached to the sensor surface SE of the sensor chip 3.

On the other hand, when the sensor chip 3 is mounted on the wiring substrate 2 in step S4, no bump electrode BP is arranged in the space between the second region 32 on the front surface 3a of the sensor chip 3 (the region where no bump electrode BP is present) and the lower surface 2b of the wiring substrate 2. Therefore, the wiring substrate 2 tends to be bent in this region (the region planarly overlapped with the second region 32), and the wiring substrate 2 and the sensor chip 3 are apt to come close to each other in distance (space) due to the bending of the wiring substrate 2. If the sealing material 12a is present in this region (the region planarly overlapped with the second region 32), the sealing material 12a may possibly be pushed out and attached onto the sensor surface SE of the sensor chip 3. In the present embodiment, in order to prevent this phenomenon, in the process of supplying the sealing material 12a in step S3, the sealing material 12a is not supplied to the region planarly overlapped with the second region 32 (the region where no bump electrode BP is present) when the sensor chip 3 is mounted later in step S4. Thus, when the sensor chip 3 is mounted on the wiring substrate 2 in step S4, the sealing material 12a is hardly present in the space between the second region 32 on the front surface 3a of the sensor chip 3 (the region where no bump electrode BP is arranged) and the lower surface 2b of the wiring substrate 2. Therefore, even when the wiring substrate 2 in this region (the region planarly overlapped with the second region 32) is bent because no bump electrode BP is arranged, there is no sealing material 12a itself to be pushed out to the surrounding portion. Accordingly, it is possible to prevent the sealing material 12a from flowing out from the space between the second region 32 on the front surface 3a of the sensor chip 3 (the region where no bump electrode BP is arranged) and the lower surface 2b of the wiring substrate 2 to the surrounding portion and being attached onto the sensor surface SE of the sensor chip 3.

As described above, on the lower surface 2b of the wiring substrate 2, the sealing material 12a is supplied in step S3 to the region where the wiring substrate 2 tends not to be bent in step S4 (the region planarly overlapped with the first region 31), but the sealing material 12a is not supplied in step S3 to the region where the wiring substrate 2 tends to be bent in step S4 (the region planarly overlapped with the second region 32). By this means, unwanted flow of the sealing material 12a and attachment of the sealing material 12a onto the sensor surface SE of the sensor chip 3 can be prevented. Therefore, it is possible to improve the manufacturing yield of the camera modules (solid-state image pickup devices) and also improve the reliability of the manufactured camera module (solid-state image pickup device). Furthermore, the sealing material 12a is provided in order to protect the connecting portion between the bump electrodes BP and the terminals 9 of the wiring substrate 2 and improve the mounting strength of the sensor chip 3, and this function can be achieved by supplying, in step S3, the sealing material 12*a* to the region of the lower surface 2*b* of the wiring substrate 2 planarly overlapped with the first region 31 (the region where the bump electrodes BP are arranged) when the sensor chip 3 is mounted later in step S4.

In the present embodiment, when the sealing material 12*a* is supplied to the lower surface 2*b* of the wiring substrate 2 in step S3, it is important to supply the sealing material 12*a* to the region planarly overlapped with the first region 31 (the region where the bump electrodes BP are arranged) when the sensor chip 3 is mounted later in step S4 and not to supply the sealing material 12*a* to the region planarly overlapped with the second region 32 (the region where no bump electrode BP is arranged). However, when the sensor chip 3 is mounted in step S4, the sealing material 12*a* may be pushed and slightly moved by any of the bump electrode BP or the surface 3*a* of the sensor chip 3. Therefore, at the stage in which the flip-chip mounting of the sensor chip 3 is completed in step S4 and the sealing material 12*a* is cured, a part of the sealing material 12*a* may be present at a part of the region planarly overlapped with the second region 32 (the region where no bump electrode BP is arranged). Even in such a case, since the sealing material 12*a* is not present in most of the region where the wiring substrate 2 tends to be bent in step S4 (the region planarly overlapped with the second region 32), it is possible to achieve an effect of suppressing and preventing the unwanted flow of the sealing material 12*a* to suppress and prevent the attachment of the sealing material 12*a* onto the sensor surface SE of the sensor chip 3.

The sealing material 12*a* has a function to improve the mounting strength of the sensor chip 3. For the improvement of the mounting strength of the sensor chip 3 by the sealing material, it does not matter if the sealing material is not disposed in the space between the second region 32 on the front surface 3*a* of the sensor chip 3 (the region where no bump electrode BP is arranged) and the lower surface 2*b* of the wiring substrate 2. However, it is necessary to prevent the attachment of dust onto the sensor surface SE of the sensor chip 3 as much as possible.

Therefore, in the present embodiment, after the sensor chip 3 is flip-chip mounted on the wiring substrate 2 in step S4, the additional sealing material 12*b* is preferably supplied (injected) to the space between the lower surface 2*b* of the wiring substrate 2 and (the front surface 3*a* of) the sensor chip 3 in step S6. When the sealing material 12*b* is supplied in step S6, the sealing material 12*b* is supplied (injected) in a region planarly overlapped with the second region 32 (the region where no bump electrode BP is arranged) between the front surface 3*a* of the sensor chip 3 and the lower surface 2*b* of the wiring substrate 2, and then this sealing material 12*b* is cured in step S7.

By this means, between the outer peripheral portion of the front surface 3*a* of the sensor chip 3 and the lower surface 2*b* of the wiring substrate 2, the sealing material 12*a* is disposed in (to fill) the region where the bump electrodes BP are arranged (the region planarly overlapped with the first region 31), and the sealing material 12*b* is disposed in (to fill) the region where no bump electrode BP is arranged (the region planarly overlapped with the second region 32). More specifically, the space between the outer peripheral portion of the front surface 3*a* of the sensor chip 3 and the lower surface 2*b* of the wiring substrate 2 is sealed (bonded) by the sealing materials 12*a* and 12*b*. In a planar view, the region where the cured sealing materials 12*a* and 12*b* are disposed surrounds the opening OP1 on the lower surface 2*b* of the wiring substrate 2. Thus, it is possible to prevent a foreign substance (for example, dust) from the lower surface 2*b* side of the wiring substrate 2 from entering the sensor surface SE of the sensor chip 3 side from the space between (the outer peripheral portion of) the front surface 3*a* of the sensor chip 3 and the lower surface 2*b* of the wiring substrate 2 to be attached onto the sensor surface SE (the space is sealed by the sealing materials 12*a* and 12*b*). Therefore, the reliability of the manufactured camera module (solid-state image pickup device) can be more improved.

Also, in the present embodiment, the sealing material 12*b* is supplied and cured in steps S6 and S7, respectively, and the bending of the wiring substrate 2 due to the heating when the sealing material 12*b* is cured is suppressed or prevented based on the following two points (first and second points), thereby preventing the sealing material 12*b* from flowing out to be attached onto the sensor surface SE of the sensor chip 3.

That is, as the first point, after the resin cover (frame body) 5 is fixed onto the upper surface 2*a* of the wiring substrate 2 so as to cover the sensor surface SE of the sensor chip 3 exposed from the opening OP1 of the wiring substrate 2, the process of supplying the sealing material 12*b* in step S6 and the process of curing the sealing material 12*b* in step S7 are preformed. As the second point, the heating temperature for curing the sealing material 12*b* (that is, the heating temperature in step S7) is lower than the heating temperature for curing the sealing material 12*a* (that is, the heating temperature in step S4). By these first and second points, the bending of the wiring substrate 2 when the sealing material 12*b* is cured can be prevented. The reason therefor will be described below.

First, the above-mentioned first point will be described. In the present embodiment, the resin cover (frame body) 5 is bonded and fixed in step S5 onto the upper surface 2*a* of the wiring substrate 2 so as to cover the sensor surface SE of the sensor chip 3 exposed from the opening OP1 of the wiring substrate 2. When the electronic components 4 are mounted on the upper surface 2*a* of the wiring substrate 2, not only the sensor surface SE of the sensor chip 3 but also these electronic components 4 are preferably covered with this resin cover (frame body) 5. This resin cover (frame body) 5 has a function to protect the sensor surface SE of the sensor chip 3 exposed from the opening OP1 of the wiring substrate 2 and also protect the electronic components 4 mounted on the upper surface 2*a* of the wiring substrate 2. Further, after the resin cover (frame body) 5 is fixed onto the upper surface 2*a* of the wiring substrate 2 in step S5, the process of supplying the sealing material 12*b* is performed in step S6. Therefore, even if the wiring substrate 2 is heated when the sealing material 12*b* supplied (injected) in step S6 to the space between the lower surface 2*b* of the wiring substrate 2 and (the front surface 3*a* of) the sensor chip 3 is cured in step S7, the wiring substrate 2 in the region of mounting the sensor chip 3 and its adjacent region tends not to be bent because it is protected by the resin cover (frame body) 5. More specifically, in the process of curing the sealing material 12*b* in step S7, compared with the process of mounting the sensor chip 3 in step S4, the wiring substrate 2 in the region of mounting the sensor chip 3 and its adjacent region tends not to be bent because it is held by the resin cover (frame body) 5. Since the resin cover (frame body) 5 is fixed onto the upper surface 2*a* of the wiring substrate 2, the wiring substrate 2 tends not to be bent, and therefore, when the sealing material 12*b* is cured in step S7, it is possible to suppress or prevent the sealing material 12*b* from flowing out from the space between the second region 32 of the front surface 3*a* of the sensor chip 3 (the region where no bump electrode BP is arranged) and the lower surface 2b of the wiring substrate 2 to the surrounding portion to be attached onto the sensor surface SE of the sensor chip 3. On the other hand, since the sealing material 12a has been already cured before the sealing material 12b is cured in step S7 (that is, in step S4), the sealing material 12a does not flow out to be attached onto the sensor surface SE of the sensor chip 3 when the sealing material 12b is cured in step S7.

As described above, in the present embodiment, after the resin cover (frame body) 5 is fixed onto the upper surface 2a of the wiring substrate 2 in step S5, the process of supplying the sealing material 12b in step S6 and the process of curing the sealing material 12b in step S7 are performed, and therefore, it is possible to suppress or prevent the sealing material 12b from flowing out to be attached onto the sensor surface SE of the sensor chip 3 when the sealing material 12b is cured in step S7.

Next, the above-mentioned second point will be described. In the present embodiment, the heating temperature for curing the sealing material 12b (that is, the heating temperature in step S7) is lower than the heating temperature for curing the sealing material 12a (that is, the heating temperature in step S4). As the heating temperature of the wiring substrate 2 becomes higher, the amount of bending of the wiring substrate 2 tends to increase. Therefore, for the suppression of the amount of bending of the wiring substrate 2 due to the heating of the sealing material, the reduction of the heating temperature is effective. However, since the sensor chip 3 is heated such that the sensor chip 3 is flip-chip mounted (the bump electrodes BP are connected to the terminals 9) in step S4, the heating temperature is required to be increased to some extent in consideration of a heating temperature optimum for the flip-chip mounting in order to ensure the flip-chip connection of the sensor chip 3 (to reliably connect the bump electrodes BP to the terminals 9).

On the other hand, since the heating in step S7 is performed so as to cure the sealing material 12b (or to cure the adhesive 22 for bonding the resin cover 7 as well as the sealing material 12b), no consideration for the temperature optimum for the flip-chip mounting is required, and the heating temperature can be set at any temperature capable of curing the sealing material 12b. Thus, in the present embodiment, the heating temperature for curing the sealing material 12b (that is, the heating temperature in step S7) can be lower than the heating temperature for curing the sealing material 12a (that is, the heating temperature in step S4). Accordingly, in the process of curing the sealing material 12b in step S7, compared with the process of mounting the sensor chip 3 in step S4, the wiring substrate 2 tends not to be bent because of the low heating temperature. In the process of curing the sealing material 12b in step S7, the wiring substrate 2 tends not to be bent because of the low heating temperature, and therefore, it is possible to suppress or prevent the sealing material 12b from flowing out from the space between the second region 32 of the front surface 3a of the sensor chip 3 (the region where no bump electrode BP is arranged) and the lower surface 2b of the wiring substrate 2 to the peripheral portion to be attached onto the sensor surface SE of the sensor chip 3 when the sealing material 12b is cured in step S7. On the other hand, since the sealing material 12a has been already cured before the sealing material 12b is cured in step S7 (that is, in step S4), the sealing material 12a does not flow out to be attached onto the sensor surface SE of the sensor chip 3 when the sealing material 12b is cured in step S7. Furthermore, a sealing material having a curing temperature (heating temperature required for curing the sealing material) lower than that of the sealing material 12a supplied in step S3 is preferably used as the sealing material 12b supplied in step S6 such that the heating temperature for curing the sealing material 12b (that is, the heating temperature in step S7) is lower than the heating temperature for curing the sealing material 12a (that is, the heating temperature in step S4). More specifically, the curing temperature of the sealing material 12b supplied in step S6 (the heating temperature required for curing the sealing material 12b) is preferably lower than the curing temperature of the sealing material 12a supplied in step S3 (heating temperature required for curing the sealing material 12a).

By way of example, the heating temperature for curing the sealing material 12a (that is, the heating temperature in step S4) can be set at approximately 230° C., and the heating time thereof (the time for heating the sealing material 12a) can be set at approximately five seconds. On the other hand, the heating temperature for curing the sealing material 12b (that is, the heating temperature in step S7) can be set at approximately 80° C., and the heating time thereof (the time for heating the sealing material 12b) can be set at approximately 30 minutes.

As described above, in the present embodiment, the heating temperature for curing the sealing material 12b (that is, the heating temperature in step S7) is lower than the heating temperature for curing the sealing material 12a (that is, the heating temperature in step S4). Accordingly, it is possible to suppress or prevent the sealing material 12b from flowing out to be attached onto the sensor surface SE of the sensor chip 3 when the sealing material 12b is cured in step S7.

In the present embodiment, by controlling the region to which the sealing material 12a is supplied in step S3 in the above-described manner, it is possible to suppress or prevent the sealing material 12a from flowing out to be attached onto the sensor surface SE of the sensor chip 3 in step S4. Also, by satisfying the first and second points described above, it is possible to suppress or prevent the sealing material 12b from flowing out to be attached onto the sensor surface SE of the sensor chip 3 in step S7. Accordingly, it is possible to suppress or prevent a foreign substance such as the sealing materials 12a and 12b from being attached onto the sensor surface SE of the sensor chip 3. As a result, it is possible to improve the manufacturing yield of the camera modules (solid-state image pickup devices) and also improve the reliability of the manufactured camera module (solid-state image pickup device).

Furthermore, in the present embodiment, by satisfying both of the first and second points described above, it is possible to suppress or prevent the sealing material 12b from flowing out to be attached onto the sensor surface SE of the sensor chip 3 in step S7. However, although it is most preferable to satisfy both of the first and second points, even when only one of the first and second points is satisfied, the bending of the wiring substrate 2 by the heating at the time of curing the sealing material 12b can be suppressed compared with the case where neither the first nor second point is satisfied. Accordingly, it is possible to suppress the sealing material 12b from flowing out to be attached onto the sensor surface SE of the sensor chip 3. More specifically, although the effect of preventing the sealing material 12b from flowing out to be attached onto the sensor surface SE of the sensor chip 3 is maximum when both of the first and second points are satisfied, this effect can be achieved even when only one of these first and second points is satisfied.

Figure 46:
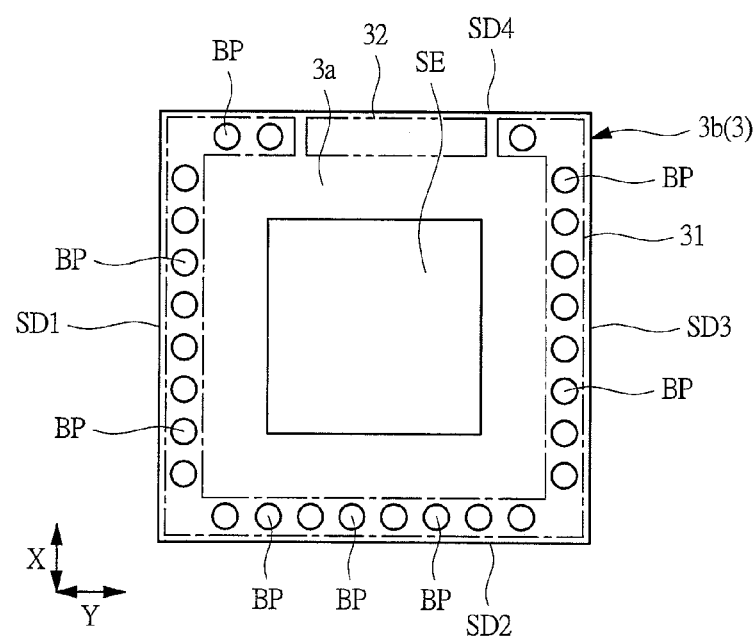
FIG. 46 is a plan view depicting a modification example of the sensor chip.

FIG. 46 is a plan view (top view) depicting a modification example of the sensor chip 3, and it shows the front surface 3a of the sensor chip 3 and corresponds to FIG. 39. Similar to FIG. 39, the first region 31 is represented by a one-dot chain line and the second region 32 is represented by a two-dot chain line in FIG. 46. Hereinafter, the sensor chip 3 in the modification example depicted in FIG. 46 is referred to as a sensor chip 3b.

In the sensor chip 3 depicted in FIG. 39 and the sensor chip 3b depicted in FIG. 46, on the front surface 3a of the sensor chips 3 and 3b, the bump electrodes BP are not arranged at equal pitches (equally) along the entire four sides of the outer periphery, and the outer peripheral portion (surrounding portion) of the front surface 3a includes the first region 31 where the bump electrodes BP are arranged and the second region 32 where no bump electrode BP is arranged.

However, in the case of the sensor chip 3 depicted in FIG. 39, among the sides SD1, SD2, SD3 and SD4 of the front surface 3a of the sensor chip 3, the bump electrodes BP are arranged along the sides SD1, SD2 and SD3, but no bump electrode BP is arranged along the side SD4. Therefore, in the outer peripheral portion of the front surface 3a of the sensor chip 3, a region along the sides SD1, SD2 and SD3 corresponds to the first region 31, and a region along the side SD4 corresponds to the second region 32. Meanwhile, in the case of the sensor chip 3b depicted in FIG. 46, among the sides SD1, SD2, SD3 and SD4 of the front surface 3a of the sensor chip 3b, the bump electrodes BP are arranged along the sides SD1, SD2 and SD3, and there are portions where the bump electrodes BP are arranged (end regions on the side SD4) and a portion where no bump electrode BP is arranged (center region on the side SD4) along the side SD4. Therefore, in the case of the sensor chip 3b depicted in FIG. 46, in the outer peripheral portion of the front surface 3a of the sensor chip 3b, the entire region along the sides SD1, SD2 and SD3 and parts of the region along the side SD4 (end regions) correspond to the first region 31, and the other portion of the region along the side SD4 (center region) corresponds to the second region 32.

This sensor chip 3b can also be used in the manufacturing process of the camera module MJ1 according to the present embodiment.

Figure 47:
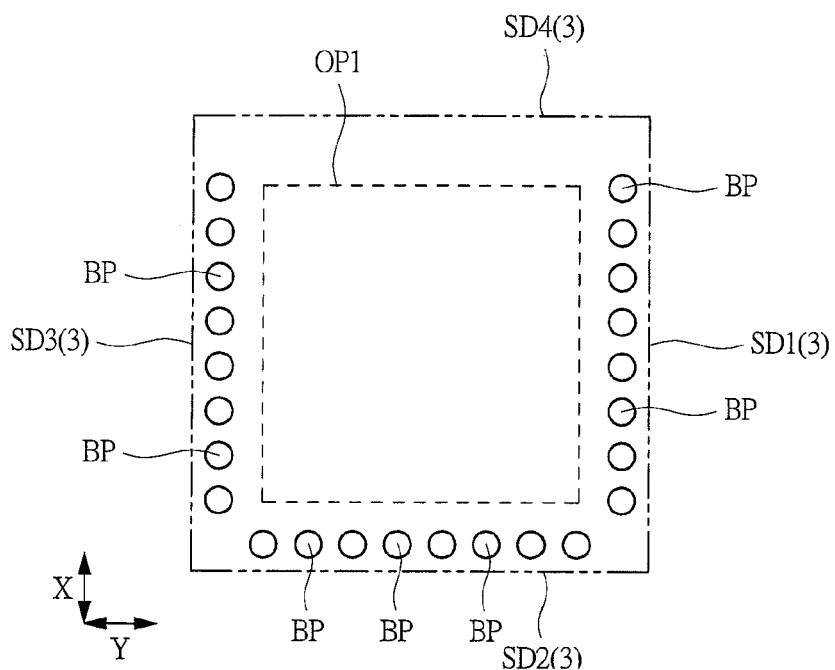
FIG. 47 is an explanatory diagram of a supply region of the sealing material when the sensor chip depicted in FIG. 39 is used.
Figure 48:
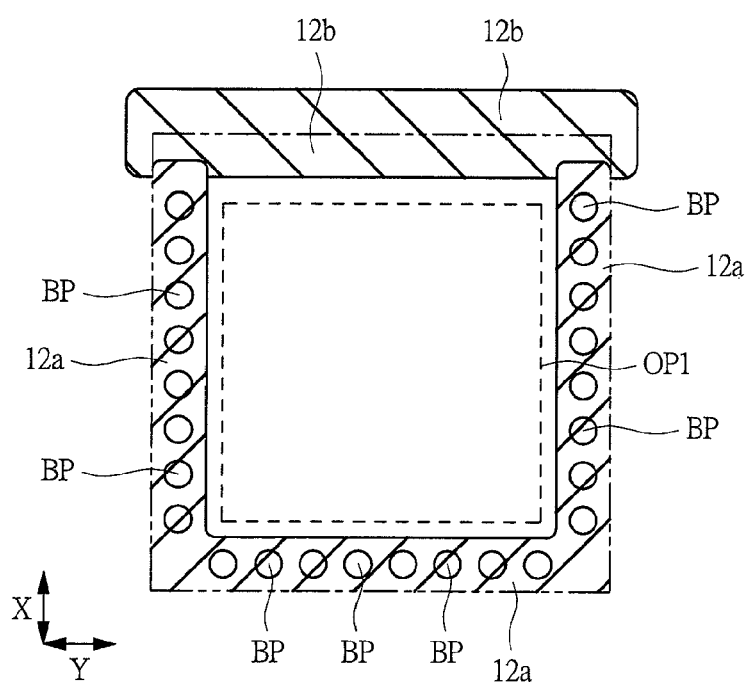
FIG. 48 is an explanatory diagram of a supply region of the sealing material when the sensor chip depicted in FIG. 39 is used.
Figure 49:
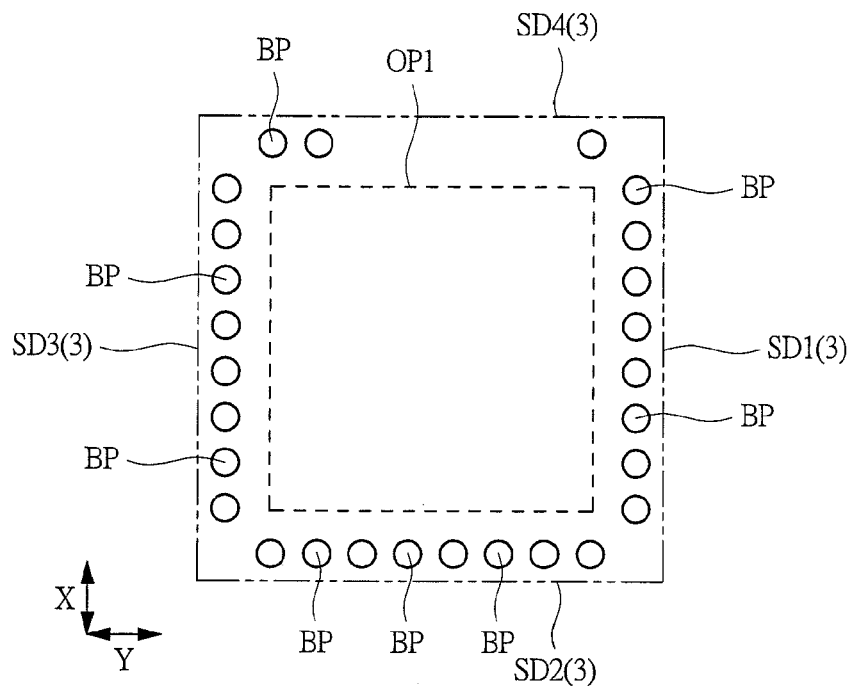
FIG. 49 is an explanatory diagram of a supply region of the sealing material when the sensor chip depicted in FIG. 46 is used.
Figure 50:
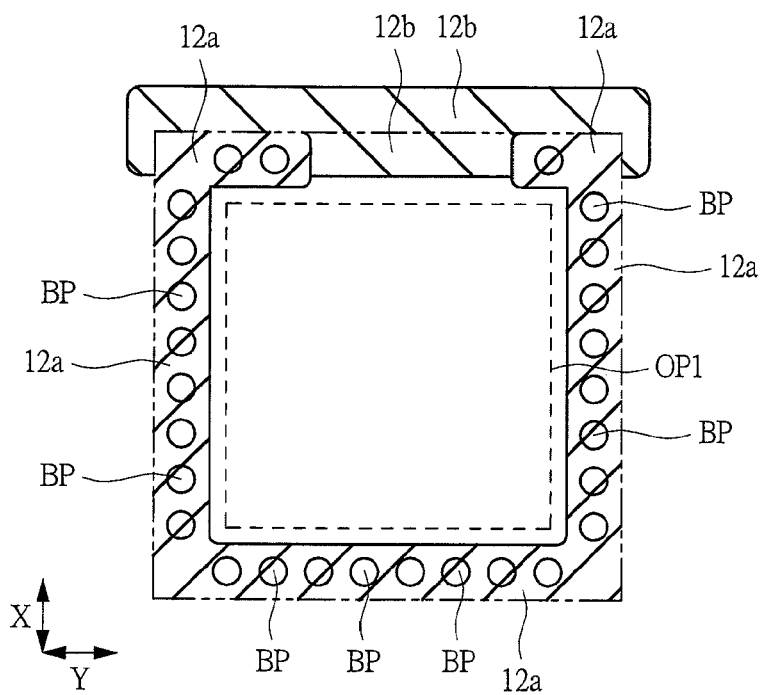
FIG. 50 is an explanatory diagram of a supply region of the sealing material when the sensor chip depicted in FIG. 46 is used.

FIGS. 47 and 48 are explanatory diagrams (plan views) of a region where the sealing materials 12a and 12b are supplied when the sensor chip 3 depicted in FIG. 39 is used. FIGS. 49 and 50 are explanatory diagrams (plan views) of a region where the sealing materials 12a and 12b are supplied when the sensor chip 3b depicted in FIG. 46 is used. In FIG. 47, an outer shape of the sensor chip 3 when the sensor chip 3 of FIG. 39 is flip-chip mounted on the lower surface 2b of the wiring substrate 2 is represented by a two-dot chain line, the opening OP1 of the wiring substrate 2 is represented by a dotted line, and the bump electrodes BP are represented by solid lines. In FIG. 48, a planar region where the sealing material 12a is supplied and a planar region where the sealing material 12b is supplied in FIG. 47 are hatched. In FIG. 49, an outer shape of the sensor chip 3b when the sensor chip 3b of FIG. 46 is flip-chip mounted on the lower surface 2b of the wiring substrate 2 is represented by a two-dot chain line, the opening OP1 of the wiring substrate 2 is represented by a dotted line, and the bump electrodes BP are represented by solid lines. In FIG. 50, a planar region where the sealing material 12a is supplied and a planar region where the sealing material 12b is supplied in FIG. 49 are hatched.

In the present embodiment, even if either one of the sensor chip 3 of FIG. 39 and the sensor chip 3b of FIG. 46 is used, when the sealing material 12a is supplied in step S3 to the lower surface 2b of the wiring substrate 2, the sealing material 12a is supplied to a region planarly overlapped with the first region 31 (the region where the bump electrodes BP are arranged) when the sensor chip 3 is mounted later in step S4 and the sealing material 12a is not supplied to a region planarly overlapped with the second region 32 (the region where no bump electrode BP is arranged). Then, when the sealing material 12b is supplied in step S6, the sealing material 12b is supplied (injected) to the region planarly overlapped with the second region 32 (the region where no bump electrode BP is arranged) between the front surface 3a of the sensor chip 3 and the lower surface 2b of the wiring substrate 2.

Therefore, when the sensor chip 3 of FIG. 39 is used, as is evident from FIGS. 47 and 48, the sealing material 12a is supplied to a region along the sides SD1, SD2 and SD3 of the sensor chip 3 between the front surface 3a of the sensor chip 3 and the lower surface 2b of the wiring substrate 2, and the sealing material 12b is supplied to a region along the side SD4.

On the other hand, when the sensor chip 3b of FIG. 46 is used, as is evident from FIGS. 49 and 50, the sealing material 12a is supplied to a region along the sides SD1, SD2 and SD3 of the sensor chip 3 between the front surface 3a of the sensor chip 3 and the lower surface 2b of the wiring substrate 2. Also, in the region along the side SD4, the sealing material 12a is supplied to the portions where the bump electrodes BP are disposed (arranged) (end regions on the side SD4), and the sealing material 12b is supplied to the portion where no bump electrode BP is disposed (arranged) (center region on the side SD4). In this manner, even when the sensor chip 3b of FIG. 46 is used, the above-described effect of suppressing or preventing a foreign substance such as the sealing materials 12a and 12b from being attached onto the sensor surface SE of the sensor chip 3b can be achieved. Therefore, it is possible to improve the manufacturing yield of the camera modules (solid-state image pickup devices) and also achieve the effect of improving the reliability of the manufactured camera module (solid-state image pickup device).

Also, the present embodiment can be applied to still another modification example of the sensor chip 3, in which the bump electrodes BP are arranged along two sides facing each other among the four sides (sides SD1, SD2, SD3 and SD4) of the front surface 3a of the sensor chip 3 and no bump electrode BP is arranged along the other two sides. More specifically, the present embodiment can be applied also to the case where the bump electrodes BP are arranged along the sides SD1 and SD3 and no bump electrode BP is arranged along the sides SD2 and SD4 on the front surface 3a of the sensor chip 3 and the case where the bump electrodes BP are arranged along the sides SD2 and SD4 and no bump electrode BP is arranged along the sides SD1 and SD3 on the front surface 3a of the sensor chip 3. In this case, when the bump electrodes BP are arranged along the sides SD1 and SD3 but no bump electrode BP is arranged along the sides SD2 and SD4 on the front surface 3a of the sensor chip 3, regions in the outer peripheral portion of the front surface 3a of the sensor chip 3 along the sides SD1 and SD3 correspond to the first region 31, and the regions therein along the sides SD2 and SD4 correspond to the second region 32. Also, when the bump electrodes BP are arranged along the sides SD2 and SD4 but no bump electrode BP is arranged along the sides SD1 and SD3 on the front surface 3a of the sensor chip 3, regions in the outer peripheral portion of the front surface 3a of the sensor chip 3 along the sides SD2 and SD4 correspond to the first region 31, and the regions therein along the sides SD1 and SD3 correspond to the second region 32.

Therefore, in the present embodiment, it is possible to use the sensor chip 3 in which no bump electrode BP is formed (arranged) along at least one of the four sides (SD1, SD2, SD3 and SD4) of a rectangle forming the front surface 3a and the bump electrodes BP are formed (arranged) along the other sides on the front surface 3a of the sensor chip 3. In this case, the second region 32 corresponds to a region along at least one side (the side SD4 in the case of FIG. 39) where no bump electrode BP is formed, and the first region 31 corresponds to a region along the other sides (the sides SD1, SD2 and SD3 in the case of FIG. 39) where the bump electrodes BP are formed.

Also, in the present embodiment, it is possible to use the sensor chip 3 in which the first region 31 where the bump electrodes BP are formed (arranged) and the second region 32 where no bump electrode BP is formed (arranged) are present along at least one (the side SD4 in the case of FIG. 46) of the four sides (SD1, SD2, SD3 and SD4) of a rectangle forming the front surface 3a of the sensor chip 3.

Furthermore, in the present embodiment, the sealing material 12a is supplied (applied) onto the lower surface 2b of the wiring substrate 2 in step S3. In another embodiment, the sealing material 12a can be supplied (applied) onto the front surface 3a of the sensor chip 3 instead of the wiring substrate side. In this case, in the outer peripheral portion (surrounding portion) of the front surface 3a of the sensor chip 3, the sealing material 12a is supplied (applied) onto the first region 31 (the region where the bump electrodes BP are arranged) and the sealing material 12a is not supplied (applied) onto the second region 32 (the region where no bump electrode BP is arranged). At this time, the sealing material 12a is prevented from being attached onto the sensor surface SE of the sensor chip 3. The sensor chip 3 to which the sealing material 12a is supplied (applied) in the above-described manner is flip-chip mounted in step S4 on the lower surface 2b of the wiring substrate 2. Even in this case, the effect of suppressing or preventing a foreign substance such as the sealing materials 12a and 12b from being attached onto the sensor surface SE of the sensor chip 3 due to the bending of the wiring substrate 2 can be achieved. However, the case where the sealing material 12a is supplied (applied) onto the lower surface 2b side of the wiring substrate 2 like in the present embodiment is more preferable than the case where the sealing material 12a is supplied (applied) onto the front surface 3a side of the sensor chip 3 because the attachment of the sealing material 12a onto the sensor surface SE of the sensor chip 3 when supplying (applying) the sealing material 12a in step S3 can be prevented more reliably.

Second Embodiment

A manufacturing process of a solid-state image pickup device (here, the camera module MJ1) according to the second embodiment will be described.

Figure 51:
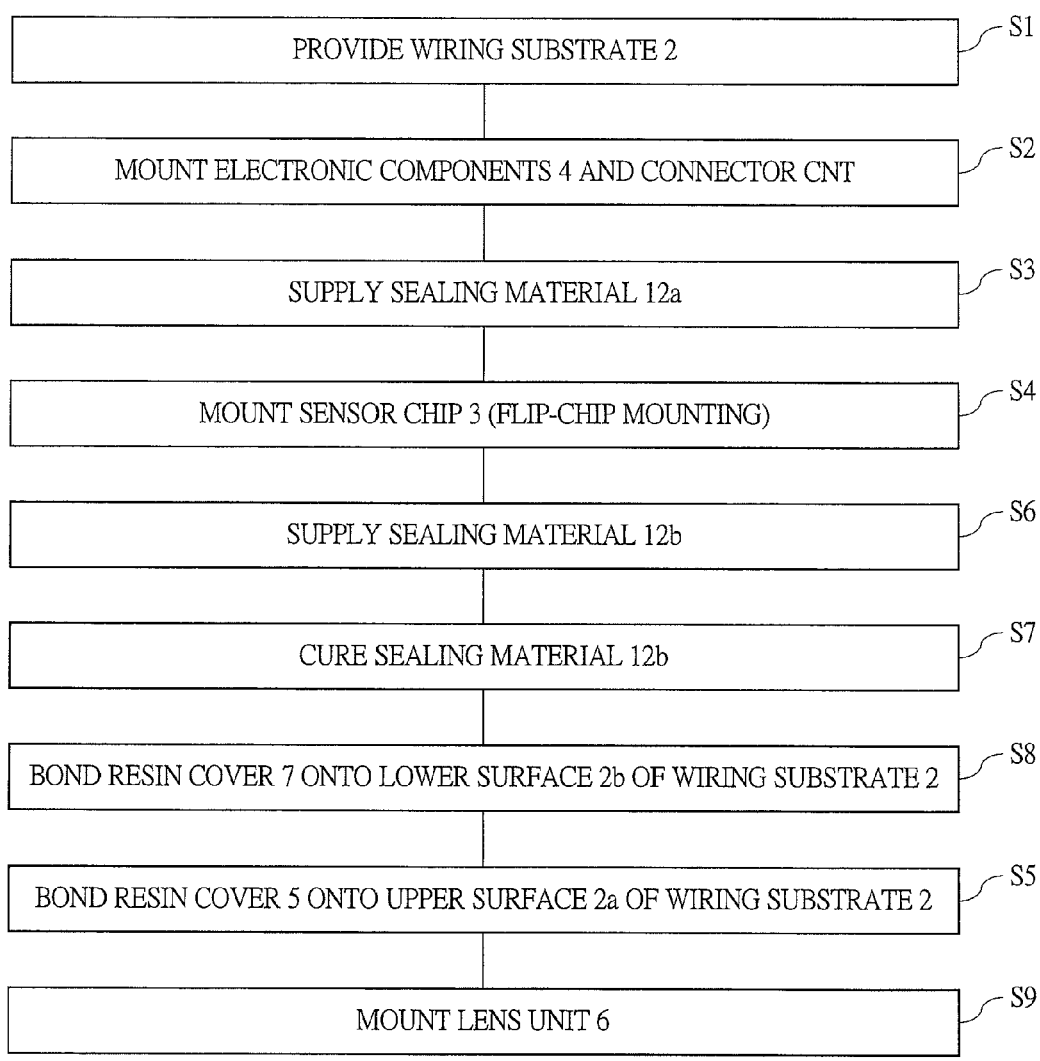
FIG. 51 is a manufacturing process flow diagram showing the manufacturing process of the camera module according to another embodiment of the present invention.

FIG. 51 is a manufacturing process flow diagram showing the manufacturing process of the solid-state image pickup device, here, the camera module MJ1 according to the present embodiment.

Since the manufacturing process of the camera module MJ1 (solid-state image pickup device) according to the present embodiment is similar to that in the first embodiment up to step S4 (the process of mounting the sensor chip 3), the description thereof is not omitted here, and the processes subsequent to step S4 will be described.

Figure 52:
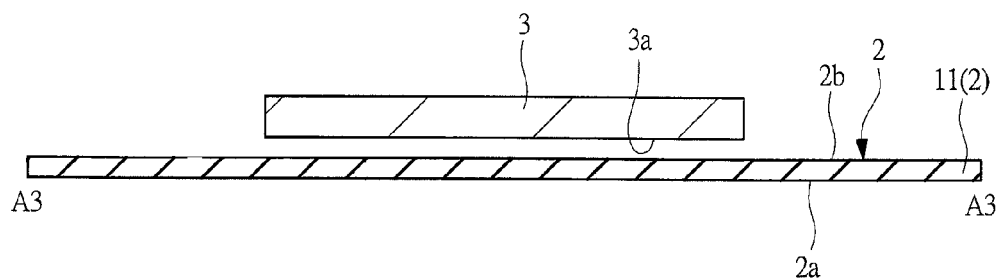
FIG. 52 is a cross-sectional view in a manufacturing process of the camera module according to the embodiment of the present invention.

After performing the processes up to step S4 (the process of mounting the sensor chip 3) in the same manner as that of the first embodiment, instead of the process of bonding the resin cover 5 in step S5 performed in the first embodiment, the process of supplying the sealing material 12b in step S6 is performed in the present embodiment without performing the process of bonding the resin cover 5 in step S5. FIG. 52 (A3-A3 section) and FIG. 53 (A3-A3 section) are cross-sectional views (A3-A3 sections) corresponding to FIG. 33 and FIG. 34, respectively. FIG. 52 depicts a stage (state) before the sealing material 12b is supplied in step S6, and FIG. 53 depicts a stage (state) after the sealing material 12b is supplied in step S6.

Figure 53:
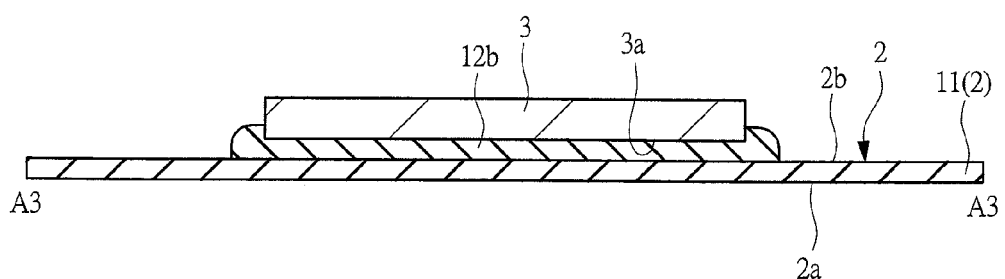
FIG. 53 is a cross-sectional view in the manufacturing process of the camera module subsequent to FIG. 52.

As is evident from FIGS. 52 and 53, the process of supplying the sealing material 12b in step S6 in the present embodiment is performed in the state where the resin cover 5 is not mounted on the upper surface 2a of the wiring substrate 2. Other than that, however, the process is approximately the same as the process of supplying the sealing material 12b in step S6 in the first embodiment, and therefore, its specific description is omitted here.

In the present embodiment, after the process of supplying the sealing material 12b in step S6, the process of curing the sealing material 12b in step S7 is performed in the same manner as the first embodiment.

The process of curing the sealing material 12b in step S7 in the present embodiment is approximately the same as the process of curing the sealing material 12b in step S7 in the first embodiment except that the process is performed in the state where the resin cover 5 is not mounted on the upper surface 2a of the wiring substrate 2, and therefore, its specific description is omitted here.

Figure 54:
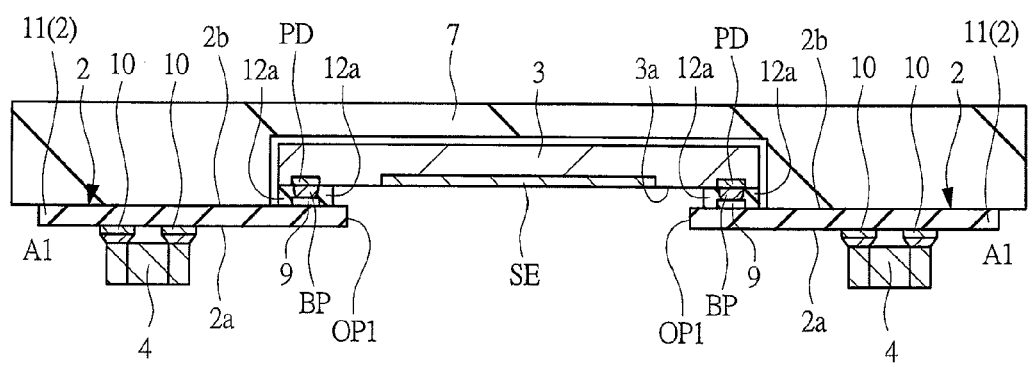
FIG. 54 is a cross-sectional view in the manufacturing process of the camera module subsequent to FIG. 53.

In the present embodiment, after the process of curing the sealing material 12b in step S7, the process of bonding the resin cover 7 in step S8 is performed in the same manner as the first embodiment. FIG. 54 (A1-A1 section) is a cross-sectional view (A1-A1 section) corresponding to FIG. 38. FIG. 54 depicts a stage (state) where the resin cover 7 is mounted on the lower surface 2b of the wiring substrate 2 in step S8.

As is evident from FIG. 54, the process of bonding the resin cover 7 in step S8 in the present embodiment is performed in the state where the resin cover 5 is not mounted on the upper surface 2a of the wiring substrate 2. Other than that, however, the process is approximately the same as the process of bonding the resin cover 7 in step S8 in the first embodiment, and therefore, its specific description is omitted here.

Figure 55:
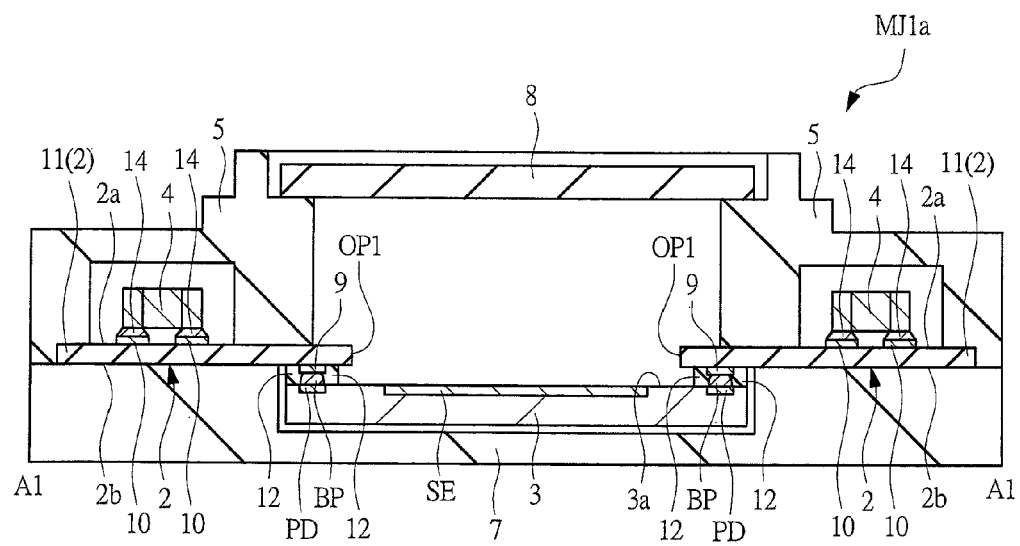
FIG. 55 is a cross-sectional view in the manufacturing process of the camera module subsequent to FIG. 54.

In the present embodiment, after the process of bonding the resin cover 7 in step S8, the process of boding the resin cover 5 in step S5 is performed. FIG. 55 (A1-A1 section) depicts the same cross-sectional region (A1-A1 section) as that of FIG. 54. FIG. 55 depicts a stage (state) where the resin cover 5 is bonded onto the upper surface 2a of the wiring substrate 2 in step S5.

As is evident from FIG. 55, in the present embodiment, the process of bonding the resin cover 5 in step S5 is performed after performing steps S6 to S8 (supplying and curing the sealing material 12b and bonding the resin cover 7 onto the lower surface 2b of the wiring substrate 2). Other than that, however, the process is approximately the same as the process of bonding the resin cover 5 in step S5 in the first embodiment, and therefore, its specific description is omitted here.

In the present embodiment, after the process of bonding the resin cover 5 in step S5, the process of mounting the lens unit 6 in step S9 is performed.

The process of mounting the lens unit 6 in step S9 in the present embodiment is approximately the same as the process of mounting the lens unit 6 in step S9 in the first embodiment, and therefore, its specific description is omitted here.

In this manner, the camera module MJ1 of the present embodiment is manufactured (assembled). The structure of the manufactured camera module MJ1 is similar to that of the first embodiment, and therefore, its description is omitted here.

Next, features of the second embodiment will be described in more detail.

In the present embodiment, unlike the first embodiment, the process of supplying the sealing material 12b in step S6 and the process of curing the sealing material 12b in step S7 are performed before the resin cover (frame body) 5 is fixed in step S5 onto the upper surface 2a of the wiring substrate 2 so as to cover the sensor surface SE of the sensor chip 3 exposed from the opening OP1 of the wiring substrate 2. More specifically, in the present embodiment, the first point described in the first embodiment above is not satisfied.

However, in the present embodiment, the heating temperature for curing the sealing material 12b (that is, the heating temperature in step S7) is lower than the heating temperature for curing the sealing material 12a (that is, the heating temperature in step S4). In other words, the second point described in the first embodiment above is satisfied. Accordingly, as described also in the first embodiment, in the process of curing the sealing material 12b in step S7, the wiring substrate 2 tends not to be bent because of a low heating temperature, compared with the process of mounting the sensor chip 3 in step S4. Therefore, it is possible to suppress or prevent the sealing material 12b from flowing out to be attached onto the sensor surface SE of the sensor chip 3 when the sealing material 12b is cured in step S7.

Therefore, in the present embodiment, by controlling the region to which the sealing material 12a is supplied in step S3 in the manner as described in the first embodiment, it is possible to suppress or prevent the sealing material 12a from flowing out to be attached onto the sensor surface SE of the sensor chip 3 in step S4. Also, by satisfying the second point described above, it is possible to suppress or prevent the sealing material 12b from flowing out to be attached onto the sensor surface SE of the sensor chip 3 in step S7. Accordingly, it is possible to suppress or prevent a foreign substance such as the sealing materials 12a and 12b from being attached onto the sensor surface SE of the sensor chip 3. As a result, it is possible to improve the manufacturing yield of the camera modules (solid-state image pickup devices) and also improve the reliability of the manufactured camera module (solid-state image pickup device).

Figure 56:
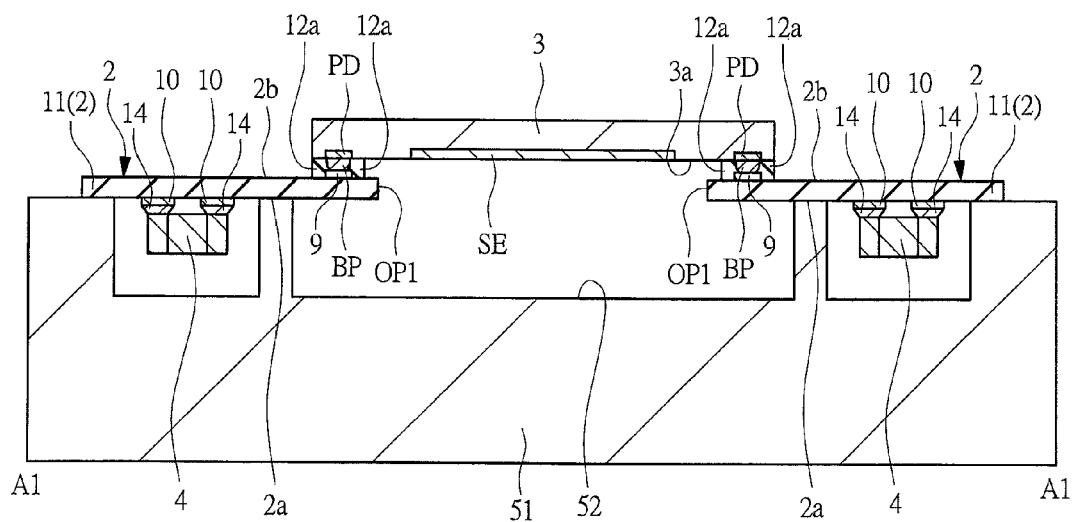
FIG. 56 is an explanatory diagram of a heating process.
Figure 57:
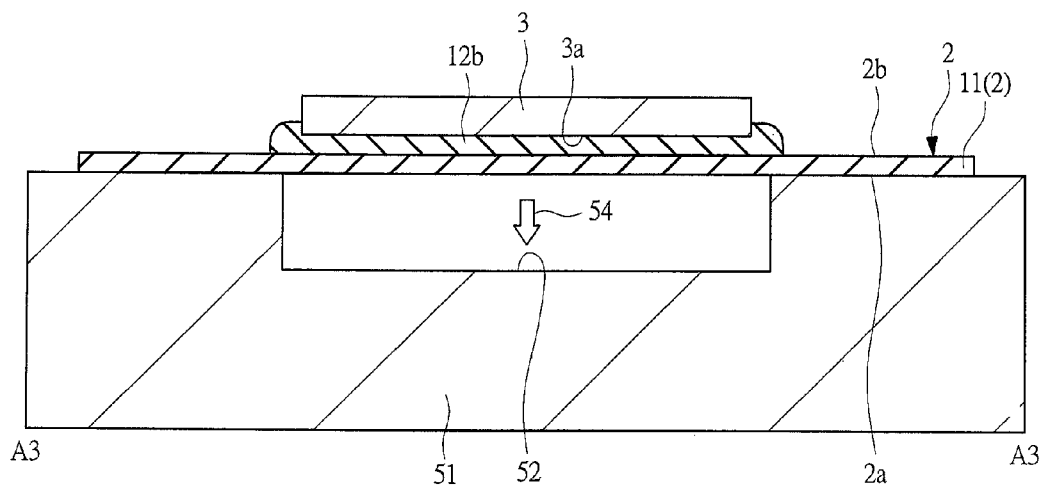
FIG. 57 is an explanatory diagram of the heating process.

Furthermore, in the present embodiment, the processes of supplying and curing the sealing material 12b in steps S6 and S7 are preformed before the process of bonding the resin cover 5 in step S5. Therefore, the heating for curing the sealing material 12b in step S7 is performed in the state where the wiring substrate 2 is not held by the resin cover 5. Thus, in the present embodiment, the heating for curing the sealing material 12b in step S7 is preferably performed in a manner as described below. FIGS. 56 and 57 are explanatory diagrams (cross-sectional views) of the heating process (the process of curing the sealing material 12b) in the present embodiment. FIG. 56 corresponds to a cross-sectional view at the position along the line A1-A1, and FIG. 57 corresponds to a cross-sectional view at the position along the line A3-A3.

More specifically, in the process of curing the sealing material 12b in step S7, as depicted in FIGS. 56 and 57, the wiring substrate 2 on which the sensor chip 3 is flip-chip mounted is disposed on a heating stage (heating stand or heating jig) 51. Then, the wiring substrate 2 disposed on the stage 51 is heated together with the sealing material 12b, thereby curing the sealing material 12b. The heating of the wiring substrate 2 (and the sealing material 12b) can be performed by, for example, passing the wiring substrate 2 on which the sensor chip 3 is flip-chip mounted through a heating furnace for each stage 51 or by providing (incorporating) a heating mechanism to the stage 51 itself to heat the stage 51.

Here, the wiring substrate 2 on which the sensor chip 3 is flip-chip mounted is disposed on the stage 51 such that the lower surface 2b side of the wiring substrate 2 faces upward and the upper surface 2a side of the wiring substrate 2 faces the stage 51. At this time, it is preferable that the upper surface 2a of the chip-mounting region (the region where the sensor chip 3 is mounted) of the wiring substrate 2 is not held by the stage 51 (not in contact with the stage 51) as depicted in FIGS. 56 and 57. This can be achieved by providing an indentation (concave portion) 52 on the upper surface of the stage 51 in advance and disposing the wiring substrate 2 (wiring substrate 2 on which the sensor chip 3 is flip-chip mounted) on the stage 51 such that the chip-mounting region (the region where the sensor chip 3 is mounted) of the wiring substrate 2 is positioned on this indentation 52. Also, as depicted in FIG. 56, when the wiring substrate 2 is disposed on the stage 51, the electronic components 4 mounted on the upper surface 2a of the wiring substrate 2 are disposed in other indentations (concave portions) 53 of the stage 51, thereby preventing the electronic components 4 from obstructing the wiring substrate 2 to be disposed on the stage 51.

When the heating for curing the sealing material 12b is performed in the state where the upper surface 2a of the chip-mounting region of the wiring substrate 2 is held by the stage 51 (in contact with the stage 51) unlike the case of FIGS. 56 and 57, the bending of the wiring substrate 2 by this heating in a direction in which the distance (space) between the wiring substrate 2 and the sensor chip 3 is expanded (direction indicated by an arrow 54 in FIG. 57) is regulated (limited) by the stage 51. Therefore, the wiring substrate 2 tends to be bent in a direction in which the distance (space) is shortened (direction opposed to the arrow 54 in FIG. 57).

However, when the state where the upper surface 2a of the chip-mounting region (the region where the sensor chip 3 is mounted) of the wiring substrate 2 is not held by the stage 51 (not in contact with the stage 51) is achieved as depicted in FIGS. 56 and 57, the bending of the wiring substrate 2 in the direction in which the distance (space) between the wiring substrate 2 and the sensor chip 3 is expanded (direction indicated by the arrow 54 in FIG. 57) is not regulated (limited) by the stage 51. More specifically, even when the wiring substrate 2 is bent due to heating, the wiring substrate can be bent also in the direction in which the distance (space) between the wiring substrate 2 and the sensor chip 3 is expanded (direction indicated by the arrow 54 in FIG. 57).

Thus, by performing the heating for curing the sealing material 12b in the state where the upper surface 2a of the chip-mounting region of the wiring substrate 2 is not held by the stage 51 (not in contact with the stage 51) as depicted in FIGS. 56 and 57, the probability of bending of the wiring substrate 2 in the direction in which the distance (space) between the wiring substrate 2 and the sensor chip 3 is shortened (direction opposed to the arrow 54 in FIG. 57) can be reduced.

The problem that the sealing material 12b is pushed to flow out due to the bending of the wiring substrate 2 (and the sealing material 12b is attached onto the sensor surface SE) occurs when the wiring substrate 2 is bent in the direction in which the distance (space) between the wiring substrate 2 and the sensor chip 3 is shortened (direction opposed to the arrow 54 in FIG. 57), and it does not occur when the wiring substrate 2 is bent in the direction in which the distance (space) between the wiring substrate 2 and the sensor chip 3 is expanded (direction of the arrow 54 in FIG. 57). In the present embodiment, the probability that the wiring substrate 2 is bent in the direction in which the distance (space) between the wiring substrate 2 and the sensor chip 3 is shortened (direction opposed to the arrow 54 in FIG. 57) when the heating for curing the sealing material 12b is performed can be reduced, and it is therefore possible to further suppress the sealing material 12b from flowing out to be attached onto the sensor surface SE of the sensor chip 3 in step S7.

Third Embodiment

Figure 58:
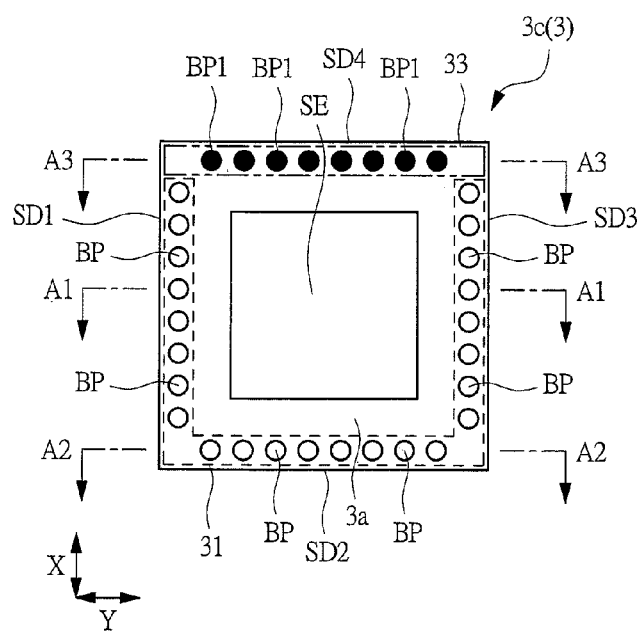
FIG. 58 is a plan view of a sensor chip for use in another embodiment of the present invention.

FIG. 58 is a plan view of the sensor chip 3 for use in a third embodiment, and it depicts the front surface 3a of the sensor chip 3 and corresponds to FIG. 24. For easy understanding, one-dot chain lines representing the positions of the line A1-A1, the line A2-A2 and the line A3-A3 are shown also in FIG. 58 at the positions where the sensor chip 3 of FIG. 58 overlays these lines when it is flip-chip mounted on the lower surface 2b of the wiring substrate 2. Furthermore, in FIG. 58, the bump electrodes BP are represented by hollow circles, and dummy bump electrodes BP1 are represented by black circles. Still further, in FIG. 58, the first region 31 where the bump electrodes BP are arranged is represented by a dotted line, and a third region 33 where the dummy bump electrodes BP1 are arranged is represented by a two-dot chain line. Note that the sensor chip 3 according to the present embodiment depicted in FIG. 58 is hereinafter referred to as a sensor chip 3c.

In the sensor chip 3 for use in the first and second embodiments, the bump electrodes BP are not arranged at equal pitches (equally) along the entire four sides of the outer periphery on the front surface 3a of the sensor chip 3, and the sensor chip 3 includes the first region 31 where the bump electrodes BP are arranged and the second region 32 where no bump electrode BP is arranged in the outer peripheral portion (surrounding portion) of the front surface 3a. For example, as depicted in FIGS. 24 and 39, the bump electrodes BP are arranged along the sides SD1, SD2 and SD3 among the sides SD1, SD2, SD3 and SD4 of the front surface 3a of the sensor chip 3, and no bump electrode BP is arranged along the side SD4.

Meanwhile, in the sensor chip 3c for use in the present embodiment, the bump electrodes BP arranged in the first region 31 remain unchanged from those of the sensor chip 3 for use in the first and second embodiments, and the dummy bump electrodes BP1 are arranged in the second region 32. Therefore, the sensor chip 3c for use in the present embodiment includes the first region 31 where the bump electrodes BP are arranged and the third region 33 where the dummy bump electrodes BP1 are arranged in the outer peripheral portion (surrounding portion) of the front surface 3a, and this third region 33 corresponds to the second region 32 in the first and second embodiments. Here, although the position of disposing the second region 32 on the front surface 3a of the sensor chip 3 in the first and second embodiments and the position of disposing the third region 33 on the front surface 3a of the sensor chip 3c in the present embodiment are the same, the second region 32 does not have any bump electrode BP or dummy bump electrode BP1 arranged therein, and the third region 33 has the dummy bump electrodes BP1 arranged therein.

Therefore, in the sensor chip 3c for use in the present embodiment, the bump electrodes BP and BP1 are arranged at equal pitches (equally) along the entire four sides of the outer periphery (that is, the sides SD1, SD2, SD3 and SD4) on the front surface 3a of the sensor chip 3c. For example, as depicted in FIG. 58, the bump electrodes BP are arranged along the sides SD1, SD2 and SD3 among the sides SD1, SD2, SD3 and SD4 of the front surface 3a of the sensor chip 3c, and the dummy bump electrodes BP1 are arranged along the side SD4.

Each of the bump electrodes BP is an electrically required bump electrode and is electrically connected to a circuit (semiconductor integrated circuit) formed in the sensor chip 3c. On the other hand, the dummy bump electrodes BP1 are bump electrodes not electrically required (that is, they are electrically unnecessary bump electrodes) and are provided so as to keep a constant distance (space) between the wiring substrate 2 (2d) and the sensor chip 3c. Therefore, the dummy bump electrodes BP1 are not always required to be electrically connected to the circuit (semiconductor integrated circuit) formed in the sensor chip 3c. In the camera module MJ1, no signal (electrical signal) is input to or output from the dummy bump electrodes BP1 of the sensor chip 3c. In the sensor chip 3c, the dummy bump electrodes BP1 can be formed in the same method as that of the bump electrodes BP. Other than that the dummy bump electrodes BP1 are provided, the sensor chip 3c for use in the present embodiment has approximately the same structure as that of the sensor chip 3 for use in the first embodiment.

Figure 59:
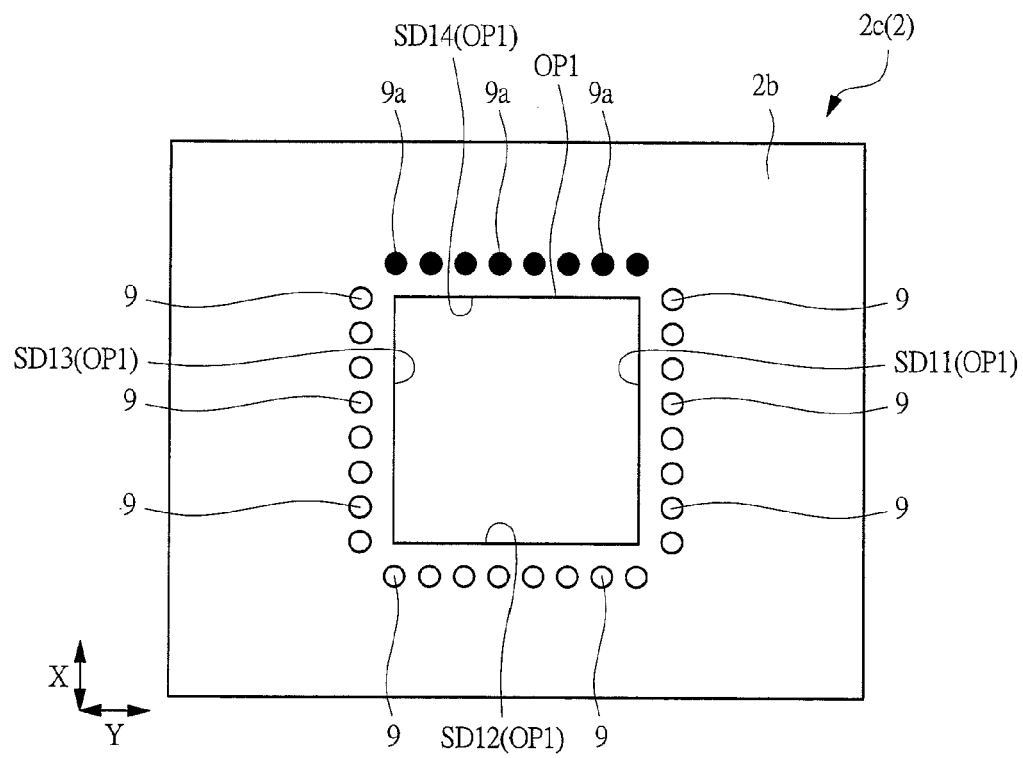
FIG. 59 is a plan view of principal parts of a wiring substrate for use in the other embodiment of the present invention.

FIG. 59 is a plan view of principal parts (partially enlarged bottom view) of the wiring substrate 2 for use in the present embodiment, and it depicts the lower surface 2b side of the wiring substrate 2 and corresponds to FIG. 12 in the first embodiment. In FIG. 59, the terminals 9 to which the bump electrodes BP are connected are represented by hollow circles, and terminals 9a to which the dummy bump electrodes BP1 are connected are represented by black circles. Hereinafter, the wiring substrate 2 in the present embodiment depicted in FIG. 59 is referred to as a wiring substrate 2c.

As depicted in FIG. 59, on the lower surface 2b of the wiring substrate 2c, the terminals (bonding leads, electrodes, or conductive lands) 9 and 9a for connecting the bump electrodes BP and BP1 of the sensor chip 3c when the sensor chip 3c is mounted are disposed at the positions corresponding to the bump electrodes BP and BP1 of the sensor chip 3c. Among these terminals 9 and 9a, the terminals 9 are the terminals for connecting the bump electrodes BP of the sensor chip 3c, and the terminals 9a are the terminals for connecting the dummy bump electrodes BP1 of the sensor chip 3c. In the wiring substrate 2c, the terminals 9 are electrically necessary terminals and are electrically connected to (the terminals 13 connected to) the connector CNT and (the terminals 10 connected to) the electronic components 4 through the wiring patterns (and vias) of the wiring substrate 2c. On the other hand, the terminals 9a are not electrically necessary terminals and are provided to connect the dummy bump electrodes BP1, and are not electrically connected to (the terminals 13 connected to) the connector CNT and (the terminals 10 connected to) the electronic components 4. Therefore, each terminal 9a is an isolated pattern not connected to any wiring pattern of the wiring substrate 2c. Thus, the terminals 9a can be regarded as dummy terminals (which are provided to connect the dummy bump electrodes BP1 but are not electrically necessary terminals). Other than that the terminals 9a are provided, the wiring substrate 2c for use in the present embodiment has approximately the same structure as that of the wiring substrate 2 for use in the first embodiment.

Also, the camera module MJ1 in the present embodiment has approximately the same structure as that of the camera module MJ1 in the first embodiment except the arrangement of the bump electrodes BP and BP1 in the sensor chip 3c (3) and the arrangement of the terminals 9 and 9a in the wiring substrate 2c (2), and therefore, its description is omitted here.

The manufacturing process of the camera module MJ1 in the present embodiment can be performed in the following manner.

First, the processes up to step S2 (the process of mounting the electronic components 4) are performed in the same manner as that in the first embodiment. Then, the process of supplying the sealing material 12a in step S3 is performed. The differences between the present embodiment and the first embodiment will be described below.

Figure 60:
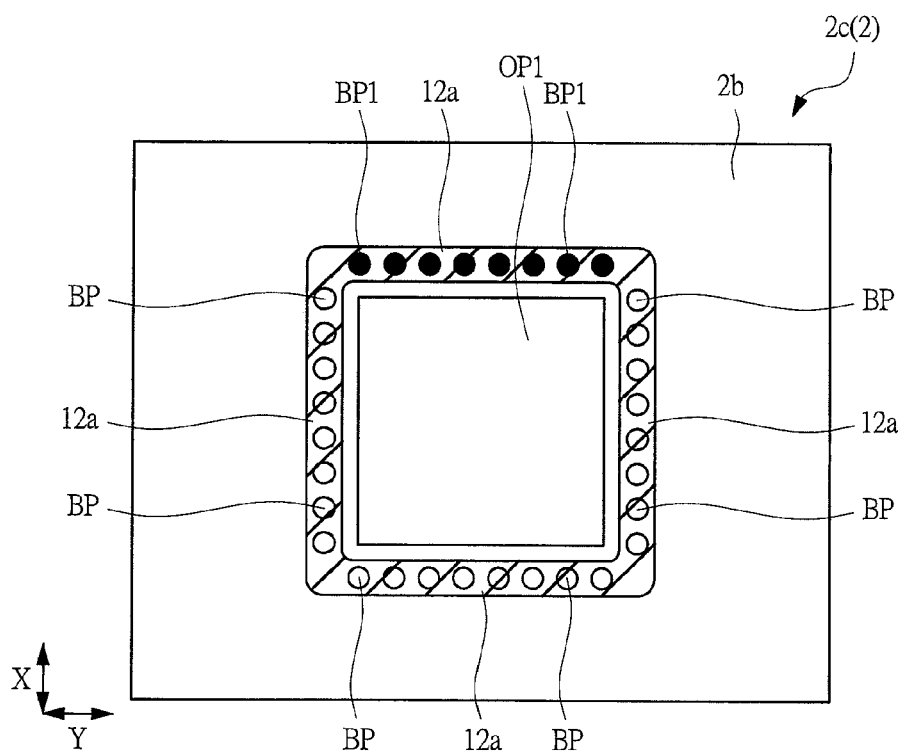
FIG. 60 is an explanatory diagram of a supply region of a sealing material in the wiring substrate in FIG. 59.

FIG. 60 is an explanatory diagram (plan view) of a region for supplying (applying) the sealing material 12a in the process of supplying the sealing material 12a in step S3 in the present embodiment, and a region where the sealing material 12a is supplied (applied) in step S3 in FIG. 59 is hatched.

The process of supplying the sealing material 12a in step S3 in the present embodiment and the process of supplying the sealing material 12a in step S3 in the first embodiment are different in the region of supplying the sealing material 12a (application region, supply position, or application position) on the lower surface 2b of the wiring substrate 2 (2c).

More specifically, in the first embodiment, in the process of supplying the sealing material 12a in step S3 to the planned sensor-chip mounting region on the lower surface 2b of the wiring substrate 2, the sealing material 12a is supplied to a region planarly overlapped with the first region 31 (the region where the bump electrodes BP are arranged) when the sensor chip 3 is mounted in step S4, but the sealing material 12a is not supplied to a region planarly overlapped with the second region 32 (the region where no bump electrode BP is arranged). On the other hand, in the present embodiment, in the process of supplying the sealing material 12a in step S3 to the planned sensor-chip mounting region on the lower surface 2b of the wiring substrate 2c, the sealing material 12a is supplied to a region planarly overlapped with the first region 31 (the region where the bump electrodes BP are arranged) and a region planarly overlapped with the third region 33 (the region where the dummy bump electrodes BP1 are arranged) when the sensor chip 3c is mounted in step S4. In other words, in the present embodiment, in the process of supplying the sealing material 12a in step S3 to the planned chip-mounting region on the lower surface 2b of the wiring substrate 2 (planned region where the sensor chip 3c is to be mounted), the sealing material 12a is supplied to a region planarly overlapped with the outer peripheral region (the region obtained by combining the first region 31 and the third region 33) on the front surface 3a of the sensor chip 3c when the sensor chip 3c is mounted in step S4. Therefore, in the process of supplying the sealing material 12a in step S3 in the present embodiment, as depicted in FIG. 60, the sealing material 12a is supplied (applied or disposed) on the lower surface 2b of the wiring substrate 2c so as to surround the opening OP1. Also, in the present embodiment, when the sensor chip 3c is flip-chip mounted in step S4, the state where the space between the entire outer peripheral region of the front surface 3a of the sensor chip 3c (the region obtained by combining the first region 31 and the third region 33) and the lower surface 2b of the wiring substrate 2c is filled with the cured sealing material 12a is achieved.

Note that, in the first embodiment, on the lower surface 2b of the wiring substrate 2, the terminals 9 to connect the bump electrodes BP are arranged in the region planarly overlapped with the first region 31 (the region where the bump electrodes BP are arranged) when the sensor chip 3 is mounted in step S4, but no terminal 9 is arranged in the region planarly overlapped with the second region 32 (the region where no bump electrode BP is arranged). On the other hand, in the present embodiment, on the lower surface 2b of the wiring substrate 2c, the terminals 9 to connect the bump electrodes BP are arranged in the region planarly overlapped with the first region 31 (the region where the bump electrodes BP are arranged) when the sensor chip 3c is mounted in step S4, and the terminals 9a to connect the dummy bump electrodes BP1 are arranged in the region planarly overlapped with the third region 33 (the region where the dummy bump electrodes BP1 are arranged). Therefore, in the process of supplying the sealing material 12a in step S3 in the present embodiment, as depicted in FIG. 60, on the lower surface 2b of the wiring substrate 2c, the sealing material 12a is supplied to the region where the terminals 9 to be connected to the bump electrodes BP of the sensor chip 3c to be mounted later are arranged or its adjacent region and to the region where the terminals 9a to be connected to the dummy bump electrodes BP1 of the sensor chip 3c to be mounted later are arranged or its adjacent region.

Other than the positions of supplying the sealing material 12a, the process of supplying the sealing material 12a in step S3 in the present embodiment can be performed in approximately the same manner as that of the process of supplying the sealing material 12a in the first embodiment.

After the process of supplying the sealing material 12a in step S3, the process of mounting the sensor chip 3c in step S4 (flip-chip mounting process) is performed also in the present embodiment.

Figure 61:
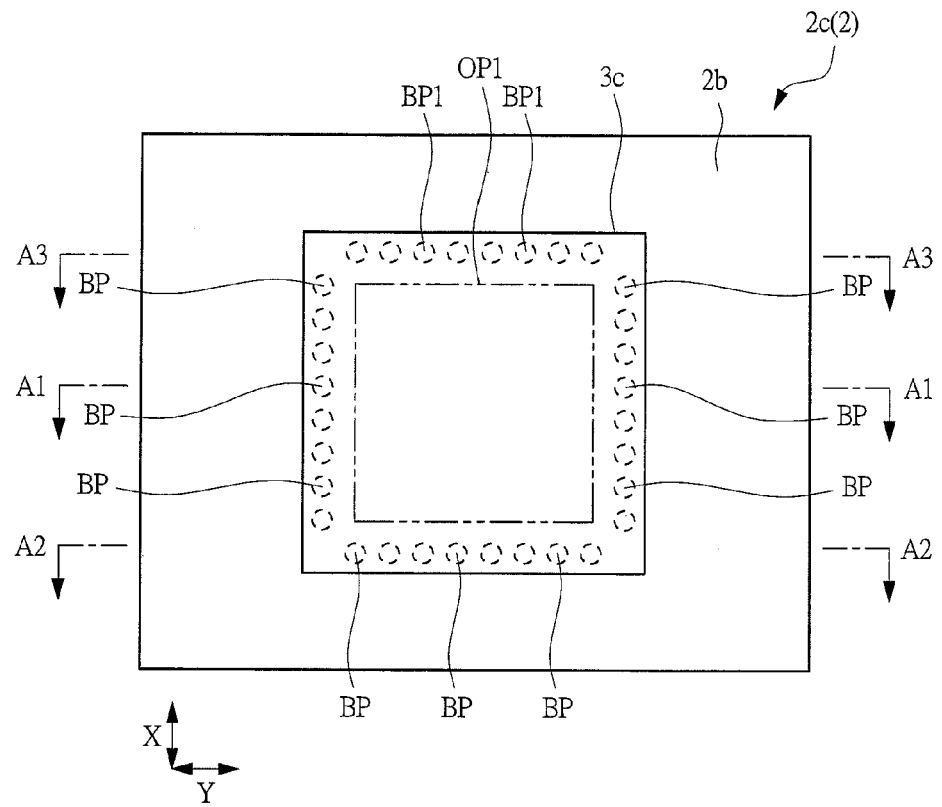
FIG. 61 is a plan view of the principal parts in a state in which the sensor chip in FIG. 58 is flip-chip mounted on the wiring substrate in FIG. 59.
Figure 62:
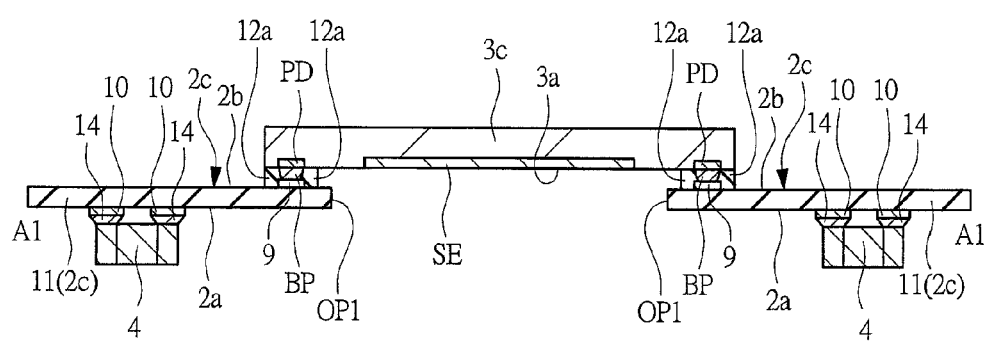
FIG. 62 is a cross-sectional view along a line A1-A1 in FIG. 61.
Figure 63:
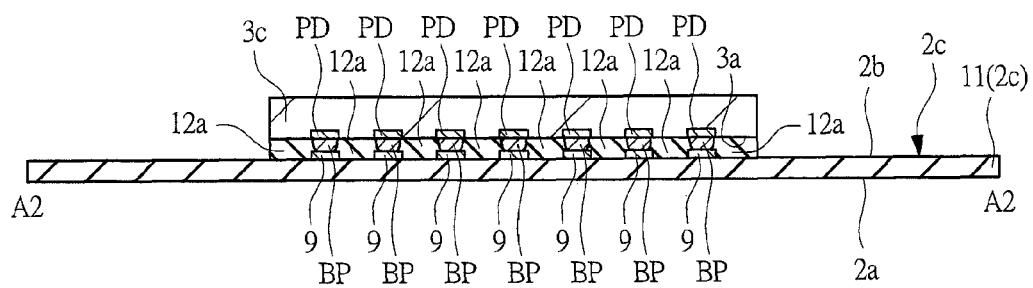
FIG. 63 is a cross-sectional view along a line A2-A2 in FIG. 61.
Figure 64:
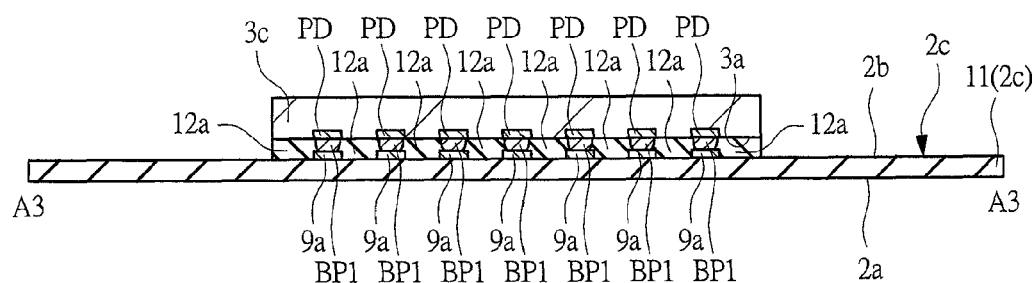
FIG. 64 is a cross-sectional view along a line A3-A3 in FIG. 61.

FIG. 61 is a plan view of principal parts (partially enlarged bottom view) depicting a stage (state) in which the sensor chip 3c is mounted (flip-chip mounted) on the lower surface 2b of the wiring substrate 2c in step S4, and it depicts the lower surface 2b side of the wiring substrate 2c and corresponds to FIG. 29. FIG. 62 (A1-A1 section), FIG. 63 (A2-A2 cross-sectional view), and FIG. 64 (A3-A3 cross-sectional view) are cross-sectional views depicting a stage (state) in which the sensor chip 3c is mounted (flip-chip mounted) on the lower surface 2b of the wiring substrate 2c in step S4, and they correspond to FIG. 26, FIG. 27 and FIG. 28, respectively. Thus, the cross-sectional view along a line A1-A1 of FIG. 61 approximately corresponds to FIG. 62, the cross-sectional view along a line A2-A2 of FIG. 61 approximately corresponds to FIG. 63, and the cross-sectional view along a line A3-A3 of FIG. 61 approximately corresponds to FIG. 64. Also, in FIG. 61, for easy understanding, the position of the opening OP1 of the wiring substrate 2c positioned (hidden) below the sensor chip 3c is represented by a two-dot chain line, and the bump electrodes BP and BP1 positioned (hidden) below the sensor chip 3c are represented by dotted lines.

As is evident from FIGS. 61 to 64, the process of mounting the sensor chip 3c in step S4 in the present embodiment is different from the process of mounting the sensor chip 3 in step S4 in the first embodiment in that each of the bump electrodes BP of the sensor chip 3c is connected (thermocompression-bonded) onto each of the terminals 9 of the wiring substrate 2c and each of the dummy bump electrodes BP1 of the sensor chip 3c is also connected (thermocompression-bonded) onto each of the terminals 9a of the wiring substrate 2c. Other than that, the process of mounting (flip-chip mounting) the sensor chip 3c in step S4 in the present embodiment can be performed in approximately the same manner as the process of mounting the sensor chip 3 in step S4 in the first embodiment.

In the present embodiment, the processes subsequent to the process of mounting the sensor chip 3c in step S4 are the same as those in the first or second embodiment except that the process of supplying the sealing material 12b in step S6 and the process of curing the sealing material 12b in step S7 are not performed. More specifically, in the present embodiment, after the process of mounting the sensor chip 3c in step S4, the process of bonding the resin cover 5 in step S5, the process of bonding the resin cover 7 in step S8, and the process of mounting the lens unit 6 in step S9 are sequentially performed in this order without performing the processes of supplying and curing the sealing material 12b in steps S6 and S7. Alternatively, in the present embodiment, after the process of mounting the sensor chip 3c in step S4, the process of bonding the resin cover 7 in step S8, the process of bonding the resin cover 5 in step S5, and the process of mounting the lens unit 6 in step S9 can be sequentially performed in this order without performing the processes of supplying and curing the sealing material 12b in steps S6 and S7.

In the first and second embodiments, the sensor chip 3 includes both of the first region 31 where the bump electrodes BP are arranged and the second region 32 where no bump electrode BP is arranged in the outer peripheral portion (surrounding portion) of the front surface 3a. Thus, in the region planarly overlapped with the second region 32, the wiring substrate 2 tends to be bent due to the absence of any bump electrode BP. For solving the inconveniences due to the bending of the wiring substrate 2, various ideas as described above have been performed in the first and second embodiments.

Meanwhile, in the present embodiment, the sensor chip 3c includes the first region 31 where the bump electrodes BP are arranged and the third region 33 where the dummy bump electrodes BP1 are arranged in the outer peripheral portion (surrounding portion) of the front surface 3a, and on the front surface 3a of the sensor chip 3c, the bump electrodes BP and BP1 are arranged at equal pitches (equally) along the entire four sides of the outer periphery. More specifically, in the sensor chip 3c for use in the present embodiment, the first region 31 where the bump electrodes BP are arranged and the third region 33 where the dummy bump electrodes BP1 are arranged are provided in the outer peripheral portion (surrounding portion) of the front surface 3a, but the second region 32 where no bump electrode BP or dummy bump electrode BP1 is arranged is not provided.

Thus, in the present embodiment, when the sensor chip 3c is flip-chip mounted on the lower surface 2b of the wiring substrate 2c in step S4, both of the bump electrodes BP and the dummy bump electrodes BP1 act as keeping a constant distance (space) between the sensor chip 3c and the wiring substrate 2c. Therefore, in the wiring substrate 2c, bending of the wiring substrate 2c is prevented (restricted) in the region to which the bump electrodes BP of the sensor chip 3c are connected and its adjacent region and the region to which the dummy bump electrodes BP1 of the sensor chip 3c are connected and its adjacent region. By this means, in the process of mounting the sensor chip 3c in step S4, the bending of the wiring substrate 2c as described with reference to FIGS. 43 and 45 is prevented (restricted) by the bump electrodes BP and the dummy bump electrodes BP1. Therefore, it is possible to prevent the phenomenon in which the sealing material 12a before curing disposed in the space between the wiring substrate 2c and the sensor chip 3c is pushed to flow out due to the bending of the wiring substrate 2c (to be attached onto the sensor surface SE of the sensor chip 3c). Accordingly, it is possible to improve the manufacturing yield of the camera modules (solid-state image pickup devices) and also improve the reliability of the manufactured camera module (solid-state image pickup device).

Fourth Embodiment

Figure 65:
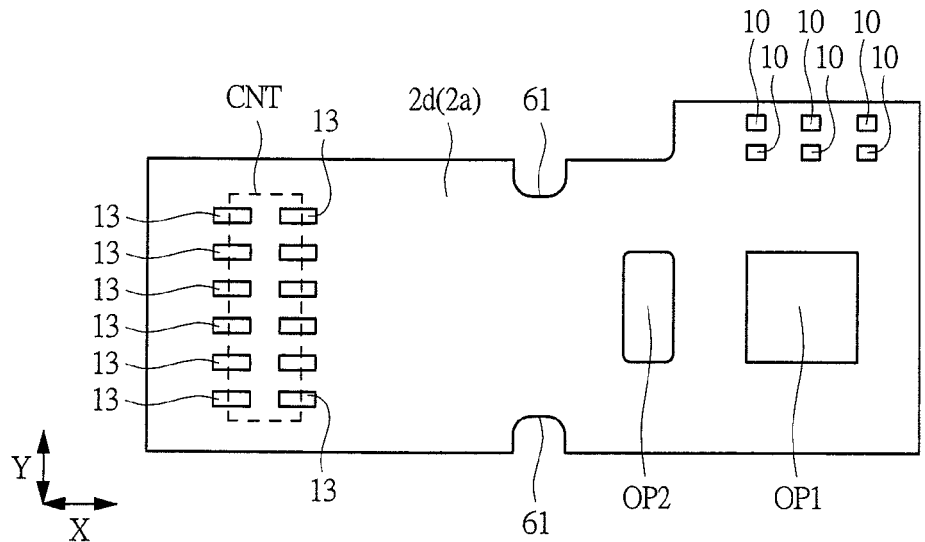
FIG. 65 is a top view of a modification example of the wiring substrate.
Figure 66:
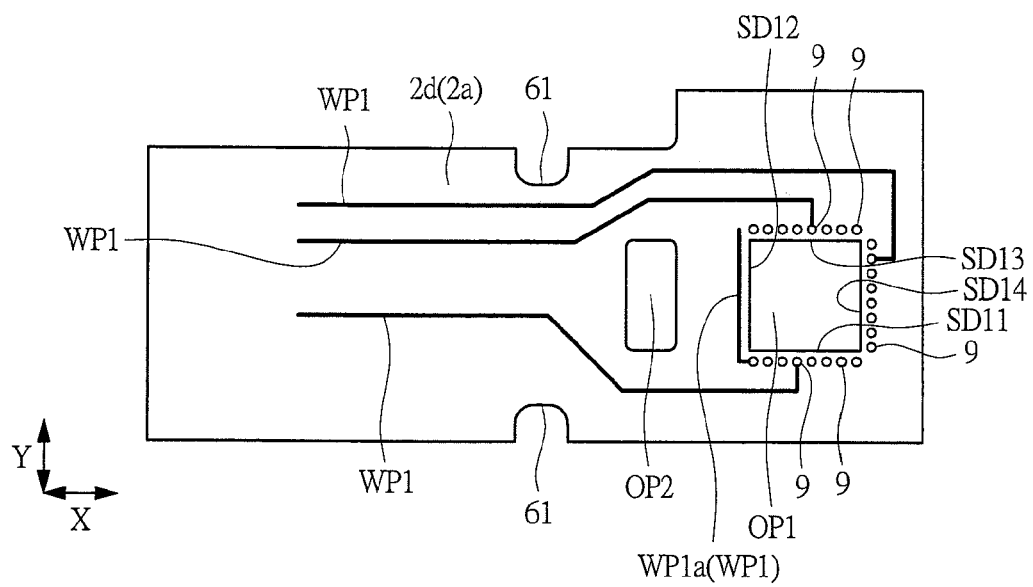
FIG. 66 is a top view of a modification example of the wiring substrate.

In a fourth embodiment, a modification example of the wiring substrate 2 for use in the first to third embodiments will be described. FIG. 65 is a top view of the modification example of the wiring substrate 2 and FIG. 66 is a bottom view thereof, and they correspond to FIG. 10 and FIG. 11 in the first embodiment, respectively. In FIG. 65, a region where the connector CNT is mounted later is represented by a dotted line. Also, on the lower surface 2b of the wiring substrate 2d (2), the wirings WP1 are integrally connected to the terminals 9, but only the wirings WP1 connected to a part of the terminals 9 are depicted for simplification in the bottom view of FIG. 66. Hereinafter, the wiring substrate 2 in the present embodiment depicted in FIGS. 65 and 66 is referred to as a wiring substrate 2d.

The wiring substrate 2 of the modification example depicted in FIGS. 65 and 66 (that is, the wiring substrate 2d) is different from the wiring substrate 2 in the first embodiment depicted in FIGS. 10 and 11 in the following points.

That is, in the wiring substrate 2 for use in the first embodiment, the terminals 9 for connecting the bump electrodes BP of the sensor chip 3 are arranged around the opening OP1 on the lower surface 2b. More specifically, among four sides (that is, sides SD11, SD12, SD13 and SD14) of the opening OP1 with a shape of a rectangle (oblong figure), the terminals 9 are arranged along the sides SD11, SD12 and SD13, but no terminal 9 is arranged along the side SD14. Here, among the four sides (that is, the side SD11, SD12, SD13 and SD14) of the opening OP1, the side SD14 of the opening OP1 where no terminal 9 is arranged is the side positioned farthest from the region where the connector CNT (or the terminal 13 to which the connector CNT is connected) is disposed on the lower surface 2b of the wiring substrate 2.

When the terminals 9 are provided along the side SD14 of the opening OP1 unlike the wiring substrate 2 depicted in FIGS. 10 and 11 and the terminals 9 along the side SD14 of the opening OP1 are electrically connected to the connector CNT (or the terminal 13 to which the connector CNT is connected), long wirings (corresponding to the wirings WP1) for connecting the terminals 9 along the side SD14 of the opening OP1 and the connector CNT (terminal 13) are required. Moreover, a region for leading the wirings has to be ensured, so that the planar dimensions (area) of the wiring substrate are increased.

Meanwhile, when no terminal 9 is arranged along the side SD14 positioned farthest from the connector CNT (terminal 13) among the four sides of the opening OP1 like in the wiring substrate 2 depicted in FIGS. 10 and 11 for use in the first embodiment, the length of the wirings (corresponding to the wirings WP1) for connecting the terminals 9 disposed around the opening OP1 and (the terminals of) the connector CNT can be shortened. Also, since the area for leading these wirings can be reduced, the planar dimensions (area) of the wiring substrate 2 can be reduced.

On the other hand, in the wiring substrate 2d depicted in FIGS. 65 and 66, the terminals 9 for connecting the bump electrodes BP of the sensor chip 3 are arranged around the opening OP1 on the lower surface 2b. More specifically, among the four sides (that is, the sides SD11, SD12, SD13 and SD14) of the opening OP1 with a shape of a rectangle (oblong figure), the terminals 9 are arranged along the sides SD11, SD13 and SD14, but no terminal 9 is arranged along the side SD12. Here, the side SD12 of the opening OP1 where no terminal 9 is arranged is a side positioned closest to a region planarly overlapped with the connector CNT on the lower surface 2b of the wiring substrate 2d among the four sides (that is, the sides SD11, SD12, SD13 and SD14) of the opening OP1.

The wiring substrate 2d depicted in FIGS. 65 and 66 has an opening (through hole or hole) OP2 other than the opening OP1 provided in the chip-mounting region (the region where the sensor chip 3 is mounted). The opening OP2 penetrates from the lower surface 2b to the upper surface 2a of the wiring substrate 2d. This opening OP2 is provided so as to easily fold the wiring substrate 2d, and for example, can be disposed at a planned folding position of the wiring substrate 2 in the camera module MJ1. In the wiring substrate 2d, the opening OP2 is disposed in a space between a region where the opening OP1 for exposing the sensor surface SE of the sensor chip 3 is disposed and a region where the connector CNT is disposed later. Therefore, among the four sides (that is, the sides SD11, SD12, SD13 and SD14) of the opening OP1, the side SD12 is a side facing the opening OP2 on the lower surface 2b of the wiring substrate 2d and positioned closest to the opening OP2.

The wiring substrate 2d depicted in FIGS. 65 and 66 is provided with the opening OP2 in addition to the opening OP1. Therefore, the wirings WP1 for connecting the terminals 9 arranged around the opening OP1 and (the terminals of) the connector CNT are required to be led so as to get around the opening OP2 in the wiring substrate 2d. Thus, when no terminal 9 is arranged along the side SD12 facing the opening OP2 on the lower surface 2b of the wiring substrate 2d and positioned closest to the opening OP2 among the four sides of the opening OP1 like in the wiring substrate 2d depicted in FIGS. 65 and 66, the wirings WP1 for connecting the terminals 9 disposed around the opening OP1 and the connector CNT (the terminals 13 for connecting the connector CNT) can be easily led so as to get around the opening OP2. This facilitates the designing of the wiring patterns in the wiring substrate 2d.

Also, the wiring substrate 2d depicted in FIGS. 65 and 66 is provided with a neck portion 61 formed by locally narrowing the width of the wiring substrate 2d (the dimension in a Y direction, which is a short-side direction of the wiring substrate 2d), and the wiring substrate 2d can be easily folded along the neck portion 61. In the camera module MJ1, the neck portion 61 of the wiring substrate 2d can be provided at a planned folding position of the wiring substrate 2d. By providing the opening OP2 and the neck portion 61 to the wiring substrate 2d, the wiring substrate 2d in the camera module MJ1 can be easily folded at both of the position along the opening OP2 and the position along the neck portion 61.

Furthermore, in the wiring substrate 2d depicted in FIGS. 65 and 66, the region where the electronic components 4 are mounted is made wider in a width direction (the short-side direction of the wiring substrate 2d), and the terminals 10 for mounting the electronic components 4 are densely disposed there, so that the electronic components 4 can be readily mounted later on the wiring substrate 2d.

Still further, in the wiring substrate 2d depicted in FIGS. 65 and 66, since the connector CNT is mounted on the upper surface 2a side of the wiring substrate 2d, the terminals 13 for connecting the connector CNT are formed on the upper surface 2a of the wiring substrate 2d.

Other than those mentioned above, the structure of the wiring substrate 2d is approximately the same as that of the wiring substrate 2 for use in the first embodiment.

The camera module MJ1 can be manufactured by using the wiring substrate 2d depicted in FIGS. 65 and 66. Also in this case, a manufacturing process basically similar to the manufacturing process of the camera module MJ1 described in the first to third embodiments can be performed.

In the following, differences between the case where the camera module MJ1 is manufactured by using the wiring substrate 2d depicted in FIGS. 65 and 66 and the case where the camera module MJ1 is manufactured by using the wiring substrate 2 depicted in FIGS. 10 and 11 for use in the first embodiment will be described.

That is, between the wiring substrate 2 in FIGS. 10 and 11 and the wiring substrate 2d in FIGS. 65 and 66, the terminals 9 are arranged on different sides of the four sides of the opening OP1. Accordingly, the positions where the sealing materials 12a and 12b are supplied in steps S3 and S6 are different.

In the process of supplying the sealing material 12a in step S3, the sealing material 12a is supplied to the region planarly overlapped with the first region 31 (the region where the bump electrodes BP are arranged) when the sensor chip 3 is mounted in step S4, but the sealing material 12a is not supplied to the region planarly overlapped with the second region 32 (the region where no bump electrode BP is arranged). This is common to the first and second embodiments and the present embodiment. When the wiring substrate 2 of FIGS. 10 and 11 in the first embodiment is used, the region planarly overlapped with the first region 31 (the region where the bump electrodes BP are arranged) is a region along the sides SD11, SD12 and SD13 of the opening OP1 on the lower surface 2b of the wiring substrate 2, and the region planarly overlapped with the second region 32 (the region where no bump electrode BP is arranged) is a region along the side SD14 of the opening OP1 on the lower surface 2b of the wiring substrate 2. Therefore, when the wiring substrate 2 of FIGS. 10 and 11 in the first embodiment is used, in the process of supplying the sealing material 12a in step S3, the sealing material 12a is supplied (applied) onto the region along the sides SD11, SD12 and SD13 of the opening OP1 on the lower surface 2b of the wiring substrate 2, and the sealing material 12a is not supplied (applied) onto the region along the side SD14 of the opening OP1. Meanwhile, when the wiring substrate 2d in FIGS. 65 and 66 is used, the region planarly overlapped with the first region 31 (the region where the bump electrodes BP are arranged) is a region along the sides SD11, SD13 and SD14 of the opening OP1 on the lower surface 2b of the wiring substrate 2d, and the region planarly overlapped with the second region 32 (the region where no bump electrode BP is arranged) is a region along the side SD12 of the opening OP1 on the lower surface 2b of the wiring substrate 2d. Therefore, when the wiring substrate 2d in FIGS. 65 and 66 is used, in the process of supplying the sealing material 12a in step S3, the sealing material 12a is supplied (applied) onto the region along the sides SD11, SD13 and SD14 of the opening OP1 on the lower surface 2b of the wiring substrate 2d, and the sealing material 12a is not supplied (applied) onto the region along the side SD12 of the opening OP1.

Also, in the process of supplying the sealing material 12b in step S6, the sealing material 12b is supplied (injected) in the region planarly overlapped with the second region 32 (the region where no bump electrode BP is arranged) in the space between the front surface 3a of the sensor chip 3 and the lower surface 2b of the wiring substrates 2 and 2d. This is common to the first and second embodiments and the present embodiment. Therefore, when the wiring substrate 2 of FIGS. 10 and 11 in the first embodiment is used, in the process of supplying the sealing material 12b in step S6, the sealing material 12b is supplied (injected) in the region along the side SD14 of the opening OP1 in the space between the front surface 3a of the sensor chip 3 and the lower surface 2b of the wiring substrate 2. Meanwhile, when the wiring substrate 2d in FIGS. 65 and 66 is used, in the process of supplying the sealing material 12b in step S6, the sealing material 12b is supplied (injected) in the region along the side SD12 of the opening OP1 in the space between the front surface 3a of the sensor chip 3 and the lower surface 2b of the wiring substrate 2d.

Also when the camera module MJ1 is manufactured by using the wiring substrate 2d depicted in FIGS. 65 and 66, approximately the same effects can be achieved by performing the manufacturing process basically similar to those of the first to third embodiments.

Furthermore, in the present embodiment, the following effect can be achieved.

That is, in the wiring substrate 2d for use in the present embodiment, as depicted in FIG. 66, a wiring WP1a, which is a part of the wirings WP1, is disposed (extended) near the side SD12 of the opening OP1. In this case, when the sensor chip 3 is flip-chip mounted in step S4, the wiring substrate 2d tends to be bent in the region along the side SD12 of the opening OP1 due to the absence of the bump electrodes BP. When the wiring substrate 2d is bent, the sensor chip 3 may possibly make contact with the wiring WP1a of the wiring substrate 2d. If the sealing material 12a is present in a bent portion of the wiring substrate 2d (here, in the region along the side SD12) as depicted in FIG. 45, the sealing material 12a is cured in the state where the wiring substrate 2d remains bent, and the state where the sensor chip 3 and the wiring WP1a of the wiring substrate 2d are in contact with each other to cause a short-circuit is fixed, resulting in an electrical failure and decrease in the manufacturing yield of camera modules.

Meanwhile, in the present embodiment, the sealing material 12a is not supplied in step S3 to a region where the wiring substrate 2d tends to be bent in step S4 (the region planarly overlapped with the second region 32, that is, the region along the side SD12 here) on the lower surface 2b of the wiring substrate 2d like in the first and second embodiments. Therefore, even if the wiring substrate 2d is bent in the region along the side SD12 of the opening OP1 due to the absence of the bump electrodes BP when the sensor chip 3 is flip-chip mounted in step S4, since the sealing material 12a is not present in the bent portion of the wiring substrate 2d (here, in the region along the side SD12), the bent wiring substrate 2d can return to its original state after the process of flip-chip mounting in step S4. Also in the present embodiment, the bending of the wiring substrate 2d when the sealing material 12b is cured can be suppressed or prevented because of the same reason as that in the first and second embodiments. Thus, in the present embodiment, an effect of preventing the sensor chip 3 and the wiring WP1a of the wiring substrate 2d from making contact with each other to cause a fixed short-circuit state and an electrical failure can be achieved, so that the manufacturing yield of camera modules can be improved.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be effectively applied to a solid-state image pickup device and its manufacturing technique.

What is claimed is:

1. A manufacturing method of a solid-state image pickup device comprising the steps of:
(a) providing a wiring substrate having an upper surface, a lower surface opposite to the upper surface, an opening formed in a planned chip-mounting region on the lower surface, and a plurality of bonding leads formed around the opening on the lower surface;
(b) providing a sensor chip having a main surface, a sensor surface formed on the main surface, a plurality of bump electrodes formed in an outer peripheral portion located around the sensor surface on the main surface, and a back surface opposite to the main surface, the outer peripheral portion having a first region and a second region;
(c) supplying a first sealing material made of a thermosetting resin to a first part of the planned chip-mounting region on the lower surface of the wiring substrate;
(d) after the step (c), mounting the sensor chip on the planned chip-mounting region of the wiring substrate such that the main surface of the sensor chip faces the lower surface of the wiring substrate, the bump electrodes of the sensor chip face the bonding leads of the wiring substrate, respectively, and the sensor surface of the sensor chip is exposed from the opening, and curing the first sealing material;
(e) after the step (d), supplying a second sealing material to a second part of the planned chip-mounting region on the lower surface of the wiring substrate; and
(f) after the step (e), curing the second sealing material,
wherein bump electrodes are arranged in the first region and no bump electrode is arranged in the second region, and
wherein in the step (c), the first sealing material is supplied to a region planarly overlapped with the first region when the sensor chip is mounted in the step (d), and the first sealing material is not supplied to a region planarly overlapped with the second region when the sensor chip is mounted in the step (d),
wherein in the step (e), the second sealing material is supplied to a region planarly overlapped with the second region,
wherein the wiring substrate is a flexible wiring substrate,
wherein, in the step (d), the bump electrodes of the sensor chip are connected to respective bonding leads of the wiring substrate, while heating the sensor chip,
wherein, in the step (d), the bump electrodes of the sensor chip are thermocompression-bonded onto respective bonding leads of the wiring substrate, and
wherein each of the bump electrodes thermocompression-bonded onto the bonding leads in step (d) is surrounded by the first sealing material cured by the heating.

2. The manufacturing method of the solid-state image pickup device according to claim 1,
wherein the second sealing material is made of thermosetting resin, and
wherein the second sealing material is heated and cured in the step (f).

3. The manufacturing method of the solid-state image pickup device according to claim 2,
wherein a heating temperature of the second sealing material in the step (f) is lower than a temperature at which the sensor chip is heated in the step (d).

4. The manufacturing method of the solid-state image pickup device according to claim 3,
wherein a curing temperature of the second sealing material supplied in the step (e) is lower than a curing temperature of the first sealing material supplied in the step (c).

5. The manufacturing method of the solid-state image pickup device according to claim 4 further comprising, after the step (d) and before the step (e), the step of: (d1) fixing a first cover member onto the upper surface of the wiring substrate so as to cover the sensor surface of the sensor chip exposed from the opening of the wiring substrate.

6. The manufacturing method of the solid-state image pickup device according to claim 5,
wherein the sensor surface of the sensor chip is separated from an inner wall of the first cover member fixed onto the upper surface of the wiring substrate in the step (d1).

7. The manufacturing method of the solid-state image pickup device according to claim 6,
wherein an IR filter is mounted on an upper portion of the first cover member.

8. The manufacturing method of the solid-state image pickup device according to claim 7,
wherein each of the plurality of bump electrodes of the sensor chip is a gold stud bump.

9. The manufacturing method of the solid-state image pickup device according to claim 8,
wherein the wiring substrate provided in the step (a) has a plurality of external terminals respectively electrically connected to the plurality of bonding leads via a plurality of wirings.

10. The manufacturing method of the solid-state image pickup device according to claim 2 further comprising, after the step (d) and before the step (e), the step of:
(d1) fixing a first cover member onto the upper surface of the wiring substrate so as to cover the sensor surface of the sensor chip exposed from the opening of the wiring substrate.

11. The manufacturing method of the solid-state image pickup device according to claim 10,
wherein an IR filter is mounted on an upper portion of the first cover member.

12. The manufacturing method of the solid-state image pickup device according to claim 1,
wherein the main surface of the sensor chip provided in the step (b) is a quadrangle having four sides,
wherein, on the main surface of the sensor chip, no bump electrode is formed along at least one of the four sides, and the plurality of bump electrodes are formed along other remaining sides, and
wherein the second region corresponds to a region along the at least one side, and the first region corresponds to a region along other remaining sides.

13. The manufacturing method of the solid-state image pickup device according to claim 1,
wherein the main surface of the sensor chip provided in the step (b) is a quadrangle having four sides, and
wherein, on the main surface of the sensor chip, the first region where the bump electrodes are arranged and the second region where no bump electrode is arranged are present along at least one of the four sides.

* * * * *